US012660344B2

(12) United States Patent
Nakagawa

(10) Patent No.: US 12,660,344 B2
(45) Date of Patent: Jun. 16, 2026

(54) SOLID-STATE IMAGING DEVICE AND RECOGNITION SYSTEM HAVING MULTIPLE PIXELS STACKED IN THE VERTICAL DIRECTION

(71) Applicant: SONY GROUP CORPORATION, Tokyo (JP)

(72) Inventor: Kei Nakagawa, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 423 days.

(21) Appl. No.: 18/043,676

(22) PCT Filed: Sep. 3, 2021

(86) PCT No.: PCT/JP2021/032464
§ 371 (c)(1),
(2) Date: Mar. 1, 2023

(87) PCT Pub. No.: WO2022/059525
PCT Pub. Date: Mar. 24, 2022

(65) Prior Publication Data
US 2023/0326938 A1     Oct. 12, 2023

(30) Foreign Application Priority Data
Sep. 16, 2020    (JP) ................................. 2020-155657

(51) Int. Cl.
*H10F 39/00*         (2025.01)
*H04N 5/33*          (2023.01)
          (Continued)

(52) U.S. Cl.
CPC ............. *H10F 39/802* (2025.01); *H04N 5/33* (2013.01); *H04N 25/134* (2023.01);
          (Continued)

(58) Field of Classification Search
CPC .. H10F 39/802; H10F 39/8053; H10F 39/192; H10F 39/184; H10F 39/199;
          (Continued)

(56) References Cited

U.S. PATENT DOCUMENTS

| | | | |
|---|---|---|---|
| 6,606,120 B1 | 8/2003 | Merrill |
| 2007/0170359 A1 | 7/2007 | Syllaios |

(Continued)

FOREIGN PATENT DOCUMENTS

| | | |
|---|---|---|
| CN | 101064787 A | 10/2007 |
| CN | 105518862 A | 4/2016 |

(Continued)

OTHER PUBLICATIONS

International Search Report and Written Opinion prepared by the Japan Patent Office on Oct. 12, 2021, for International Application No. PCT/JP2021/032464, 2 pgs.

(Continued)

*Primary Examiner* — Georgia Y Epps
*Assistant Examiner* — Erin R Garber
(74) *Attorney, Agent, or Firm* — SHERIDAN ROSS P.C.

(57) ABSTRACT

To achieve more secure authentication. A solid-state imaging device according to an embodiment includes: a plurality of unit pixels arranged in a matrix; and signal processing circuits each of which reads out a signal from each of the unit pixels. Each of the unit pixels includes: a first pixel that is disposed on a first surface and that detects light of a first wavelength band; and a second pixel that is disposed on a second surface parallel to the first surface and that detects light of a second wavelength band different from the first wavelength band. The signal processing circuit includes a first conversion circuit that is connected to the first pixel and the second pixel in each of the unit pixels and that converts (Continued)

an analog signal output from each of the first pixel and the second pixel into a digital signal.

20 Claims, 33 Drawing Sheets

(51) Int. Cl.

| | | |
|---|---|---|
| *H04N 25/13* | (2023.01) | |
| *H04N 25/17* | (2023.01) | |
| *H04N 25/705* | (2023.01) | |
| *H04N 25/78* | (2023.01) | |
| *H10F 39/12* | (2025.01) | |
| *H10F 39/18* | (2025.01) | |
| *H04N 23/12* | (2023.01) | |

(52) U.S. Cl.
CPC ........... *H04N 25/17* (2023.01); *H04N 25/705* (2023.01); *H04N 25/78* (2023.01); *H10F 39/184* (2025.01); *H10F 39/192* (2025.01); *H04N 23/12* (2023.01); *H10F 39/8037* (2025.01); *H10F 39/8053* (2025.01)

(58) Field of Classification Search
CPC ............... H10F 39/8067; H10F 39/807; H10F 39/8037; H04N 25/78; H04N 23/12; H04N 5/33; H04N 25/134; H04N 25/17; H04N 25/705; H04N 25/77
See application file for complete search history.

(56) References Cited

U.S. PATENT DOCUMENTS

| | | | |
|---|---|---|---|
| 2015/0288903 A1 | 10/2015 | Oshima | |
| 2015/0296162 A1* | 10/2015 | Kurokawa | H10D 86/60 |
| | | | 257/43 |
| 2016/0037088 A1* | 2/2016 | Kakino | G06F 18/256 |
| | | | 348/164 |
| 2019/0189696 A1* | 6/2019 | Yamaguchi | H10F 39/199 |
| 2020/0228743 A1* | 7/2020 | Uchida | H04N 25/79 |
| 2020/0244911 A1* | 7/2020 | Sato | H04N 23/11 |

FOREIGN PATENT DOCUMENTS

| | | | |
|---|---|---|---|
| CN | 110493536 A | | 11/2019 |
| JP | 2011015223 A | | 1/2011 |
| JP | 2011024362 A | | 2/2011 |
| JP | 2011142556 A | * | 7/2011 |
| JP | 2011-243862 | | 12/2011 |
| JP | 2017-208496 | | 11/2017 |
| JP | 2018-125848 | | 8/2018 |
| JP | 2020-021855 | | 2/2020 |
| JP | 2020-068483 | | 4/2020 |
| JP | 2020-088676 | | 6/2020 |
| TW | 202008571 A | | 2/2020 |
| WO | WO-2013084808 A1 | | 6/2013 |
| WO | WO-2018012068 A1 | | 1/2018 |
| WO | WO 2020/031655 | | 2/2020 |
| WO | WO-2020026720 A1 | | 2/2020 |

OTHER PUBLICATIONS

Junichi Nakamura, "Image Sensors and Signal Processing for Digital Still Cameras", Taylor & Francis Group, LLC, Dec. 31, 2006.

Albert J.P. Theuwissen, CMOS image sensors: State-of-the-art:, Solid-State Electronics, May 21, 2008.

* cited by examiner

INCIDENT DIRECTION OF LIGHT

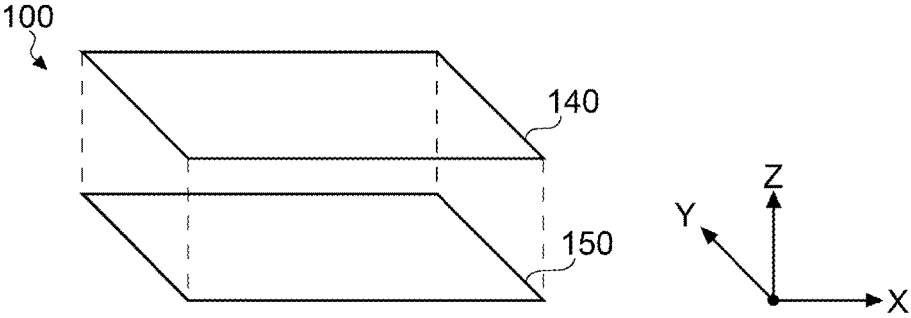

FIG.15

```
              ( START )
                  │
    ┌─────────────┼──────────────────────────┐
    │             ▼                           │
    │  ┌─────────────────────────────────┐    │
    │  │   ACQUIRE RGB IMAGE DATA         │────┼ S101
    │  └─────────────────────────────────┘    │
    │             ▼                           │
    │  ┌─────────────────────────────────┐    │
    │  │   ACQUIRE IR IMAGE DATA          │────┼ S102
    │  └─────────────────────────────────┘    │
    │             ▼                           │
    │  ┌─────────────────────────────────┐    │
    │  │ EXECUTE FIRST RECOGNITION        │    │
    │  │ PROCESSING USING RGB IMAGE DATA  │────┼ S103
    │  └─────────────────────────────────┘    │
    │             ▼                           │
    │  ┌─────────────────────────────────┐    │
    │  │   EXECUTE SECOND RECOGNITION     │    │
    │  │ PROCESSING USING FIRST           │────┼ S104
    │  │ RECOGNITION PROCESSING RESULT    │    │
    │  │ AND IR IMAGE DATA                │    │
    │  └─────────────────────────────────┘    │
    │             ▼                           │
    │  ┌─────────────────────────────────┐    │
    │  │ OUTPUT SECOND RECOGNITION        │────┼ S105
    │  │ PROCESSING RESULT                │    │
    │  └─────────────────────────────────┘    │
    │             ▼                           │
    │  NO       ╱─────────╲                   │
    └──────────<  FINISH?   >──────── S106
               ╲─────────╱
                  │ YES
                  ▼
              (  END  )
```

SOLID-STATE IMAGING DEVICE AND RECOGNITION SYSTEM HAVING MULTIPLE PIXELS STACKED IN THE VERTICAL DIRECTION

CROSS REFERENCE TO RELATED APPLICATIONS

This application is a national stage application under 35 U.S.C. 371 and claims the benefit of PCT Application No. PCT/JP2021/032464 having an international filing date of 3 Sep. 2021, which designated the United States, which PCT application claimed the benefit of Japanese Patent Application No. 2020-155657, filed 16 Sep. 2020, the entire disclosures of each of which are incorporated herein by reference.

FIELD

The present disclosure relates to a solid-state imaging device and a recognition system.

BACKGROUND

In recent years, with the spread of portable devices such as smartphones and tablet terminals, secure authentication systems have been required.

CITATION LIST

Patent Literature

Patent Literature 1: JP 2020-21855 A
Patent Literature 2: JP 2018-125848 A

SUMMARY

Technical Problem

However, since an authentication system based on information acquired by one sensor has been common in known cases, there is room for improvement in security against unauthorized access such as identity theft.

In view of this, the present disclosure proposes a solid-state imaging device and a recognition system capable of achieving more secure authentication.

Solution to Problem

To solve the problems described above, a solid-state imaging device according to an embodiment of the present disclosure includes: a plurality of unit pixels arranged in a matrix; and a signal processing circuit that reads out a signal from each of the unit pixels, wherein each of the unit pixels includes: a first pixel that is disposed on a first surface and that detects light of a first wavelength band; and a second pixel that is disposed on a second surface parallel to the first surface and that detects light of a second wavelength band different from the first wavelength band, and the signal processing circuit includes a first conversion circuit that is connected to the first pixel and the second pixel in each of the unit pixels and that converts an analog signal output from each of the first pixel and the second pixel into a digital signal.

BRIEF DESCRIPTION OF DRAWINGS

FIG. 11 is a diagram depicting a planar layout example of each layer of the pixel array section according to the first embodiment.

FIG. 14 is a diagram depicting a stacked structure example of the image sensor according to the first embodiment.

FIG. 15 is a flowchart depicting an example of a recognition operation according to the first embodiment.

FIG. 19 is a diagram depicting a planar layout example of each layer of a pixel array section according to the second embodiment.

FIG. 20 is a diagram depicting a planar layout example of each layer of a pixel array section according to a modification of an on-chip lens of the second embodiment.

FIG. 21 is a diagram depicting a planar layout example of each layer of a pixel array section according to a modification of a color filter array of the second embodiment.

FIG. 29 is a circuit diagram depicting a schematic configuration example of a unit pixel according to a first modification of the third embodiment.

DESCRIPTION OF EMBODIMENTS

Figure 1:
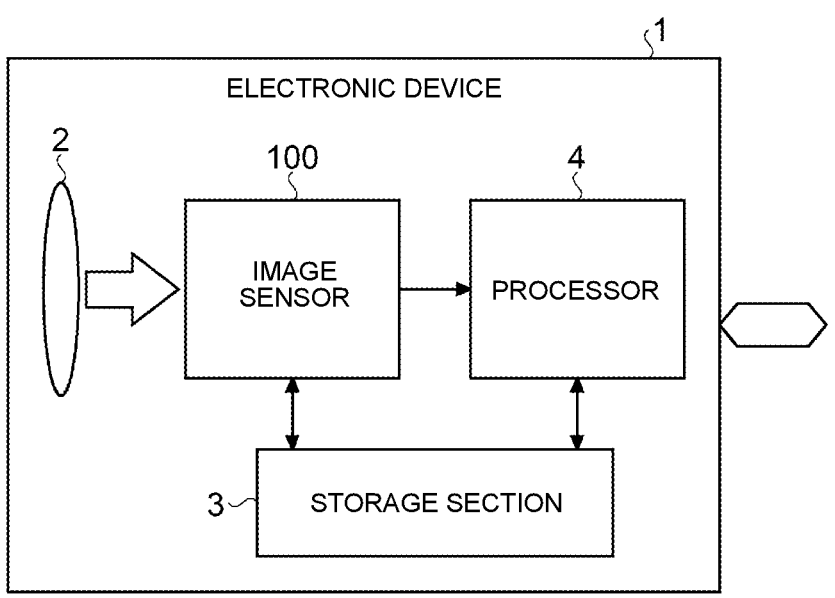
FIG. 1 is a block diagram depicting a schematic configuration example of an electronic device equipped with an image sensor according to a first embodiment.

Embodiments of the present disclosure will be described below in detail with reference to the drawings. In each of the following embodiments, the same parts are denoted by the same reference symbols, and a repetitive description thereof will be omitted.

The present disclosure will be described in the following order.

1. First embodiment
1.1 Configuration example of electronic device
1.2 Functional configuration example of recognition system
1.3 Configuration example of image sensor
1.3.1 Modification of image sensor
1.4 Configuration example of unit pixel
1.5 Circuit configuration example of unit pixel
1.6 Modification of circuit configuration
1.6.1 First modification
1.6.2 Second modification
1.6.3 Third modification
1.7 Cross-sectional structure example of unit pixel
1.8 Organic material
1.9 Planar structure example
1.10 Wiring example of pixel drive line
1.11 Stacked structure example of image sensor
1.12 Recognition operation example
1.13 Action and effects
2. Second embodiment
2.1 Configuration example of unit pixel
2.2 Circuit configuration example of unit pixel
2.3 Cross-sectional structure example of unit pixel
2.4 Planar structure example
2.5 Modification of on-chip lens
2.6 Modification of color filter array
2.7 Action and effects
3. Third embodiment
3.1 Functional configuration example of recognition system
3.2 System configuration example
3.3 Configuration example of image sensor
3.3.1 Modification of image sensor
3.4 Configuration example of unit pixel
3.5 Circuit configuration example of unit pixel
3.6 Modification of circuit configuration
3.6.1 First modification
3.6.2 Second modification
3.6.3 Third modification
3.6.4 Fourth modification
3.7 Cross-sectional structure example of unit pixel
3.8 Planar structure example
3.9 Recognition operation example
3.10 Action and effect
4. Example of application to mobile body

1. First Embodiment

First, a solid-state imaging device (hereinafter, referred to as an image sensor), an electronic device, and a recognition system according to a first embodiment will be described in detail with reference to the drawings. The present embodiment will describe a case where the technology according to the present embodiment is applied to a complementary metal-oxide semiconductor (CMOS) image sensor. However, the type of image sensor is not limited thereto. For example, the technology according to the present embodiment is applicable to various sensors including a photoelectric conversion section, such as a charge-coupled device (CCD) image sensor, a time-of-flight (ToF) sensor, and an event vision sensor (EVS).

1.1 Configuration Example of Electronic Device

FIG. 1 is a block diagram depicting a schematic configuration example of an electronic device equipped with an image sensor according to the first embodiment. As depicted in FIG. 1, an electronic device 1 includes an imaging lens 2, an image sensor 100, a storage section 3, and a processor 4, for example.

The imaging lens 2 is an example of an optical system that condenses incident light and forms an image of the condensed light on a light receiving surface of the image sensor 100. The light receiving surface may be a surface on which the photoelectric conversion sections in the image sensor 100 are arranged. The image sensor 100 performs photoelectric conversion of incident light to generate image data. Further, the image sensor 100 executes predetermined signal processing such as noise removal and white balance adjustment on the generated image data.

The storage section 3 includes, for example, a flash drive, dynamic random access memory (DRAM), static random access memory (SRAM), or the like, and records image data or the like input from the image sensor 100.

The processor 4 is constituted by using, for example, a central processing unit (CPU) or the like, and may include an application processor that executes an operating system, various types of application software, or the like, a graphics processing unit (GPU), a baseband processor, and the like. The processor 4 executes various processes as necessary on the image data input from the image sensor 100, the image data read out from the storage section 3, and the like, executes display to the user, and transmits the image data to the outside via a predetermined network.

In addition, the processor 4 integrally processes a color image read out from a RGB pixel 10 and a monochrome image (IR image) read out from an IR pixel 20 to be described below, thereby executing various types of processing such as distance measuring processing and recognition processing.

1.2 Functional Configuration Example of Recognition System

Figure 2:
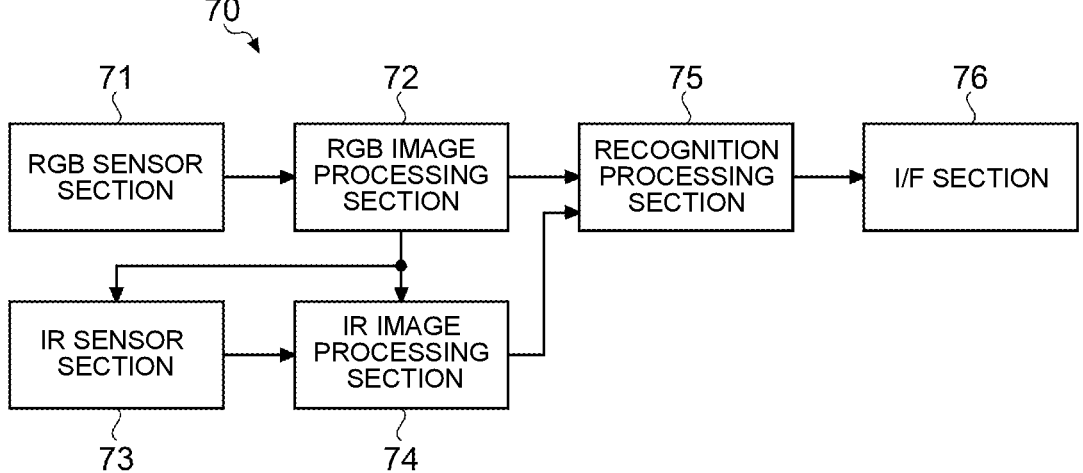
FIG. 2 is a block diagram depicting a functional configuration example of a recognition system according to the first embodiment.

Next, a functional configuration example of a recognition system configured using the electronic device 1 will be described. FIG. 2 is a block diagram depicting a functional configuration example of a recognition system according to the first embodiment. As depicted in FIG. 2, a recognition system 70 includes two types of sensor sections, namely, an RGB sensor section 71 and an IR sensor section 73. Further, the recognition system 70 includes an RGB image processing section 72, an IR image processing section 74, a recognition processing section 75, and an interface (I/F) section 76.

The RGB sensor section 71 includes, for example, a plurality of pixels including a color filter that transmits wavelength components of each of three primary colors of RGB (hereinafter, the pixels are referred to as RGB pixels), and generates a color image including color components of the three primary colors of RGB (hereinafter, the image is referred to as an RGB image). Instead of the RGB sensor section 71, it is also allowable to use a sensor section or the like including a plurality of pixels including a color filter that transmits wavelength components of each of the three primary colors of CMY.

The IR sensor section 73 includes, for example, a plurality of pixels including an IR filter that transmits infrared (IR) light (hereinafter, the pixel is referred to as IR pixel), and generates a monochrome image (hereinafter, referred to as an IR image) including a color component of the IR light. Instead of the IR sensor section 73, it is also allowable to use a sensor section or the like including a plurality of pixels each including a color filter that transmits light of one or more other wavelength bands.

The RGB image processing section 72 executes predetermined signal processing such as noise removal, white balance adjustment, and pixel interpolation on RGB image data input from the RGB sensor section 71.

The IR image processing section 74 executes predetermined signal processing such as noise removal and white balance adjustment on IR image data input from the IR sensor section 73.

Using the RGB image data input from the RGB image processing section 72 and/or the IR image data input from the IR image processing section 74, the recognition processing section 75 executes recognition processing of an object or the like present within an angle of view of the RGB sensor section 71 and/or the IR sensor section 73. The recognition processing by the recognition processing section 75 may use recognition processing such as pattern recognition, recognition processing by artificial intelligence (AI), or the like. For example, deep learning using a neural network such as a convolution neural network (CNN) or a recurrent neural network (RNN) may be applied to the recognition processing by AI. Further, the recognition processing section 75 may execute part of the recognition processing and output the result (intermediate data or the like).

The interface section 76 outputs a recognition result (including intermediate data and the like) obtained by the recognition processing section 75 and image data acquired by the RGB sensor section 71 and/or the IR sensor section 73 to the processor 4 and/or the storage section 3, which are external devices, for example.

Note that the RGB image processing section 72 may execute region determination of an object on the RGB image data, and input information such as an address specifying a region of interest (ROI) (hereinafter, simply referred to as ROI information) obtained as a result of the determination to the IR sensor section 73 and/or the IR image processing section 74. In response to this, the IR sensor section 73 may operate to acquire IR image data of a region corresponding to the ROI information input from the RGB image processing section 72. Alternatively, the IR image processing section 74 may perform processing such as trimming of a region corresponding to the ROI information input from the RGB image processing section 72 on the IR image data input from the IR sensor section 73.

1.3 Configuration Example of Image Sensor

Figure 3:
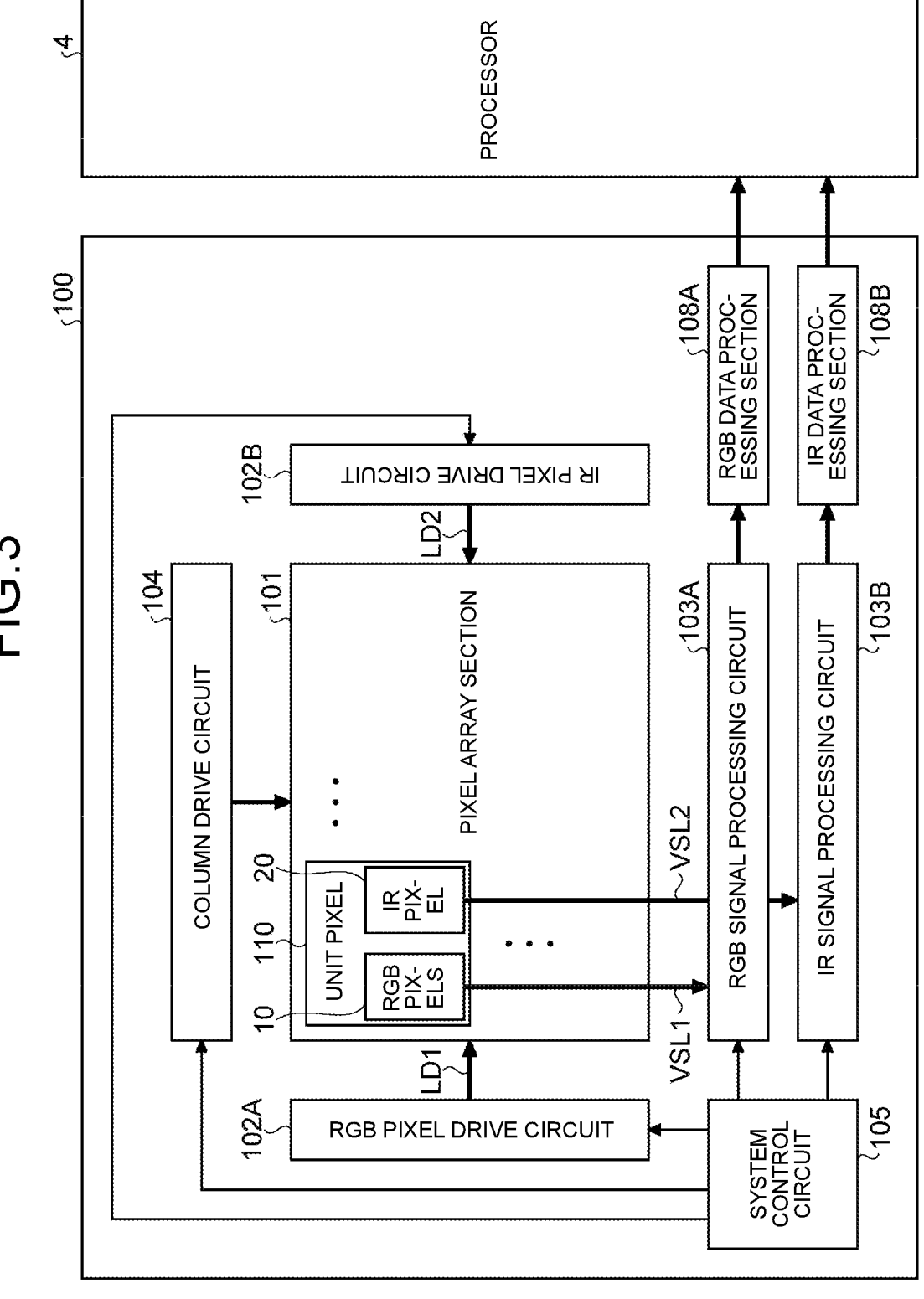
FIG. 3 is a block diagram depicting a schematic configuration example of the image sensor according to the first embodiment.

FIG. 3 is a block diagram depicting a schematic configuration example of the image sensor according to the first embodiment. As depicted in FIG. 3, the image sensor 100 according to the present embodiment includes, for example, a pixel array section 101, an RGB pixel drive circuit 102A, an IR pixel drive circuit 102B, an RGB signal processing circuit 103A, an IR signal processing circuit 103B, a column drive circuit 104, a system control circuit 105, an RGB data processing section 108A, and an IR data processing section 108B.

The pixel array section 101, the RGB pixel drive circuit 102A, the RGB signal processing circuit 103A, the column drive circuit 104, and the system control circuit 105 constitute the RGB sensor section 71 in FIG. 2, for example, while the pixel array section 101, the IR pixel drive circuit 102B, the IR signal processing circuit 103B, the column drive circuit 104, and the system control circuit 105 constitute the IR sensor section 73 in FIG. 2, for example. Further, the RGB signal processing circuit 103A and the RGB data processing section 108A constitute the RGB image processing section 72 in FIG. 2, for example, while the IR signal processing circuit 103B and the IR data processing section 108B constitute the IR image processing section 74 in FIG. 2, for example. The recognition processing section 75 in FIG. 2 may be implemented by the form such as: using the processor 4 alone; using the RGB data processing section 108A and the IR data processing section 108B in cooperation with the processor 4; or using the RGB data processing section 108A and the IR data processing section 108B in cooperation with each other.

The pixel array section 101 has a configuration in which an unit pixels 110 are arranged in the row direction and the column direction, that is, in a two-dimensional lattice pattern (also referred to as a matrix pattern). Here, the row direction refers to a pixel arrangement direction in a pixel row (lateral direction in drawings), and the column direction refers to a pixel arrangement direction in a pixel column (vertical direction in drawings).

Each unit pixel 110 includes an RGB pixel 10 and an IR pixel 20. In the following description, when the RGB pixel 10 and the IR pixel 20 are not distinguished from each other, these pixels may be simply referred to as pixels. Each of the RGB pixel 10 and the IR pixel 20 includes a photoelectric conversion section that generates and accumulates charges according to the amount of received light, and generates a pixel signal of a voltage according to the amount of incident light. Details of a specific circuit configuration and pixel structure of the unit pixel 110 will be described below.

The pixel array section 101 has pixel drive lines LD1 and LD2 wired in the row direction for individual pixel rows while having vertical signal lines VSL1 and VSL2 wired in the column direction for individual pixel columns with regard to the pixel array in a matrix. For example, the pixel drive line LD1 is connected to the RGB pixels 10 in each row, while the pixel drive line LD2 is connected to the IR pixels 20 in each row. On the other hand, for example, the vertical signal line VSL1 is connected to the RGB pixels 10 of each column, while the vertical signal line VSL2 is connected to the IR pixels 20 of each column. However, the arrangement is not limited thereto, and the pixel drive lines LD1 and LD2 may be wired so as to be orthogonal to each other. Similarly, the vertical signal lines VSL1 and VSL2 may be wired so as to be orthogonal to each other. For example, the pixel drive line LD1 may be wired in the row direction, the pixel drive line LD2 may be wired in the column direction, the vertical signal line VSL1 may be wired in the column direction, and the vertical signal line VSL2 may be wired in the row direction.

The pixel drive line LD1 transmits a control signal for conducting drive when a pixel signal is read out from the RGB pixel 10. The pixel drive line LD2 transmits a control signal for conducting drive when a pixel signal is read out from the IR pixel 20. Although FIG. 3 is a case where each of the pixel drive lines LD1 and LD2 is depicted as wiring patterns using a single line, wiring patterns are not limited to the use as a single line. One end of the pixel drive line LD1 is connected to an output end corresponding to each row of the RGB pixel drive circuit 102A, while one end of the pixel drive line LD2 is connected to an output end corresponding to each row of the IR pixel drive circuit 102B.

Each of the RGB pixel drive circuit 102A and the IR pixel drive circuit 102B includes a shift register, an address decoder, and the like, and drives each pixel of the pixel array section 101 simultaneously for all pixels or row by row. That is, the RGB pixel drive circuit 102A constitutes a drive section that controls the operation of each of the RGB pixels 10 of the pixel array section 101, together with the system control circuit 105 that controls the RGB pixel drive circuit 102A; while the IR pixel drive circuit 102B constitutes a drive section that controls the operation of each of the IR pixels 20 of the pixel array section 101, together with the system control circuit 105 that controls the IR pixel drive circuit 102B. The RGB pixel drive circuit 102A and the IR pixel drive circuit 102B typically each include two scan systems, namely, a readout scan system and a sweep-out scan system, although specific configurations of their configurations are not depicted here.

In order to read out a signal from each pixel, the readout scan system sequentially performs selective scan of each of pixels of the pixel array section 101 row by row. The pixel signal read out from each pixel is an analog signal. The sweep-out scan system performs sweep-out scan on a read out row on which readout scan is to be performed by the readout scan system, prior to the readout scan by an exposure time.

By the sweep-out scan by the sweep-out scan system, unnecessary charges are swept out from the photoelectric conversion section of each pixel of the readout target row, thereby resetting the photoelectric conversion section. By sweeping out (resetting) unnecessary charges in the sweep-out scan system, an electronic shutter operation is performed. Here, the electronic shutter operation refers to an operation of discarding charges of the photoelectric conversion section and newly starting exposure (starting accumulation of charges).

The signal read out by the readout operation by the readout scan system corresponds to the amount of light received after the immediately preceding readout operation or electronic shutter operation. The period from the readout timing by the immediately preceding readout operation or the sweep-out timing of the electronic shutter operation to the readout timing of the current readout operation corresponds to a charge accumulation period (also referred to as an exposure period) in each pixel.

The pixel signal output from each of the RGB pixels 10 of the pixel row selectively scanned by the RGB pixel drive circuit 102A is input to the RGB signal processing circuit 103A through each of the vertical signal lines VSL1 for each pixel column. The RGB signal processing circuit 103A performs predetermined signal processing on the pixel signal output from each RGB pixel 10 of the selected row through the vertical signal line VSL1 for each of the pixel columns of the pixel array section 101, and temporarily holds the pixel signal after the signal processing.

Similarly, the pixel signal output from each IR pixel 20 of the pixel row selectively scanned by the IR pixel drive circuit 102B is input to the IR signal processing circuit 103B through each of the vertical signal lines VSL2 for each pixel column. The IR signal processing circuit 103B performs predetermined signal processing on the pixel signal output from each IR pixel 20 of the selected row through the vertical signal line VSL2 for each of the pixel columns of the pixel array section 101, and temporarily holds the pixel signal after the signal processing.

Specifically, each of the RGB signal processing circuit 103A and the IR signal processing circuit 103B performs signal processing at least including noise removal processing, for example, correlated double sampling (CDS) processing or double data sampling (DDS) processing. For example, the CDS processing removes the fixed pattern noise unique to the pixel such as the reset noise and the threshold variation of the amplification transistor in the pixel. Each of the RGB signal processing circuit 103A and the IR signal processing circuit 103B also includes an analog-digital (AD) conversion function, for example, and converts an analog pixel signal obtained by readout from the photoelectric conversion section into a digital signal, and outputs the obtained digital signal.

The column drive circuit 104 includes a shift register, an address decoder, and the like, and sequentially selects readout circuits (hereinafter, referred to as a pixel circuit) corresponding to pixel columns of the RGB signal processing circuit 103A and the IR signal processing circuit 103B. By the selective scan by the column drive circuit 104, pixel signals subjected to signal processing for each pixel circuit in the RGB signal processing circuit 103A and the IR signal processing circuit 103B are sequentially output.

The system control circuit 105 includes a timing generator that generates various timing signals, and the like, and performs drive control of the RGB pixel drive circuit 102A, the IR pixel drive circuit 102B, the RGB signal processing circuit 103A, the IR signal processing circuit 103B, the column drive circuit 104, and the like based on various timings generated by the timing generator.

Each of the RGB data processing section 108A and the IR data processing section 108B has at least an arithmetic processing function, and performs various signal processing such as arithmetic processing on the image signal output from the RGB signal processing circuit 103A or the IR signal processing circuit 103B.

The image data output from the RGB data processing section 108A and the IR data processing section 108B may be subjected to predetermined processing in the processor 4 or the like in the electronic device 1 equipped with the image sensor 100, or may be transmitted to the outside via a predetermined network, for example.

Note that the image sensor 100 may include a storage section for temporarily holding data necessary for signal processing in the RGB data processing section 108A and the IR data processing section 108B, data processed by any one or more of the RGB signal processing circuit 103A, the IR signal processing circuit 103B, the RGB data processing section 108A, and the IR data processing section 108B, and the like.

1.3.1 Modification of Image Sensor

Figure 4:
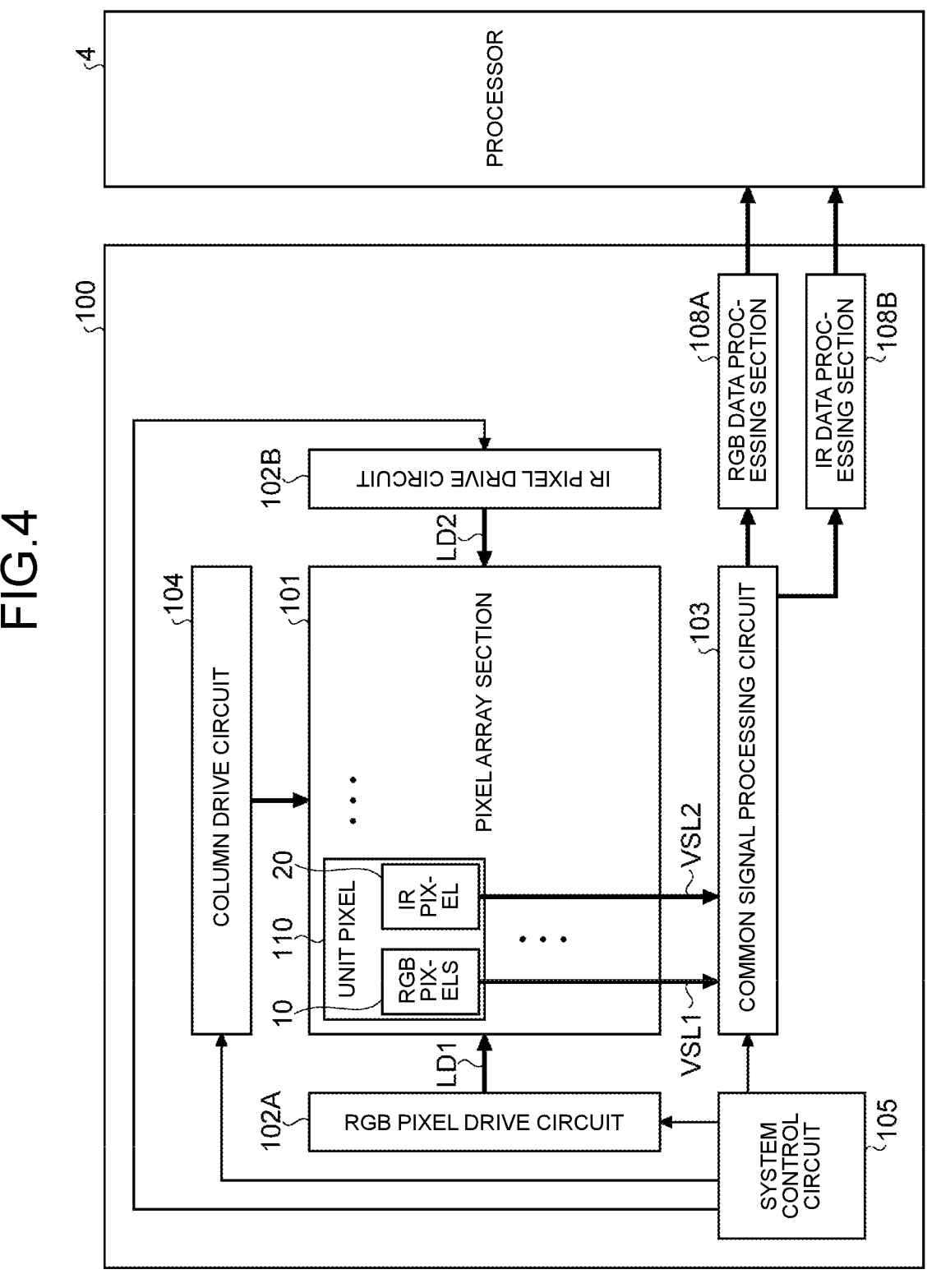
FIG. 4 is a block diagram depicting a schematic configuration example of an image sensor according to a modification of the first embodiment.

FIG. 4 is a block diagram depicting a schematic configuration example of an image sensor according to a modification of the first embodiment. FIG. 3 described above is a case where separate signal processing circuits (the RGB signal processing circuit 103A and the IR signal processing circuit 103B) are provided for each of the RGB pixel 10 and the IR pixel 20, respectively. However, arrangement of the signal processing circuit is not limited thereto, and it is also allowable to have a configuration as depicted in FIG. 4 where a common signal processing circuit 103 is provided for the RGB pixel 10 and the IR pixel 20. In this case, readout of the pixel signal from the RGB pixel 10 and readout of the pixel signal from the IR pixel 20 may be executed in time division or executed in parallel.

1.4 Configuration Example of Unit Pixel

Figure 5:
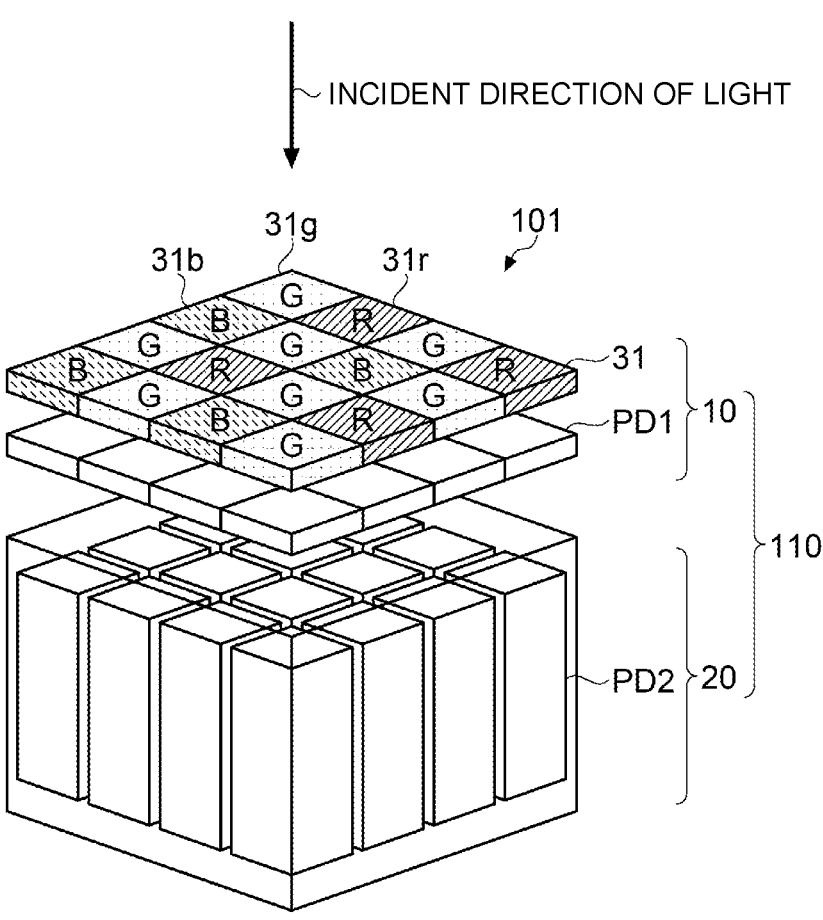
FIG. 5 is a schematic diagram depicting a schematic configuration example of a pixel array section according to the first embodiment.

Here, a configuration example of a unit pixel 110 will be described. The following is an exemplary case where the unit pixel 110 includes an RGB pixel 10 for acquiring an RGB image of three primary colors of RGB and an IR pixel 20 for acquiring an IR image of infrared (IR) light. In FIG. 5 and the following description, when color filters 31r, 31g, and 31b that transmit the light of individual color components constituting the RGB three primary colors are not distinguished, the filter is depicted with a reference sign 31.

FIG. 5 is a schematic diagram depicting a schematic configuration example of the pixel array section according to the first embodiment. As depicted in FIG. 5, the pixel array section 101 is formed with the unit pixels 110 each of which having a structure in which the RGB pixels 10 and the IR pixels 20 are arranged in the incident direction of light, and has a configuration in which the unit pixels 110 are arranged in a two-dimensional lattice pattern. That is, the present embodiment uses a configuration in which the RGB pixel 10 and the IR pixel 20 are positioned in a direction perpendicular to the arrangement direction (planar direction) of the unit pixels 110, and the light transmitted through the RGB pixel 10 positioned on the upstream side in the optical path of the incident light is to be incident on the IR pixel 20 positioned on the downstream side of the RGB pixel 10. With this configuration, the photoelectric conversion section PD2 of the IR pixel 20 is disposed on a surface side opposite to the incident light incident surface of the photoelectric conversion section PD1 of the RGB pixel 10. Accordingly, in the present embodiment, the optical axis of the incident light on the RGB pixel 10 and optical axis of the incident light on the IR pixel 20, which are arranged in the light incident direction, are totally or substantially aligned with each other.

Although the present embodiment is an exemplary case where the photoelectric conversion section PD1 constituting the RGB pixel 10 is formed of an organic material while the photoelectric conversion section PD2 constituting the IR pixel 20 is formed of a semiconductor material such as silicon, the materials are not limited thereto. For example, both the photoelectric conversion section PD1 and the photoelectric conversion section PD2 may be formed of a semiconductor material, both the photoelectric conversion section PD1 and the photoelectric conversion section PD2 may be formed of an organic material, or the photoelectric conversion section PD1 may be formed of a semiconductor material while the photoelectric conversion section PD2 may be formed of an organic material. Alternatively, at least one of the photoelectric conversion section PD1 or the photoelectric conversion section PD2 may be formed of a photoelectric conversion material that is neither an organic material nor the semiconductor material.

1.5 Circuit Configuration Example of Unit Pixel

Figure 6:
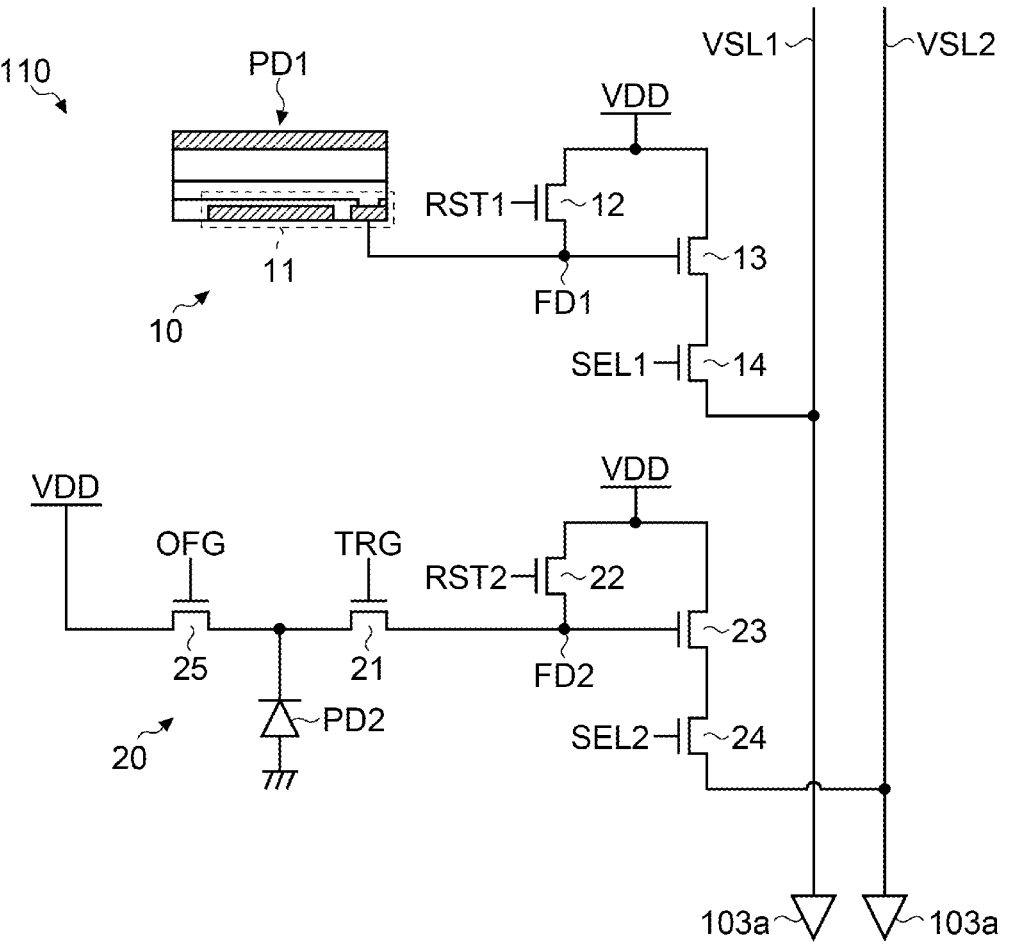
FIG. 6 is a circuit diagram depicting a schematic configuration example of a unit pixel according to the first embodiment.

Next, a circuit configuration example of the unit pixel 110 will be described. FIG. 6 is a circuit diagram depicting a schematic configuration example of the unit pixel according to the first embodiment. As depicted in FIG. 6, the unit pixel 110 includes one RGB pixel 10 and one IR pixel 20.

(RGB Pixel 10)

The RGB pixel 10 includes a photoelectric conversion section PD1, a transfer gate 11, a floating diffusion region FD1, a reset transistor 12, an amplification transistor 13, and a selection transistor 14, for example.

The selection transistor 14 has a gate connected to a selection control line included in the pixel drive line LD1; the reset transistor 12 has a gate connected to a reset control line included in the pixel drive line LD1; and a storage electrode described below (refer to a storage electrode 37 in FIG. 10 described below) of the transfer gate 11 is connected to a transfer control line included in the pixel drive line LD1. Further, the amplification transistor 13 has a drain connected to the vertical signal line VSL1 via the selection transistor 14; the vertical signal line VSL1 has one end connected to the RGB signal processing circuit 103A.

In the following description, the reset transistor 12, the amplification transistor 13, and the selection transistor 14 are also collectively referred to as a pixel circuit. The pixel circuit may include the floating diffusion region FD1 and/or the transfer gate 11.

The photoelectric conversion section PD1 is formed of an organic material, for example, and performs photoelectric conversion of incident light. The transfer gate 11 transfers the charge generated in the photoelectric conversion section PD1. The floating diffusion region FD1 accumulates the charge transferred by the transfer gate 11. The amplification transistor 13 causes a pixel signal having a voltage value corresponding to the charge accumulated in the floating diffusion region FD1 to emerge in the vertical signal line VSL1. The reset transistor 12 releases the charge accumulated in the floating diffusion region FD1. The selection transistor 14 selects the RGB pixel 10 as a readout target.

The anode of the photoelectric conversion section PD1 is grounded, while the cathode is connected to the transfer gate 11. The transfer gate 11 includes a storage electrode 37 and a readout electrode 36, for example. Details of the transfer gate 11 will be described below in detail with reference to FIG. 10. At the time of exposure, a voltage for collecting charges generated in the photoelectric conversion section PD1 to a semiconductor layer 35 in the vicinity of the storage electrode 37 is applied to the storage electrode 37 via the transfer control line. At the time of readout, a voltage for releasing the charges collected in the semiconductor layer 35 in the vicinity of the storage electrode 37 via the readout electrode 36 is applied to the storage electrode 37 via the transfer control line.

The charge released via the readout electrode 36 is accumulated in the floating diffusion region FD1 having by a wiring structure connecting the readout electrode 36, the source of the reset transistor 12, and the gate of the amplification transistor 13. Note that the drain of the reset transistor 12 may be connected to a power supply voltage VDD or to a power supply line to which a reset voltage lower than the power supply voltage VDD is supplied, for example.

The source of the amplification transistor 13 may be connected to a power supply line via, for example, a constant current circuit (not depicted) or the like. The drain of the amplification transistor 13 is connected to the source of the selection transistor 14, while the drain of the selection transistor 14 is connected to the vertical signal line VSL1.

The floating diffusion region FD1 converts the accumulated charge into a voltage of a voltage value corresponding to the charge amount. The floating diffusion region FD1 may be an earth capacitance, for example. However, the configuration is not limited thereto. The floating diffusion region FD1 may be a capacitance added by intentionally connecting a capacitor or the like to a node which connects the drain of the transfer gate 11, the source of the reset transistor 12, and the gate of the amplification transistor 13 to each other.

The vertical signal line VSL1 is connected to an analog-to-digital (AD) conversion circuit 103a provided for each column (that is, for each vertical signal line VSL1) in the RGB signal processing circuit 103A. The AD conversion circuit 103a includes a comparator and a counter, for example, and converts an analog pixel signal into a digital pixel signal by comparing a reference voltage having a shape such as a single slope or a ramp shape input from an external reference voltage generation circuit (digital-to-analog converter (DAC)) with the pixel signal emerging in the vertical signal line VSL1. The AD conversion circuit 103a may be configured to be able to reduce kTC noise and the like by incorporating a correlated double sampling (CDS) circuit, for example.

(IR Pixel 20)

The IR pixel 20 includes a photoelectric conversion section PD2, a transfer transistor 21, a floating diffusion region FD2, a reset transistor 22, an amplification transistor 23, a selection transistor 24, and a discharge transistor 25, for example. That is, the IR pixel 20 has a configuration in which the transfer gate 11 in the RGB pixel 10 has been replaced with the transfer transistor 21, and the discharge transistor 25 has been added.

The connection relationship among the floating diffusion region FD2, the reset transistor 22, and the amplification transistor 23 with respect to the transfer transistor 21 may be similar to the connection relationship among the floating diffusion region FD1, the reset transistor 12, and the amplification transistor 13 with respect to the transfer gate 11 in the RGB pixel 10. Further, the connection relationship among the amplification transistor 23, the selection transistor 24, and the vertical signal line VSL2 may be similar to the connection relationship among the amplification transistor 13, the selection transistor 14, and the vertical signal line VSL1 in the RGB pixel 10.

For example, the transfer transistor 21 has a source connected to a cathode of the photoelectric conversion section PD2, and has a drain connected to the floating diffusion region FD2. Further, the transfer transistor 21 has a gate connected to a transfer control line included in the pixel drive line LD2.

For example, the discharge transistor 25 may have the source connected to the cathode of the photoelectric conversion section PD2 and may have the drain connected to the power supply voltage VDD or a power supply line to which a reset voltage lower than the power supply voltage VDD is supplied. Further, the discharge transistor 25 has the gate connected to a discharge control line included in the pixel drive line LD2.

In the following description, the reset transistor 22, the amplification transistor 23, and the selection transistor 24 are also collectively referred to as a pixel circuit. The pixel circuit may include one or more of the floating diffusion region FD2, the transfer transistor 21, and the discharge transistor 25.

The photoelectric conversion section PD2 is formed of a semiconductor material, for example, and performs photoelectric conversion of incident light. The transfer transistor 21 transfers the charge generated in the photoelectric conversion section PD2. The floating diffusion region FD2 accumulates the charge transferred by the transfer transistor 21. The amplification transistor 23 causes a pixel signal having a voltage value corresponding to the charge accumulated in the floating diffusion region FD2 to emerge in the vertical signal line VSL2. The reset transistor 22 releases the charge accumulated in the floating diffusion region FD2. The selection transistor 24 selects the IR pixel 20 as a readout target.

The photoelectric conversion section PD2 has the anode grounded, and has the cathode connected to the transfer transistor 21. The drain of the transfer transistor 21 is connected to the source of the reset transistor 22 and the gate of the amplification transistor 23. The wiring structure connecting these transistors constitutes the floating diffusion layer FD2. The charge released from the photoelectric conversion section PD2 via the transfer transistor 21 is accumulated in the floating diffusion region FD2.

The floating diffusion region FD2 converts the accumulated charge into a voltage of a voltage value corresponding to the charge amount. The floating diffusion region FD2 may be an earth capacitance, for example. However, the configuration is not limited thereto, and the floating diffusion region FD2 may be a capacitance added by intentionally connecting a capacitor or the like to a node which connects the drain of the transfer transistor 21, the source of the reset transistor 22, and the gate of the amplification transistor 23 to each other.

The discharge transistor 25 is turned on when discharging the charge accumulated in the photoelectric conversion section PD2 and resetting the photoelectric conversion section PD2. With this operation, the charge accumulated in the photoelectric conversion section PD2 is released to the power supply line via the discharge transistor 25, and the photoelectric conversion section PD2 is reset to an unexposed state.

Similarly to the vertical signal line VSL1, the vertical signal line VSL2 is connected to an AD conversion circuit 103a provided for each column (that is, for each vertical signal line VSL2) in the IR signal processing circuit 103B.

1.6 Modification of Circuit Configuration

Next, modifications of the circuit configuration of the unit pixel 110 depicted in FIG. 6 will be described with some examples.

1.6.1 First Modification

Figure 7:
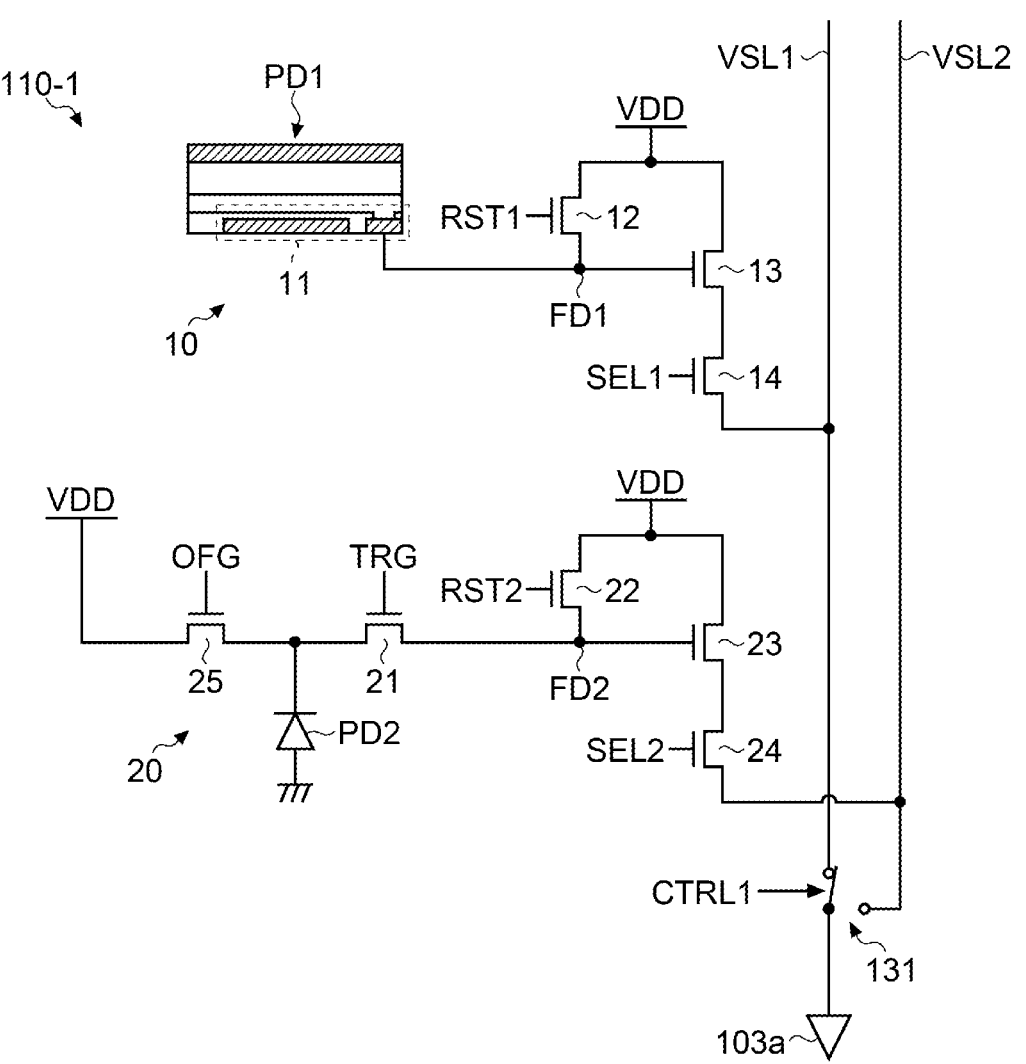
FIG. 7 is a circuit diagram depicting a schematic configuration example of a unit pixel according to a first modification of the first embodiment.

FIG. 7 is a circuit diagram depicting a schematic configuration example of a unit pixel according to a first modification of the first embodiment. As depicted in FIG. 7, a unit pixel 110-1 has a configuration similar to the configuration of the unit pixel 110 depicted in FIG. 6, in which the vertical signal lines VSL1 and VSL2 are connected to a common AD conversion circuit 103a. Accordingly, the first modification includes a switch circuit 131 that switches the vertical signal line connected to the AD conversion circuit 103a to either of the vertical signal lines VSL1 or VSL2. For example, the switch circuit 131 may be included in the RGB signal processing circuit 103A and the IR signal processing circuit 103B, or in a common signal processing circuit 103. Further, for example, the switch circuit 131 may be provided on the same semiconductor substrate as the pixel circuit of the RGB pixel 10 and/or the IR pixel 20, may be provided on a semiconductor substrate on which the signal processing circuit is disposed, or may be provided on a semiconductor substrate different from these. Further, the control signal for controlling the switch circuit 131 may be supplied from the RGB pixel drive circuit 102A or the IR pixel drive circuit 102B, may be supplied from the column drive circuit 104, or may be supplied from another configuration (for example, the processor 4 or the like in FIG. 1).

With this configuration, the RGB signal processing circuit 103A and the IR signal processing circuit 103B can be replaced with a common signal processing circuit, making it possible to reduce the circuit scale, leading to downsizing of the image sensor 100 and achievement of higher resolution due to enhanced area efficiency.

1.6.2 Second Modification

Figure 8:
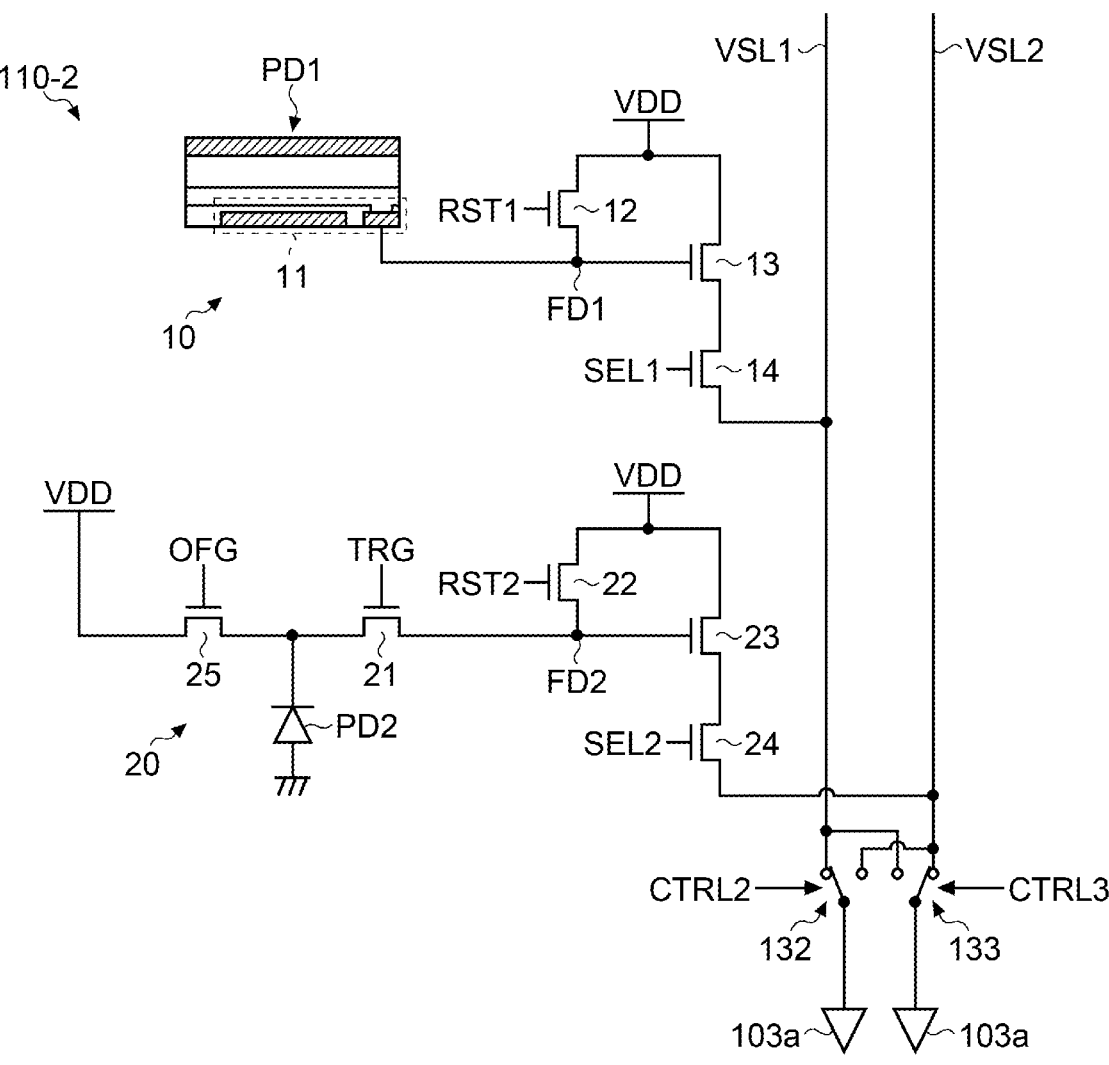
FIG. 8 is a circuit diagram depicting a schematic configuration example of a unit pixel according to a second modification of the first embodiment.

FIG. 8 is a circuit diagram depicting a schematic configuration example of a unit pixel according to a second modification of the first embodiment. As depicted in FIG. 8, a unit pixel 110-2 has a configuration similar to the configuration of the unit pixel 110 depicted in FIG. 6, in which each of the vertical signal lines VSL1 and VSL2 can be connected to either of two common AD conversion circuits 103a. Accordingly, the second modification includes: a switch circuit 132 that switches the vertical signal line connected to the AD conversion circuit 103a to either of the vertical signal lines VSL1 or VSL2; and a switch circuit 133 that switches the vertical signal line connected to the AD conversion circuit 103a to either of the vertical signal lines VSL1 or VSL2. For example, the switch circuits 132 and 133 may be included in the RGB signal processing circuit 103A and the IR signal processing circuit 103B, or in a common signal processing circuit 103. Further, for example, the switch circuits 132 and 133 may be provided on the same semiconductor substrate as the pixel circuit of the RGB pixel 10 and/or the IR pixel 20, may be provided on a semiconductor substrate on which the RGB signal processing circuit 103A and the IR signal processing circuit 103B are disposed, or may be provided on a semiconductor substrate different from these. Further, the control signal for controlling the switch circuits 132 and 133 may be supplied from the RGB pixel drive circuit 102A or the IR pixel drive circuit 102B, may be supplied from the column drive circuit 104, or may be supplied from another configuration (for example, the processor 4 or the like in FIG. 1).

With this configuration, since the AD conversion circuit 103a to be used for each column can be selected from a plurality of AD conversion circuits (two AD conversion circuits in this example), it is possible to suppress image quality degradation due to noise generation such as streaking, for example.

1.6.3 Third Modification

Figure 9:
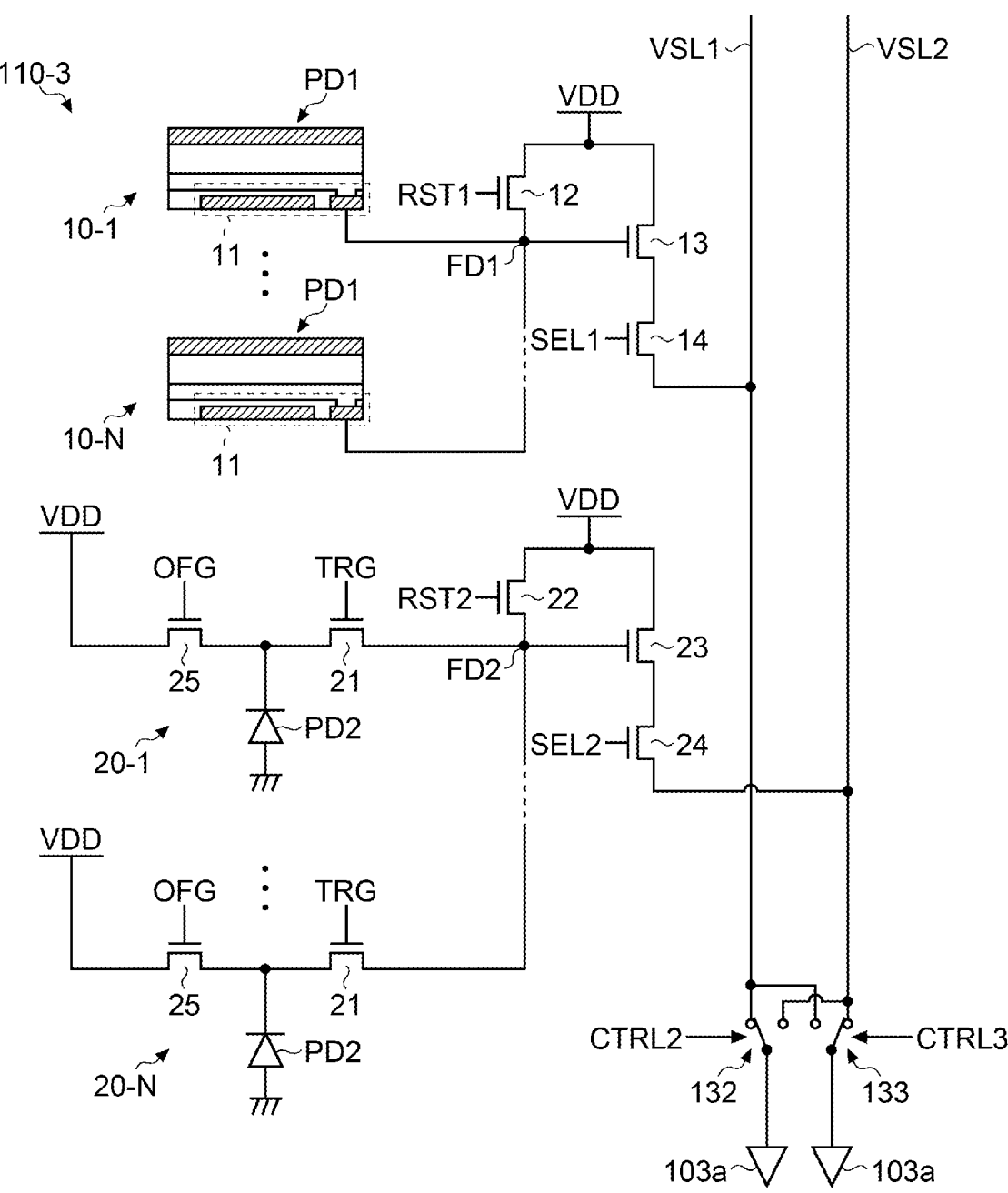
FIG. 9 is a circuit diagram depicting a schematic configuration example of a unit pixel according to a third modification of the first embodiment.

FIG. 9 is a circuit diagram depicting a schematic configuration example of a unit pixel according to a third modification of the first embodiment. As depicted in FIG. 9, regarding the RGB pixel 10, a unit pixel 110-3 has a configuration similar to the unit pixel 110-2 depicted in FIG. 8, in which there is a pixel sharing circuit structure in which a plurality of RGB pixels 10-1 to 10-N(N is an integer of 2 or more) share the floating diffusion region FD1, the reset transistor 12, the amplification transistor 13, and the selection transistor 14. Moreover, regarding the IR pixel 20 in a similar manner, the unit pixel 110-3 has a configuration similar to the unit pixel 110-2 depicted in FIG. 8, in which there is a pixel sharing circuit structure in which a plurality of IR pixels 20-1 to 20-N share the floating diffusion region FD2, the reset transistor 22, the amplification transistor 23, and the selection transistor 24. The numbers of the RGB pixels 10-1 to 10-N and the numbers of the IR pixels 20-1 to 20-N do not necessarily match.

With this configuration, it is possible to switch between readout in a high dynamic range (HDR) and readout in a low dynamic range (LDR) according to the situation, leading to suppression of image quality degradation at the time of low illuminance or high illuminance. Although the present description is an exemplary case where the second modification described with reference to FIG. 8 is used as a base, the configuration is not limited thereto, and the unit pixel 110 and the unit pixel 110-1 depicted in FIGS. 6 and 7 may be used as a base.

1.7 Cross-Sectional Structure Example of Unit Pixel

Figure 10:
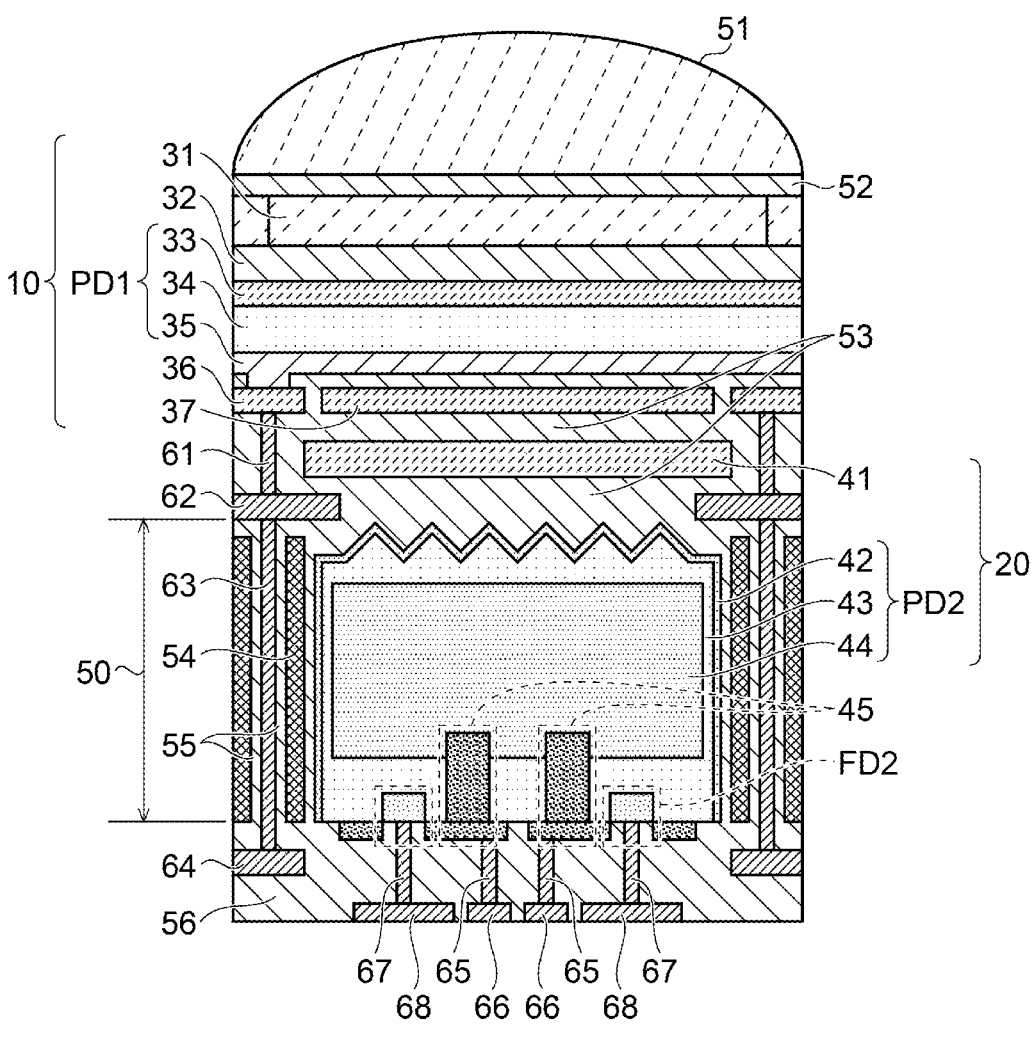
FIG. 10 is a cross-sectional view depicting a cross-sectional structure example of an image sensor according to the first embodiment.

Next, an example of a cross-sectional structure of the image sensor 100 according to the first embodiment will be described with reference to FIG. 10. FIG. 10 is a cross-sectional view depicting a cross-sectional structure example of the image sensor according to the first embodiment. Here, a cross-sectional structure example will be described focusing on a semiconductor chip in which the photoelectric conversion sections PD1 and PD2 are formed in the unit pixel 110.

In addition, the following description is an example of a cross-sectional structure of a back illumination type device in which the light incident surface is on the back surface side (opposite side to the element formation surface) of a semiconductor substrate 50. However, the type is not limited thereto, and this may be the cross-sectional structure of a front illumination type device in which the light incident surface is on the front surface side (element formation surface side) of the semiconductor substrate 50. Further, although the present description is an exemplary case where an organic material is used for the photoelectric conversion section PD1 of the RGB pixel 10, it is also allowable to use, as described above, one or both of an organic material and a semiconductor material (also referred to as an inorganic material) as the photoelectric conversion material of each of the photoelectric conversion sections PD1 and PD2.

When a semiconductor material is used for both the photoelectric conversion material of the photoelectric conversion section PD1 and the photoelectric conversion material of the photoelectric conversion section PD2, the image sensor 100 may have a cross-sectional structure in which the photoelectric conversion section PD1 and the photoelectric conversion section PD2 are formed in the same semiconductor substrate 50, may have a cross-sectional structure having a semiconductor substrate in which the photoelectric conversion section PD1 is formed and a semiconductor substrate in which the photoelectric conversion section PD2 is formed bonded with each other, or may have a cross-sectional structure in which one of the photoelectric conversion sections PD1 and PD2 is formed in the semiconductor substrate 50 and the other is formed in a semiconductor layer formed on the back surface or the front surface of the semiconductor substrate 50.

As depicted in FIG. 10, the present embodiment has a structure in which the photoelectric conversion section PD2 of the IR pixel 20 is formed on the semiconductor substrate 50 while the photoelectric conversion section PD1 of the RGB pixel 10 is provided on the back surface side (opposite side to the element formation surface) of the semiconductor substrate 50. In FIG. 10, for convenience of explanation, the back surface of the semiconductor substrate 50 is located on the upper side in the drawing while the front surface is located on the lower side in the drawing.

The semiconductor substrate 50 may be formed by using a semiconductor material such as silicon (Si), for example. However, the semiconductor material is not limited thereto, and it is allowable to use various semiconductor materials including compound semiconductors such as GaAs, InGaAs, InP, AlGaAs, InGaP, AlGaInP, and InGaAsP.

(RGB Pixel 10)

The photoelectric conversion section PD1 of the RGB pixel 10 is provided on the back surface side of the semiconductor substrate 50 across an insulating layer 53. The photoelectric conversion section PD1 includes, for example, a photoelectric conversion film 34 formed of an organic material, as well as a transparent electrode 33 and a semiconductor layer 35, disposed across the photoelectric conversion film 34. The transparent electrode 33 provided on the upper side in the drawing (hereinafter, the upper side in the drawing is described as an upper surface side, and the lower side in the drawing is as a lower surface side) with respect to the photoelectric conversion film 34 functions as an anode of the photoelectric conversion section PD1, and the semiconductor layer 35 provided on the lower surface side functions as a cathode of the photoelectric conversion section PD1, for example.

The semiconductor layer 35 functioning as a cathode is electrically connected to the readout electrode 36 formed in the insulating layer 53. The readout electrode 36 is connected to wiring lines 61, 62, 63, and 64 penetrating the insulating layer 53 and the semiconductor substrate 50, thereby being electrically extended to the front surface (lower surface) side of the semiconductor substrate 50. Although not depicted in FIG. 10, the wiring line 64 is electrically connected to the floating diffusion region FD1 depicted in FIG. 6.

On the lower surface side of the semiconductor layer 35 functioning as a cathode, there is provided a storage electrode 37 provided across the insulating layer 53. Although not depicted in FIG. 10, the storage electrode 37 is connected to the transfer control line in the pixel drive line LD1. As described above, at the time of exposure, a voltage for collecting charges generated in the photoelectric conversion section PD1 to the semiconductor layer 35 in the vicinity of the storage electrode 37 is applied on the storage electrode 37, and at the time of readout, a voltage for releasing the charges collected in the semiconductor layer 35 in the vicinity of the storage electrode 37 via the readout electrode 36 is applied to the storage electrode 37.

Similarly to the transparent electrode 33, the readout electrode 36 and the storage electrode 37 may be transparent conductive films. The transparent electrode 33, the readout electrode 36, and the storage electrode 37 may be formed by using a transparent conductive film using indium tin oxide (ITO) or indium zinc oxide (IZO), for example. However, the conductive film is not limited thereto, and various conductive films may be used as long as the film is a conductive film that permits transmission of beams of light of wavelength bands to be detected by the photoelectric conversion section PD2.

Further, the semiconductor layer 35 may be a transparent semiconductor layer such as IGZO, for example. However, the semiconductor layer is not limited thereto, and various semiconductor layers may be used as long as the layer is a semiconductor layer that permits transmission of beams of light having wavelength bands to be detected by the photoelectric conversion section PD2.

Further, the insulating layer 53 may be an insulating film such as a silicon oxide film ($SiO_2$) or a silicon nitride film (SiN), for example. However, the insulating film is not limited thereto, and various insulating films may be used as long as the film is an insulating film that permits transmission of beams of light of wavelength bands to be detected by the photoelectric conversion section PD2.

On the upper surface side of the transparent electrode 33 functioning as an anode, there is provided a color filter 31 across a sealing film 32. The sealing film 32 is formed of, for example, an insulating material such as silicon nitride (SiN), and may include atoms of aluminum (Al), titanium (Ti), and the like in order to prevent these atoms from diffusing from the transparent electrode 33.

For example, the color filter 31 that selectively transmits beams of light of a specific wavelength component is provided for one RGB pixel 10, although the arrangement of the color filters 31 will be described below. However, the color filter 31 may be omitted when a monochrome pixel that acquires luminance information is provided instead of the RGB pixel 10 that acquires color information.

(IR Pixel 20)

The photoelectric conversion section PD2 of the IR pixel 20 includes: a p-type semiconductor region 43 formed in the p-well region 42 in the semiconductor substrate 50; and an n-type semiconductor region 44 formed near the center of the p-type semiconductor region 43, for example. The n-type semiconductor region 44 functions as, for example, a charge accumulation region that accumulates charges (electrons) generated by photoelectric conversion, while the p-type semiconductor region 43 functions as a region that forms a potential gradient for collecting the charges generated by photoelectric conversion into the n-type semiconductor region 44.

For example, on the light incident surface side of the photoelectric conversion section PD2, there is provided an IR filter 41 that selectively transmits IR light. The IR filter 41 may be disposed, for example, in an insulating layer 53 provided on the back surface side of the semiconductor substrate 50. By arranging the IR filter 41 on the light incident surface of the photoelectric conversion section PD2, it is possible to suppress the incidence of visible light on the photoelectric conversion section PD2, leading to improvement of the S/N ratio of IR light to visible light. This makes it possible to obtain a more accurate detection result of IR light.

For example, on the light incident surface of the semiconductor substrate 50, there is provided a fine uneven structure in order to suppress reflection of incident light (IR light in this example). This uneven structure may be a structure referred to as a moth-eye structure, or may be an uneven structure having a difference in size or pitch from the moth-eye structure.

On the front surface (lower surface in the drawing) side of the semiconductor substrate 50, that is, the element formation surface side, there are provided a vertical transistor 45 functioning as the transfer transistor 21 and a floating diffusion region FD2 functioning as the charge accumulation section. The gate electrode of the vertical transistor 45 reaches the n-type semiconductor region 44 from the front surface of the semiconductor substrate 50, and is connected to the IR pixel drive circuit 102B via a wiring lines 65 and 66 (part of the transfer control line of the pixel drive line LD2) formed in an interlayer insulating film 56.

The charge released through the vertical transistor 45 is accumulated in the floating diffusion region FD2. The floating diffusion region FD2 is connected to the source of the reset transistor 22 and the gate of the amplification transistor 23 via wiring lines 67 and 68 formed in the interlayer insulating film 56. Note that the reset transistor 22, the amplification transistor 23, and the selection transistor 24 may be provided on the element formation surface of the semiconductor substrate 50, or may be provided on a semiconductor substrate different from the semiconductor substrate 50.

Although FIG. 10 depicts an exemplary case where two vertical transistors 45 (transfer transistors 21) are provided for one photoelectric conversion section PD2, the number is not limited thereto, and one vertical transistor 45 may be provided, or three or more vertical transistors 45 may be provided. Similarly, although the illustration is an exemplary case where two floating diffusion regions FD2 are provided for one photoelectric conversion section PD2, the number is not limited thereto, and one floating diffusion region FD2 may be provided, or three or more floating diffusion regions FD2 may be provided.

(Pixel Isolation Structure)

The semiconductor substrate 50 has a pixel isolation section 54 that electrically isolates the plurality of unit pixels 110 from each other. The photoelectric conversion section PD2 is provided in each region partitioned by the pixel isolation section 54. For example, when the image sensor 100 is viewed from the back surface (upper surface in the drawing) side of the semiconductor substrate 50, the pixel isolation section 54 has a lattice shape interposed between the plurality of unit pixels 110, for example. Each photoelectric conversion section PD2 is formed in each region partitioned by the pixel isolation section 54.

The pixel isolation section 54 may be a reflective film that reflects light, formed of a material such as tungsten (W) or aluminum (Al), for example. This makes it possible to reflect the incident light entering the photoelectric conversion section PD2 by the pixel isolation section 54, enabling extension of the optical path length of the incident light in the photoelectric conversion section PD2. In addition, since the pixel isolation section 54 has a light reflection structure, it is possible to reduce leakage of light to adjacent pixels, leading to further improvement of image quality, distance measurement accuracy, and the like. Note that the configuration in which the pixel isolation section 54 has the light reflection structure is not limited to the configuration using the reflective film, and can be implemented, for example, by using a material having a refractive index different from that of the semiconductor substrate 50 for the pixel isolation section 54.

For example, there is provided a fixed charge film 55 between the semiconductor substrate 50 and the pixel isolation section 54. The fixed charge film 55 is formed using, for example, a high dielectric having a negative fixed charge so as to form a positive charge (hole) accumulation region at an interface portion with the semiconductor substrate 50 to suppress generation of a dark current. Since the fixed charge film 55 is formed to have a negative fixed charge, an electric field is applied to the interface with a semiconductor substrate 138 by the negative fixed charge, leading to formation of the positive charge (hole) accumulation region.

The fixed charge film 55 can be formed of hafnium oxide film (HfO$_2$ film), for example. In addition, the fixed charge film 55 can be formed to contain at least one of oxides using a material such as hafnium, zirconium, aluminum, tantalum, titanium, magnesium, yttrium, and lanthanoid elements, for example.

FIG. 10 depicts an exemplary case where the pixel isolation section 54 has a structure referred to as a Full Trench Isolation (FTI) structure reaching from the front surface to the back surface of the semiconductor substrate 50. The structure, however, is not limited thereto, and, it is possible to adopt various element isolation structures such as a structure referred to as a Deep Trench Isolation (DTI) structure in which the pixel isolation section 54 is formed from the back surface or the front surface of the semiconductor substrate 50 to the vicinity of the middle of the semiconductor substrate 50, for example.

(Pupil Correction)

On the upper surface of the color filter 31, there is provided a planarization film 52 formed of a silicon oxide film, a silicon nitride film, or the like. The upper surface of the planarization film 52 is planarized by, chemical mechanical polishing (CMP), for example. On the planarized upper surface, an on-chip lens 51 is provided for each unit pixel 110. The on-chip lens 51 of each unit pixel 110 has a curvature designed to collect incident light to the photoelectric conversion sections PD1 and PD2. The positional relationship among the on-chip lens 51, the color filter 31, the IR filter 41, and the photoelectric conversion section PD2 in each unit pixel 110 may be adjusted according to the distance (image height) from the center of the pixel array section 101, for example (pupil correction).

Further, the structure depicted in FIG. 10 may include a light shielding film for preventing obliquely incident light from leaking into an adjacent pixel. The light shielding film can be located above the pixel isolation section 54 provided inside the semiconductor substrate 50 (upstream in the optical path of the incident light). However, when pupil correction is performed, the position of the light shielding film may be adjusted according to the distance (image height) from the center of the pixel array section 101, for example. Such a light shielding film may be provided in the sealing film 32 or the planarization film 52, for example. Further, the material of the light shielding film may be use a light shielding material such as aluminum (Al) and tungsten (W), for example.

1.8 Organic Material

In the first embodiment, when an organic semiconductor is used as the material of the photoelectric conversion film 34, the layer structure of the photoelectric conversion film 34 can be the following structure. Note that, in the case of a stacked structure, the stacking order can be appropriately changed.

(1) Single-layer structure of p-type organic semiconductor (2) Single-layer structure of n-type organic semiconductor (3-1) Stacked structure of p-type organic semiconductor layer/n-type organic semiconductor layer (3-2) Stacked structure of p-type organic semiconductor layer/mixed layer (bulk heterojunction structure) of p-type organic semiconductor and n-type organic semiconductor/n-type organic semiconductor layer (3-3) Stacked structure of p-type organic semiconductor layer/mixed layer (bulk heterojunction structure) of p-type organic semiconductor and n-type organic semiconductor (3-4) Stacked structure of n-type organic semiconductor layer/mixed layer (bulk heterojunction structure) of p-type organic semiconductor and n-type organic semiconductor (4) Mixed layer of p-type organic semiconductor and p-type organic semiconductor (bulk heterojunction structure)

Here, examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative.

Examples of the n-type organic semiconductor include fullerene and a fullerene derivative <for example, fullerene (higher fullerenes, endohedral fullerenes, etc.) such as C60, C70, and C74, or a fullerene derivative (for example, fullerene fluoride, PCBM fullerene compound, and fullerene multimer)>, an organic semiconductor having a larger (deeper) HOMO and LUMO than a p-type organic semiconductor, and a transparent inorganic metal oxide.

More specific examples of the n-type organic semiconductor include: the materials including a heterocyclic compound containing a nitrogen atom, an oxygen atom, or a sulfur atom, for example, an organic molecule having a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, or the like as a part of a molecular skeleton; an organometallic complex; and a subphthalocyanine derivative.

In addition, examples of a group contained in the fullerene derivative include: a halogen atom; a linear, branched or cyclic alkyl group or a phenyl group; a group having a linear or condensed aromatic compound; a group having a halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having chalcogenide; a phosphine group; a phosphone group; or derivatives of these.

Examples of the film thickness of the photoelectric conversion film 34 formed of the organic material as described above may include but not limited to the following values: $1\times10^{-8}$ m (meter) to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{-7}$ m to $1.8\times10^{-7}$ m. The organic semiconductors are often classified into p-type and n-type organic semiconductors. However, the p-type means that holes are easily transported, and the n-type means that electrons are easily transported. Therefore, the organic semiconductor is not to be limited to the interpretation that it has holes or electrons as a majority carrier of thermal excitation like an inorganic semiconductor.

Examples of a material constituting the photoelectric conversion film 34 that performs photoelectric conversion of light having a green wavelength include a rhodamine dye, a melacyanine dye, a quinacridone derivative, and a subphthalocyanine dye (subphthalocyanine derivative).

In addition, examples of a material constituting the photoelectric conversion film 34 that performs photoelectric conversion of blue light include a coumaric acid dye, tris-8 hydroxyquinoline aluminum (Alq3), and a melacyanine dye.

Further, examples of a material constituting the photoelectric conversion film 34 that performs photoelectric conversion of red light include phthalocyanine dyes and subphthalocyanine dyes (subphthalocyanine derivatives).

Still further, the photoelectric conversion film 34 can use a panchromatic photosensitive organic photoelectric conversion film that is sensitive to substantially all ranges of visible light from the ultraviolet region to the red region.

1.9 Planar Structure Example

Figure 11:
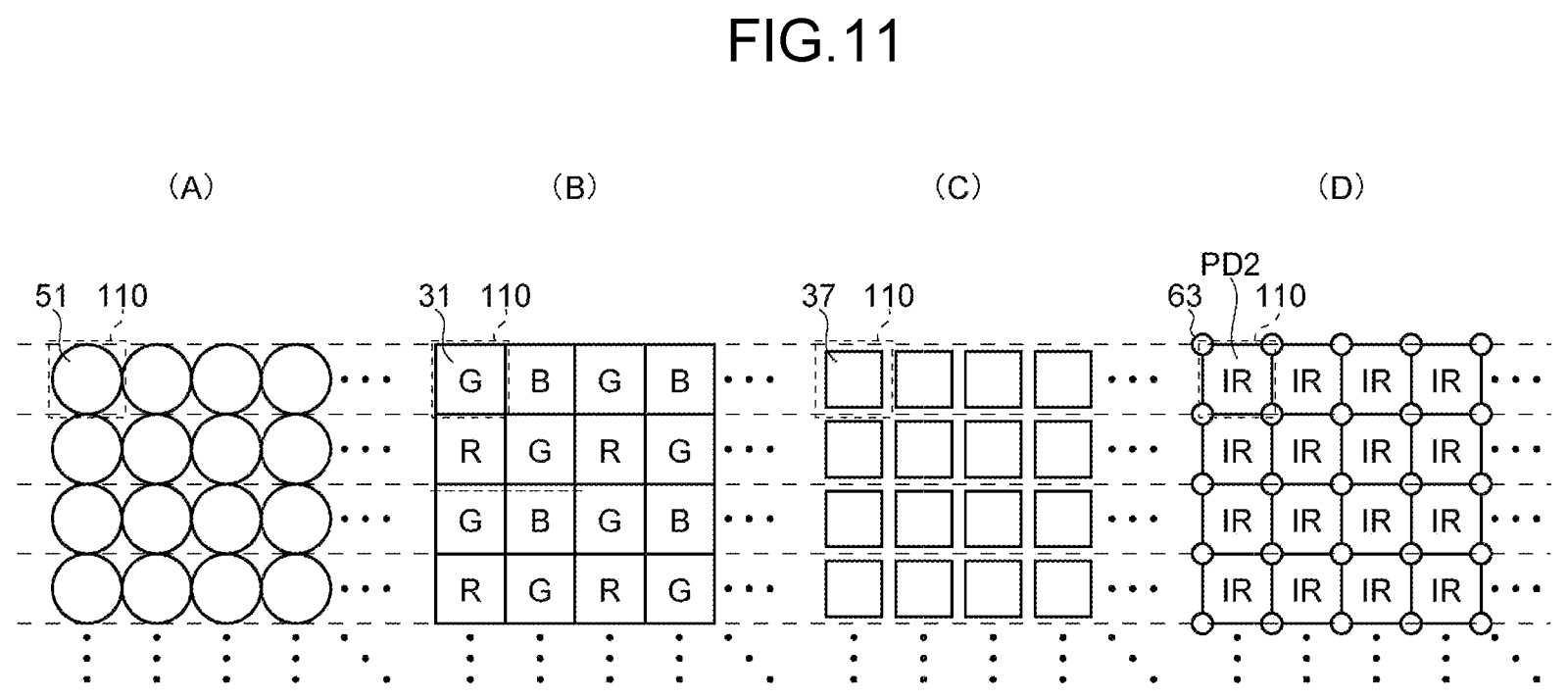

Next, a planar structure example of the pixel array section according to the present embodiment will be described. FIG. 11 is a diagram depicting a planar layout example of each layer of the pixel array section according to the first embodiment, in which (A) depicts a planar layout example of the on-chip lens 51, (B) depicts a planar layout example of the color filter 31, (C) depicts a planar layout example of the storage electrode 37, and (D) depicts a planar layout example of the photoelectric conversion section PD2. In FIG. 11, (A) to (D) depict planar layout examples of surfaces parallel to the element formation surface of the semiconductor substrate 50. The present description uses an exemplary case where a 2×2 pixel Bayer array including a pixel that selectively detects a red (R) wavelength component (hereinafter, referred to as an R pixel 10r), a pixel that selectively detects a green (G) wavelength component (hereinafter, referred to as a G pixel 10g) and a pixel that selectively detects light of a blue (B) wavelength component (hereinafter, referred to as a B pixel 10b) is used as a unit array.

As depicted in (A) to (D) of FIG. 11, the present embodiment uses a configuration in which one on-chip lens 51, one color filter 31, one storage electrode 37, and one photoelectric conversion section PD2 are provided for one unit pixel 110. In the present description, one storage electrode 37 corresponds to one RGB pixel 10, while one photoelectric conversion section PD2 corresponds to one IR pixel 20.

In this manner, by arranging one RGB pixel 10 and one IR pixel 20 along the traveling direction of the incident light in one unit pixel 110, it is possible to improve the coaxiality of the RGB pixel 10 and the IR pixel 20 with respect to the incident light, leading to suppression of a spatial shift occurring between the RGB image and the IR image. This makes it possible to improve the accuracy of results obtained by integrally processing information (RGB images and IR images) acquired by different sensors.

1.10 Wiring Example of Pixel Drive Line

Figure 12:
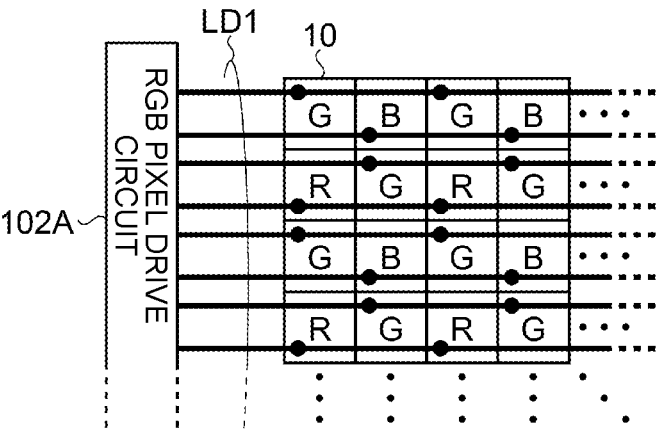
FIG. 12 is a plan view depicting a wiring example of pixel drive lines for RGB pixels according to the first embodiment.
Figure 13:
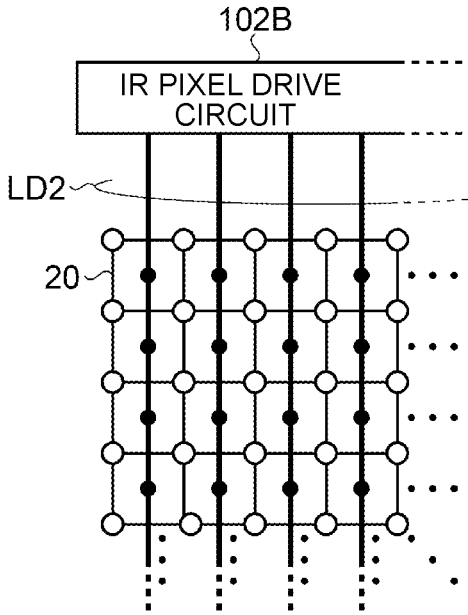
FIG. 13 is a plan view depicting a wiring example of a pixel drive line for an IR pixel according to the first embodiment.

Next, wiring examples of the pixel drive line LD1 connecting the RGB pixel 10 and the RGB pixel drive circuit 102A as well as the pixel drive line LD2 connecting the IR pixel 20 and the IR pixel drive circuit 102B will be described. FIG. 12 is a plan view depicting a wiring example of pixel drive lines for RGB pixels according to the first embodiment; FIG. 13 is a plan view depicting a wiring example of pixel drive lines for IR pixels according to the first embodiment.

As depicted in FIGS. 12 and 13, for example, the RGB drive line LD1 connecting the RGB pixel drive circuit 102A and the transfer gate 11 of the RGB pixel 10, the reset transistor 12, and the selection transistor 14, and the IR drive line LD2 connecting the IR pixel drive circuit 102B and the transfer transistor 21 of the IR pixel 20, the reset transistor 22, the selection transistor 24, and the discharge transistor 25, may be wired so as to be straight to each other. However, wiring is not limited thereto, and the RGB drive line LD1 and the IR drive line LD2 may be wired in parallel to each other. In this case, the RGB pixel drive circuit 102A and the IR pixel drive circuit 102B may supply various control signals to the pixel array section 101 from the same side or from different sides.

1.11 Stacked Structure Example of Image Sensor

FIG. 14 is a diagram depicting a stacked structure example of the image sensor according to the first embodiment. As depicted in FIG. 14, the image sensor 100 has a structure in which a pixel chip 140 and a circuit chip 150 are vertically stacked. The pixel chip 140 is, for example, a semiconductor chip including the pixel array section 101 which is an array of the unit pixels 110 including RGB pixels 10 and IR pixels 20. The circuit chip 150 is, for example, a semiconductor chip including an array of the pixel circuits depicted in FIG. 5.

For example, the pixel chip 140 and the circuit chip 150 can be bonded to each other by using direct bonding in which the bonding surfaces of the chips are planarized and then the chips are bonded to each other by an electronic force. However, the bonding method is not limited thereto, and for example, it is also allowable to use other bonding methods such as Cu—Cu bonding in which copper (Cu) electrode pads formed on the bonding surfaces are bonded to each other, or bump bonding.

In addition, the pixel chip 140 and the circuit chip 150 are electrically connected via a connecting portion such as a through-silicon via (TSV) penetrating the semiconductor substrate, for example. The connection using the TSV is implemented by adopting a method such as a twin TSV method in which two TSVs, that is, a TSV provided in the pixel chip 140 and a TSV provided from the pixel chip 140 to the circuit chip 150 are connected to each other on an outer surface of the chip, or a shared TSV method in which both chips are connected by a TSV penetrating from the pixel chip 140 to the circuit chip 150, for example.

Note that, in a case where the pixel chip 140 and the circuit chip 150 are bonded to each other by using Cu—Cu bonding or bump bonding, the chips are electrically connected via a Cu—Cu bonding portion or a bump bonding portion.

1.12 Recognition Operation Example

Next, an example of a recognition operation executed by the electronic device 1 according to the present embodiment will be described. Here, a recognition operation example will be described using the recognition system depicted in FIG. 2. However, as described above, the recognition operation may be implemented so as to be completed in the image sensor 100, may be implemented by processing the image data acquired by the image sensor 100 in the processor 4, or may be implemented by executing a part of the processing in the image sensor 100 on the image data acquired by the image sensor 100 and executing the rest in the processor 4.

FIG. 15 is a flowchart depicting an example of a recognition operation according to the first embodiment. As depicted in FIG. 15, in the present operation, first, the RGB sensor section 71 drives the RGB pixels 10 to acquire RGB image data (step S101), and the IR sensor section 73 drives the IR pixels 20 to acquire IR image data (step S102). The acquired RGB image data and IR image data are respectively subjected to predetermined processing in the RGB image processing section 72 and the IR image processing section 74, and then input to the recognition processing section 75. Note that, in step S102, in a case where ROI information is input from the RGB image processing section 72 to the IR sensor section 73 or the IR image processing section 74, RGB image data and/or IR image data of the region corresponding to the ROI information may be input to the recognition processing section 75.

Next, using the input RGB image data, the recognition processing section 75 executes recognition processing (first recognition processing) of an object existing within the angle of view of the image sensor 100 (step S103). The first recognition processing may be implemented by using recognition processing such as pattern recognition and recognition processing by artificial intelligence.

Next, using the input IR image data and the result of the first recognition processing, the recognition processing section 75 executes recognition processing (second recognition processing) for more accurately recognizing an object present within the angle of view of the image sensor 100 (step S104). Similarly to the first recognition processing, the second recognition processing may be implemented by using recognition processing such as pattern recognition and recognition processing by artificial intelligence.

Next, the recognition processing section 75 outputs the result of the second recognition processing obtained in step S104 to the outside via the interface section 76, for example (step S105). The recognition processing section 75 may execute a part of the first recognition processing and output the result (intermediate data or the like) to the outside, or may execute a part of the second recognition processing and output the result (intermediate data or the like).

Thereafter, the recognition system determines whether or not to finish the present operation (step S106). When the determination is not to finish (NO in step S106), the recognition system returns to step S101. In contrast, when having determined to finish the present operation (YES in step S106), the recognition system finishes the present operation.

1.13 Action and Effects

As described above, according to the first embodiment, since it is possible to acquire a plurality of pieces of sensor information, namely, the RGB image acquired by the RGB pixels 10 and the IR image acquired by the IR pixels 20, leading to improvement of the accuracy of recognition processing using these pieces of sensor information. For example, as described above, by acquiring IR image data in addition to RGB image data, it is possible to more accurately determine unauthorized access such as identity theft using a photograph in face authentication. This makes it possible to realize a solid-state imaging device and a recognition system capable of achieving more secure authentication.

Further, the present embodiment makes it also possible to further improve the accuracy of the recognition processing by executing multi-stage recognition processing using a plurality of pieces of sensor information. This makes it possible to realize a solid-state imaging device and a recognition system capable of achieving still more secure authentication.

2. Second Embodiment

Next, a second embodiment will be described in detail with reference to the drawings. In the following description, the configurations similar to those of the above-described embodiments will be cited, thereby omitting redundant description.

The first embodiment described above is an exemplary case where one IR pixel 20 is associated with one RGB pixel 10. In contrast, the second embodiment will describe an exemplary case where a plurality of RGB pixels 10 is associated with one IR pixel 20.

2.1 Configuration Example of Unit Pixel

First, a configuration example of a unit pixel 210 according to the present embodiment will be described. Similarly to the first embodiment, the following is an exemplary case where the unit pixel 210 includes an RGB pixel for acquiring an RGB image of three primary colors of RGB and an IR pixel for acquiring an IR image of infrared (IR) light. Further, the RGB pixels 10 are arranged in the Bayer array, for example.

Figure 16:
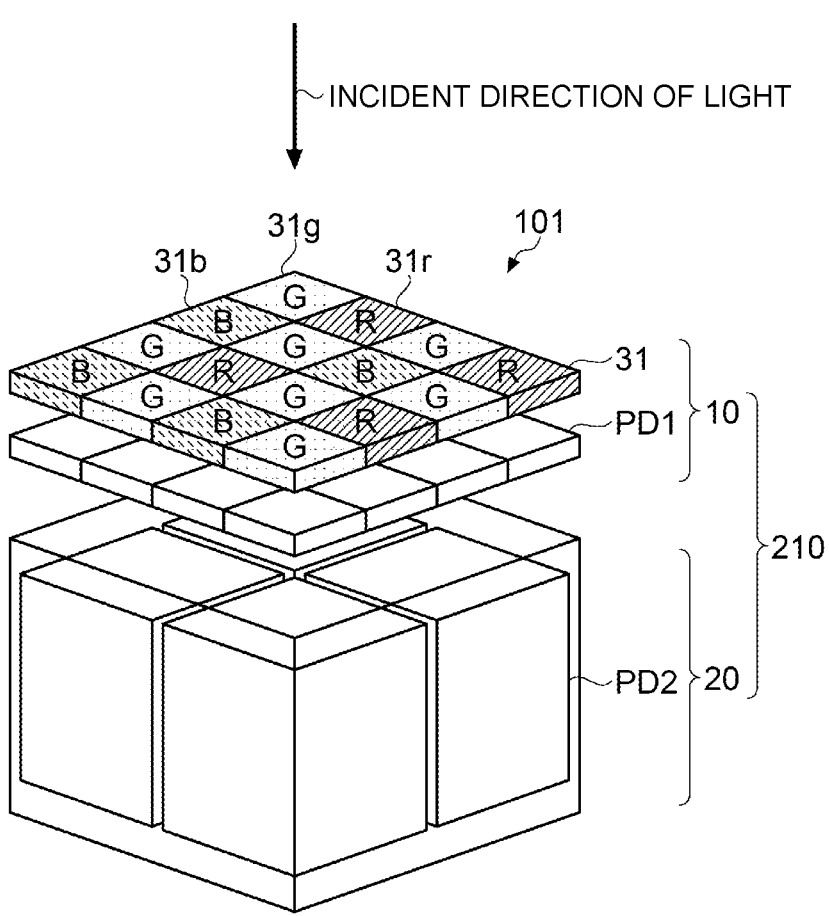
FIG. 16 is a schematic diagram depicting a schematic configuration example of a unit pixel according to a second embodiment.

FIG. 16 is a schematic diagram depicting a schematic configuration example of a unit pixel according to the second embodiment. As depicted in FIG. 16, the unit pixel 210 has a structure in which one IR pixel 20 is arranged in the light incident direction corresponding to four RGB pixels 10 arranged in a 2-row by 2-column pattern. That is, the present embodiment uses a configuration in which one IR pixel 20 is positioned for four RGB pixels 10 in a direction perpendicular to the arrangement direction (planar direction) of the unit pixels 210, and the light transmitted through the four RGB pixels 10 positioned on the upstream side in the optical path of the incident light is to be incident on the one IR pixel 20 positioned on the downstream side of the four RGB pixels 10. Therefore, in the present embodiment, the optical axis of the incident light on the unit array in the Bayer array including the four RGB pixels 10 and the optical axis of incident light on the IR pixel 20 are totally or substantially aligned with each other.

2.2 Circuit Configuration Example of Unit Pixel

Figure 17:
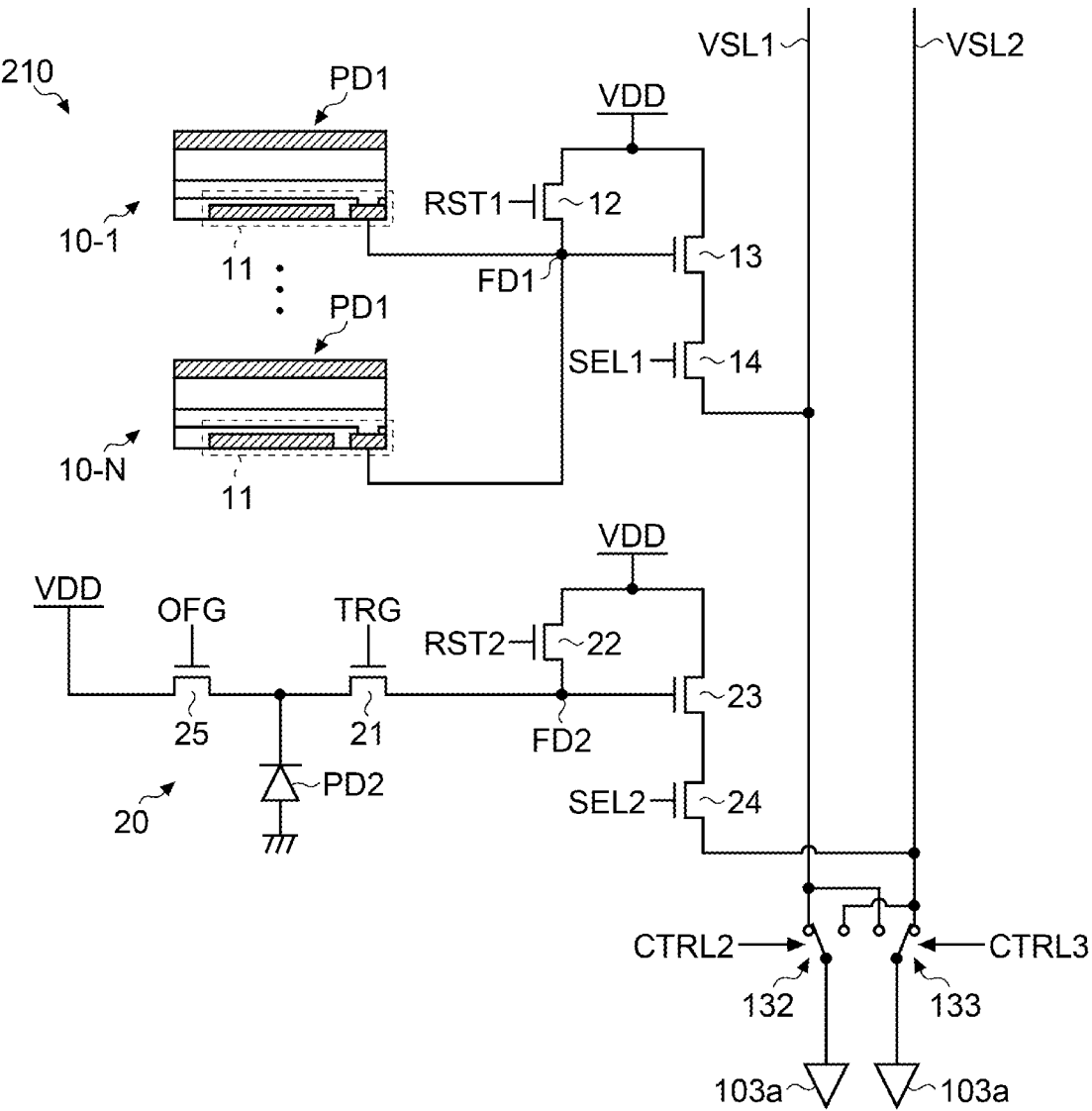
FIG. 17 is a circuit diagram depicting a schematic configuration example of a unit pixel according to the second embodiment.

FIG. 17 is a circuit diagram depicting a schematic configuration example of a unit pixel according to the second embodiment. FIG. 17 is based on the unit pixel 110-2 according to the second modification described in the first embodiment with reference to FIG. 8. However, the configuration is not limited thereto, and may be based on any of the unit pixels 110 to 110-3.

As depicted in FIG. 17, the unit pixel 210 includes a plurality of RGB pixels 10-1 to 10-N (In FIG. 17, N is 4) and one IR pixel 20. When one unit pixel 210 includes a plurality of RGB pixels 10 in this manner, as in the third modification described with reference to FIG. 9 in the first embodiment, one pixel circuit (reset transistor 12, floating diffusion region FD1, amplification transistor 13, and selection transistor 14) can be shared by the plurality of RGB pixels 10 (pixel sharing). Accordingly, in the present embodiment, the plurality of RGB pixels 10-1 to 10-N share a pixel circuit including the reset transistor 12, the floating diffusion region FD1, the amplification transistor 13, and the selection transistor 14. That is, in the present embodiment, the plurality of photoelectric conversion sections PD1 and the transfer gates 11 are connected to the common floating diffusion region FD1.

2.3 Cross-Sectional Structure Example of Unit Pixel

Figure 18:
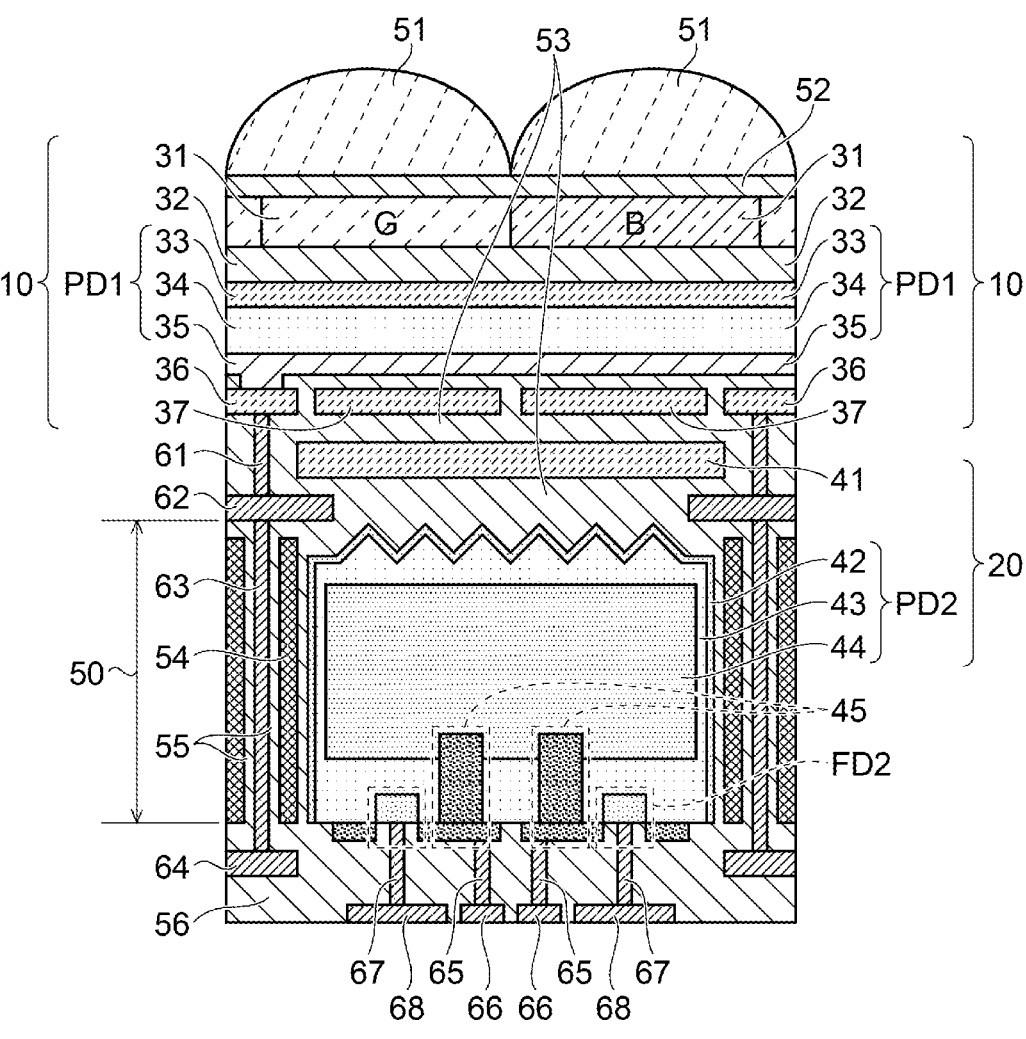
FIG. 18 is a cross-sectional view depicting a cross-sectional structure example of an image sensor according to the second embodiment.

FIG. 18 is a cross-sectional view depicting a cross-sectional structure example of an image sensor according to the second embodiment. Similarly to FIG. 16, the present description will give an exemplary case where each unit pixel 210 includes four RGB pixels 10 arranged in a 2-row by 2-column pattern and one IR pixel 20. Further, similarly to FIG. 10, the following will describe an example of a cross-sectional structure of a semiconductor chip in which the photoelectric conversion sections PD1 and PD2 in the unit pixel 210 are formed. Further, in the following description, the structures similar to the cross-sectional structure of the image sensor 100 described with reference to FIG. 10 in the first embodiment will be described with citation without redundant description.

As depicted in FIG. 18, the present embodiment has a cross-sectional structure similar to the cross-sectional structure depicted in FIG. 10, in which the on-chip lens 51, the color filter 31, and the storage electrode 37 are divided into four in a 2-row by 2-column pattern (note that two out of the four are depicted in FIG. 18), leading to the formation of four RGB pixels 10. The four RGB pixels 10 in each unit pixel 210 may form a basic array in a pattern of the Bayer array.

2.4 Planar Structure Example

Figure 19:
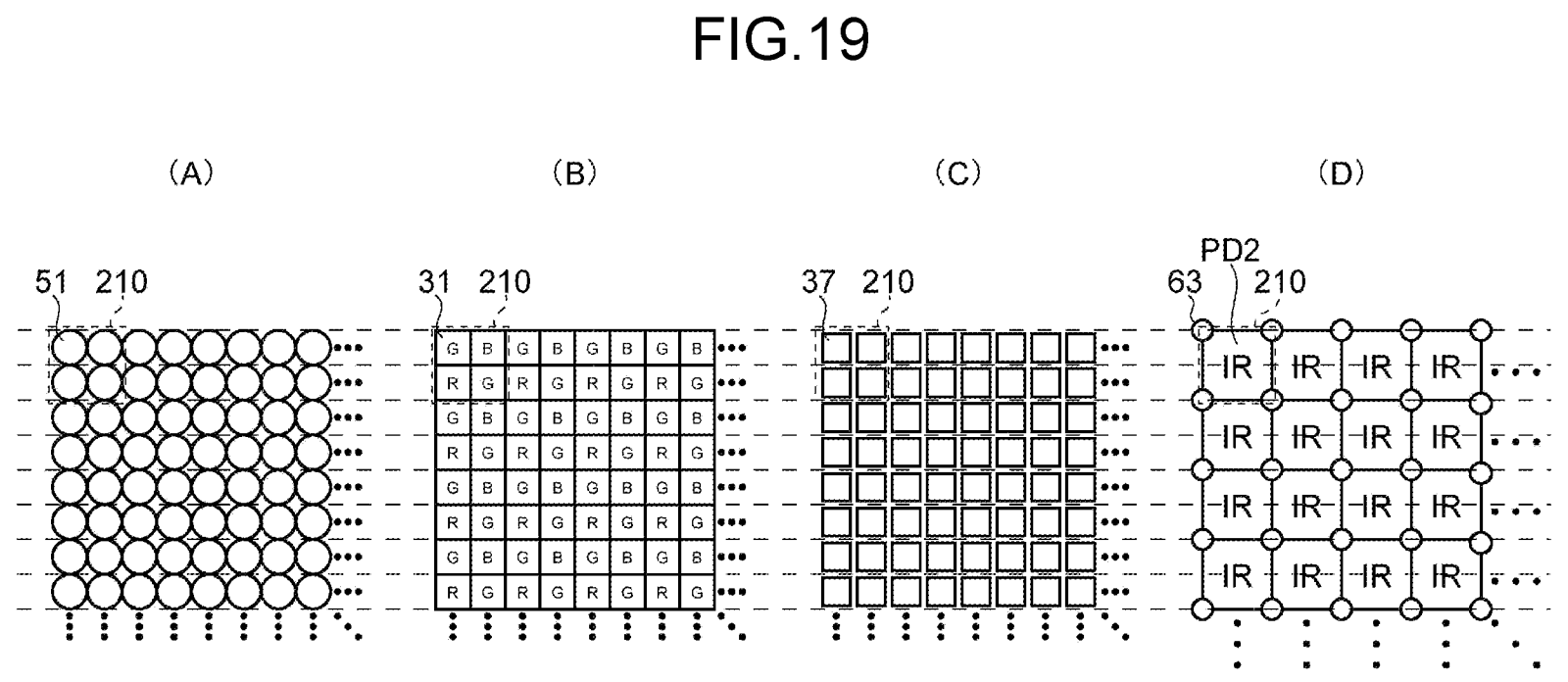

FIG. 19 is a diagram depicting a planar layout example of each layer of the pixel array section according to the second embodiment, in which (A) depicts a planar layout example of the on-chip lens 51, (B) depicts a planar layout example of the color filter 31, (C) depicts a planar layout example of the storage electrode 37, and (D) depicts a planar layout example of the photoelectric conversion section PD2. In FIG. 19, (A) to (D) depict planar layout examples of surfaces parallel to the element formation surface of the semiconductor substrate 50.

As depicted in (A) to (D) of FIG. 19, the present embodiment uses a configuration in which four on-chip lenses 51, four color filters 31, four storage electrodes 37, and one photoelectric conversion section PD2 are provided for one unit pixel 210. In the present description, one storage electrode 37 corresponds to one RGB pixel 10, while one photoelectric conversion section PD2 corresponds to one IR pixel 20.

In this manner, by arranging the basic array in a pattern of the Bayer array including four RGB pixels 10, and one IR pixel 20, in the traveling direction of the incident light in one unit pixel 110, it is possible to improve the coaxiality of the individual RGB pixels 10 and the IR pixel 20 with respect to the incident light, leading to suppression of the spatial shift occurring between the RGB image and the IR image. This makes it possible to improve the accuracy of results obtained by integrally processing information (RGB images and IR images) acquired by different sensors.

2.5 Modification of On-Chip Lens

Figure 20:
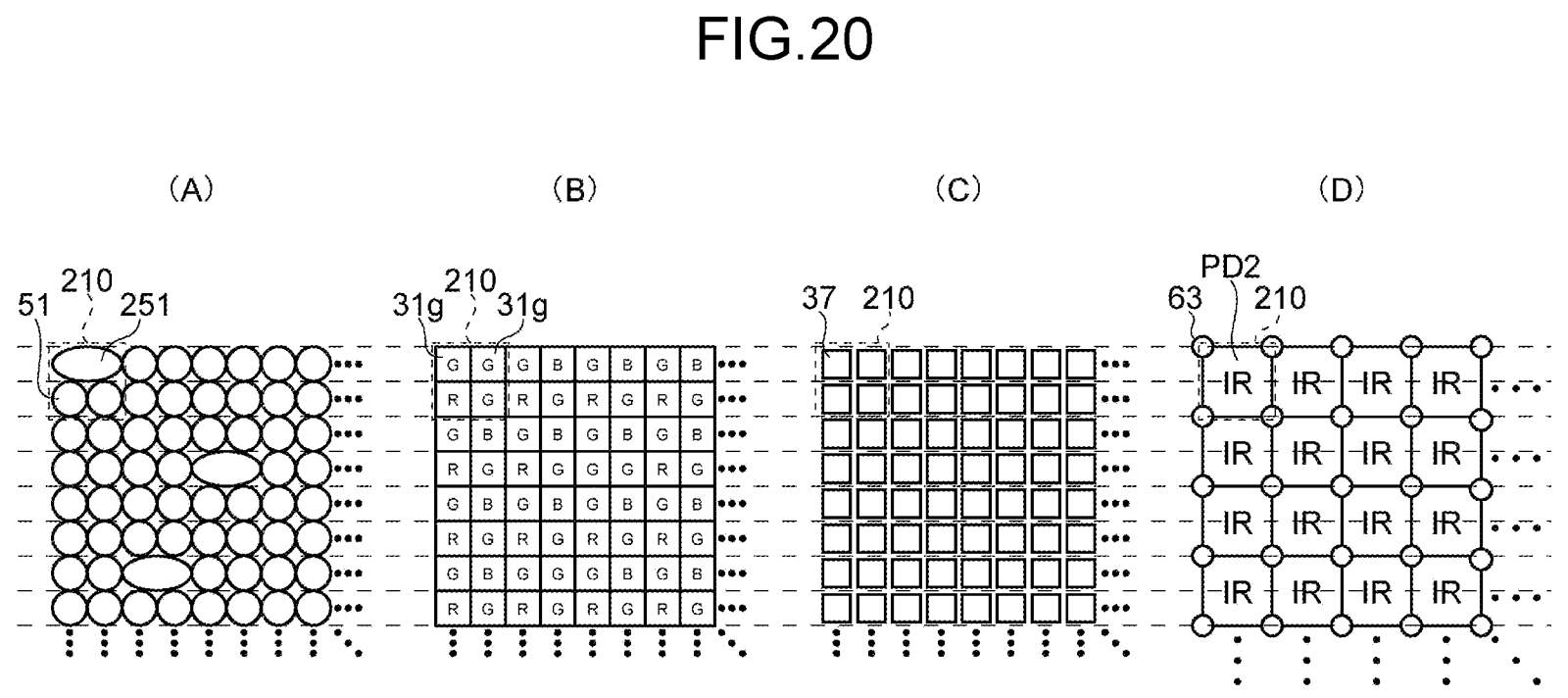

Although the second embodiment described above is an exemplary case where one on-chip lens 51 is provided for one RGB pixel 10, the configuration is not limited thereto, and one on-chip lens may be provided for a plurality of RGB pixels 10. FIG. 20 is a diagram depicting a planar layout example of each layer of the pixel array section according to a modification of the on-chip lens of the second embodiment. Similarly to FIG. 19, (A) depicts a planar layout example of the on-chip lens 51, (B) depicts a planar layout example of the color filter 31, (C) depicts a planar layout example of the storage electrode 37, and (D) depicts a planar layout example of the photoelectric conversion section PD2.

In the modification of the on-chip lens depicted in FIG. 20, as depicted in (A), the two on-chip lenses 51 arrayed in the row direction in some unit pixels 210 among the plurality of unit pixels 210 are replaced with one on-chip lens 251 of 2×1 pixels which extends across two RGB pixels 10. Further, as depicted in (B) of FIG. 20, the two RGB pixels 10 sharing the on-chip lens 251 are provided with color filters 31 that selectively transmit a same wavelength component. In the upper left unit pixel 210 in the example depicted in (B) of FIG. 20, the color filter 31*b* that is supposed to selectively transmit the blue (B) wavelength component in the Bayer array has been replaced with the color filter 31*g* that selectively transmits the green (G) wavelength component. With this replacement, the color filters 31 of the two RGB pixels 10 sharing the on-chip lens 251 are unified to the color filter 31*g*.

Note that, for the RGB pixels 10 in which the color filters 31 are replaced in this manner, the pixel values of the wavelength components to be detected according to the Bayer array may be interpolated from the pixel values of surrounding pixels, for example. The pixel interpolation may be performed by using various methods such as linear interpolation.

Further, the modification of the on-chip lens is represented by a case where the two on-chip lenses 51 disposed in the row direction are unified. However, the configuration is not limited thereto, and it is allowable to have various modifications such as a configuration in which the two on-chip lenses 51 disposed in the column direction are unified, or a configuration in which all of the four on-chip lenses 51 included in one unit pixel 210 are replaced with one on-chip lens. In that case, a color filter 31 that selectively transmits the same wavelength component may be used as the color filter 31 of the RGB pixels 10 that share the on-chip lens.

Further, the sharing of the on-chip lens 51 between the adjacent RGB pixels 10 is not limited to the second embodiment, and can also be applied to the first embodiment.

2.6 Modification of Color Filter Array

Although the above-described embodiment and the modifications uses the Bayer array as the filter array of the color filter 31, the filter array pattern is not limited thereto. For example, it is allowable to use various filter arrays such as a color filter array of 3×3 pixels adopted in an X-Trans (registered trademark) CMOS sensor, a quad Bayer array of 4×4 pixels (also referred to as a quadra-array), and a color filter array of 4×4 pixels in which a white RGB color filter is combined with a Bayer array (also referred to as a white RGB array).

Figure 21:
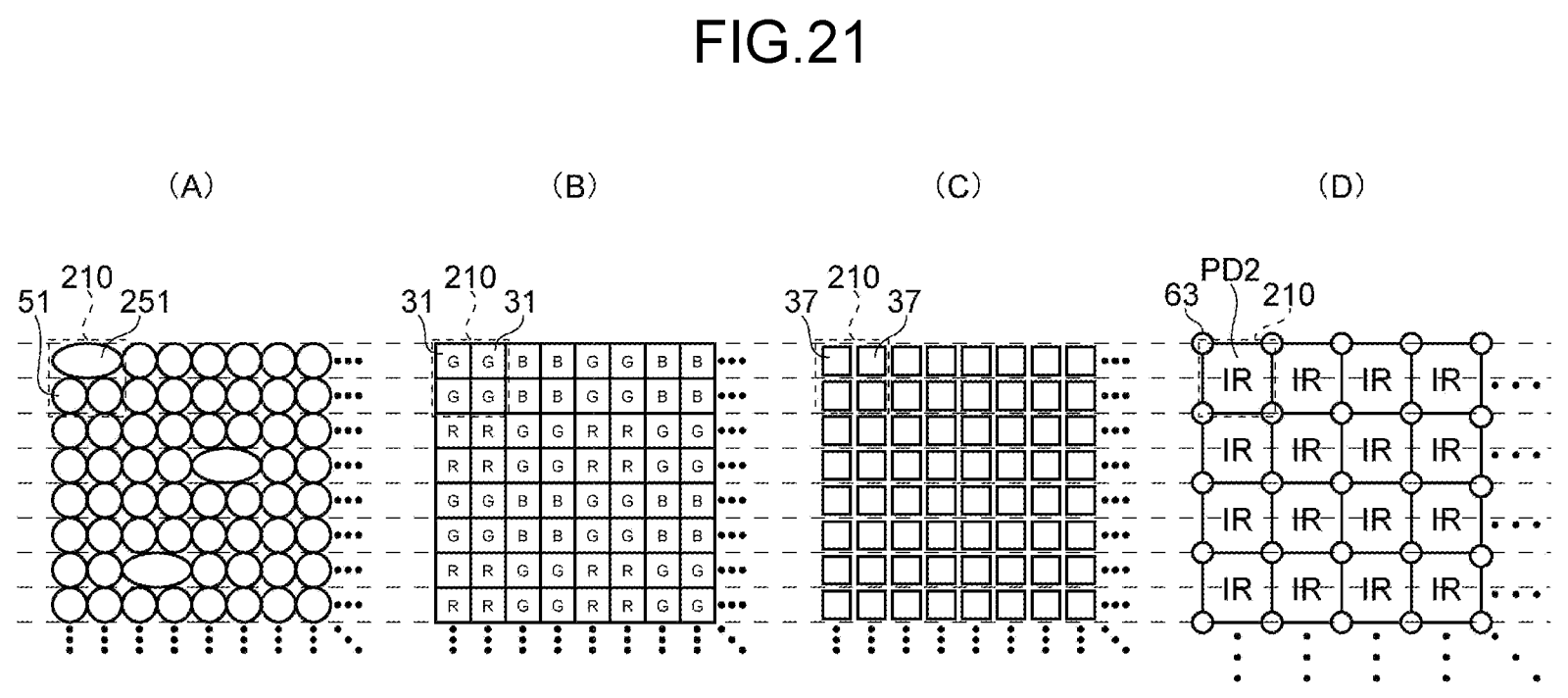

FIG. 21 is a diagram depicting a planar layout example of each layer of the pixel array section according to a modification of the color filter array of the second embodiment. Similarly to FIGS. 19 and 20, (A) depicts a planar layout example of the on-chip lens 51, (B) depicts a planar layout example of the color filter 31, (C) depicts a planar layout example of the storage electrode 37, and (D) depicts a planar layout example of the photoelectric conversion section PD2.

As depicted in (B), the modification of the color filter array depicted in FIG. 21 uses a quadra-array of 4×4 pixels in total, as the color filter array, in which each color filter 31 in the Bayer array of 2×2 pixels is divided into 2×2 pixels. In such a quadra-array, as depicted in (A) of FIG. 21, even when the on-chip lens 51 is shared by two adjacent RGB pixels 10, the same color filters 31 are disposed adjacent to each other in these RGB pixels 10 as depicted in (B). This eliminates the need to change the array of the color filters 31, and thus, there is no need to perform pixel interpolation.

2.7 Action and Effects

As described above, according to the second embodiment, four photoelectric conversion sections PD1 of four RGB pixels 10 and one photoelectric conversion section PD2 of one IR pixel 20 are arranged in the light incident direction.

Even with such a configuration, similarly to the first embodiment, it is possible to acquire a plurality of pieces of sensor information of the RGB image and the IR image, making it is possible to improve accuracy of recognition processing using these pieces of sensor information. This makes it possible to realize a solid-state imaging device and a recognition system capable of achieving more secure authentication.

Further, similarly to the first embodiment, by executing multi-stage recognition processing using a plurality of pieces of sensor information, accuracy of the recognition processing can be further improved, leading to achievement of implementation of a solid-state imaging device and a recognition system capable of achieving more secure authentication.

Since other configurations, operations, and effects may be similar to those in the above-described embodiment, detailed description thereof will be omitted here.

3. Third Embodiment

Next, a third embodiment will be described in detail with reference to the drawings. In the following description, the configurations similar to those of the above-described embodiments will be cited, thereby omitting redundant description.

The first and second embodiments described above is an example of the solid-state imaging device and the recognition system capable of achieving more secure authentication by combining the RGB sensor section 71 that acquires an RGB image and the IR sensor section 73 that acquires an IR image. In contrast, the third embodiment will give an example of a solid-state imaging device and a recognition system capable of achieving more secure authentication by combining an RGB sensor section 71 that acquires an RGB image and a distance measurement sensor section that acquires a depth image.

In the following description, an indirect time-of-flight (ToF) sensor that detects a two-dimensional distance distribution to an object based on a phase when light emitted from a light source is reflected by the object and returns will be taken as an example of the distance measuring sensor. However, the distance measuring sensor is not limited thereto. For example, it is allowable to use various types of distance measuring sensor such as: a direct ToF sensor that detects a two-dimensional distance distribution to an object by measuring a time until light emitted from a light source is reflected by the object and returns; a structured light type distance measuring sensor that projects light of a predetermined pattern onto an object and detects a distance distribution to the object from distortion of the pattern; a stereo vision type distance measuring sensor that detects a distance distribution to an object using two or more images captured from different positions; and other types of distance measuring sensors such as a millimeter wave radar, laser imaging detection and ranging (LIDER), and laser detection and ranging (LADAR).

3.1 Functional Configuration Example of Recognition System

Figure 22:
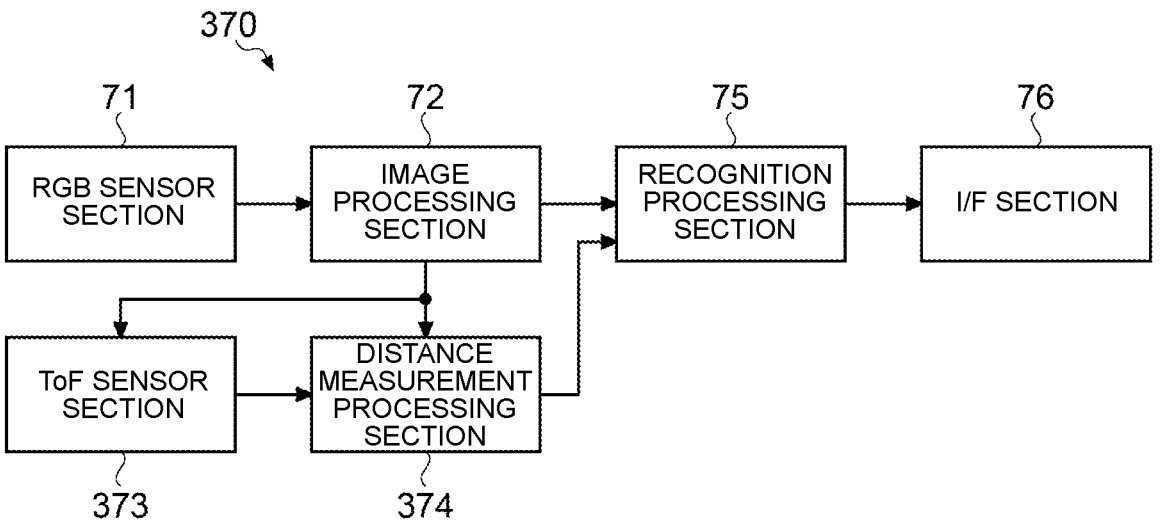
FIG. 22 is a block diagram depicting a functional configuration example of a recognition system according to a third embodiment.

First, a functional configuration example of the recognition system according to the present embodiment will be described. FIG. 22 is a block diagram depicting a functional configuration example of a recognition system according to a third embodiment. As depicted in FIG. 22, a recognition system 370 includes two types of sensor sections, namely, an RGB sensor section 71 and a ToF sensor section 373. The recognition system 370 further includes an RGB image processing section 72, a distance measurement processing section 374, a recognition processing section 75, and an interface (I/F) section 76.

The RGB sensor section 71, the RGB image processing section 72, the recognition processing section 75, and the interface section 76 may be similar to those exemplified in the first embodiment.

The ToF sensor section 373 includes a light source and a light receiving section (corresponding to an image sensor), for example and detects light emitted from the light source, reflected by an object, and returned. The light source uses a laser light source such as a vertical cavity surface emitting laser (VCSEL), for example, which will be described below. Further, the light receiving section may use an image sensor in which the pixel circuit of the IR pixel 20 in the IR sensor section 73 according to the above-described embodiment is changed to a pixel circuit for a ToF sensor, for example.

The distance measurement processing section 374 detects, for each ToF pixel, a phase of reflected light based on an emission timing of light from a light source (hereinafter, referred to as irradiation light) from the pixel signal for each ToF pixel input from the ToF sensor section 373, and generates a depth image indicating a two-dimensional distance distribution based on the detected phase for each ToF pixel.

Using the RGB image data input from the RGB image processing section 72 and/or the depth image data input from the distance measurement processing section 374, the recognition processing section 75 executes recognition processing of an object or the like existing within the angle of view of the RGB sensor section 71 and/or the ToF sensor section 373. Similarly to the first embodiment, the recognition processing by the recognition processing section 75 may be performed as recognition processing such as pattern recognition, recognition processing by AI, or the like. Further, the recognition processing section 75 may execute part of the recognition processing and output the result (intermediate data or the like).

The interface section 76 outputs a recognition result (including intermediate data and the like) obtained by the recognition processing section 75 and image data acquired by the RGB sensor section 71 and/or the ToF sensor section 373 to the external processor 4 and/or the storage section 3, for example.

The RGB image processing section 72 may execute region determination of an object on the RGB image data, and input information such as an address specifying a region of interest (ROI) (hereinafter, simply referred to as ROI information) obtained as a result of the region determination to the ToF sensor section 373 and/or the distance measurement processing section 374. The ToF sensor section 373 may operate, in response, to acquire depth image data of a region corresponding to the ROI information input from the RGB image processing section 72. Alternatively, the distance measurement processing section 374 may be configured to execute the distance measurement processing only for the ToF pixel in the region corresponding to the ROI information input from the RGB image processing section 72 on the image data including the pixel signal for each ToF pixel input from the ToF sensor section 373 (hereinafter, referred to as ToF image data).

3.2 System Configuration Example

Figure 23:
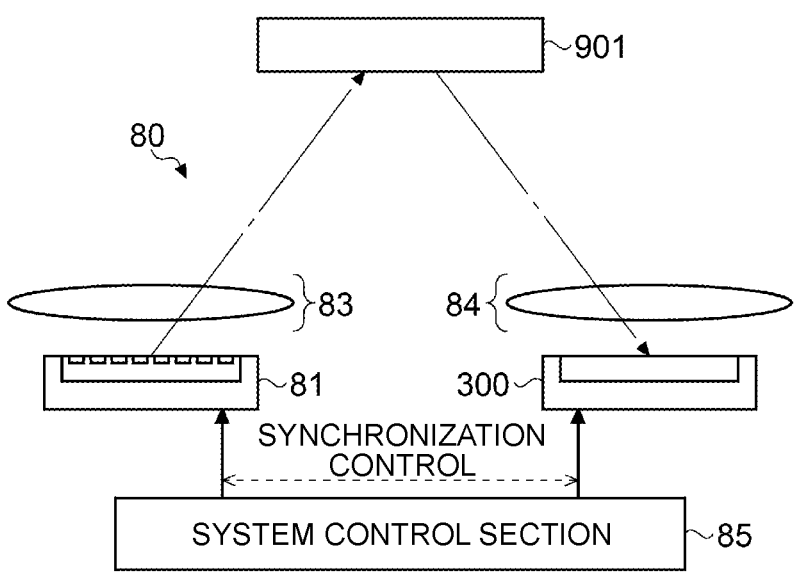
FIG. 23 is a schematic diagram depicting an example of a configuration of an electronic device that implements the recognition system according to the third embodiment.
Figure 24:
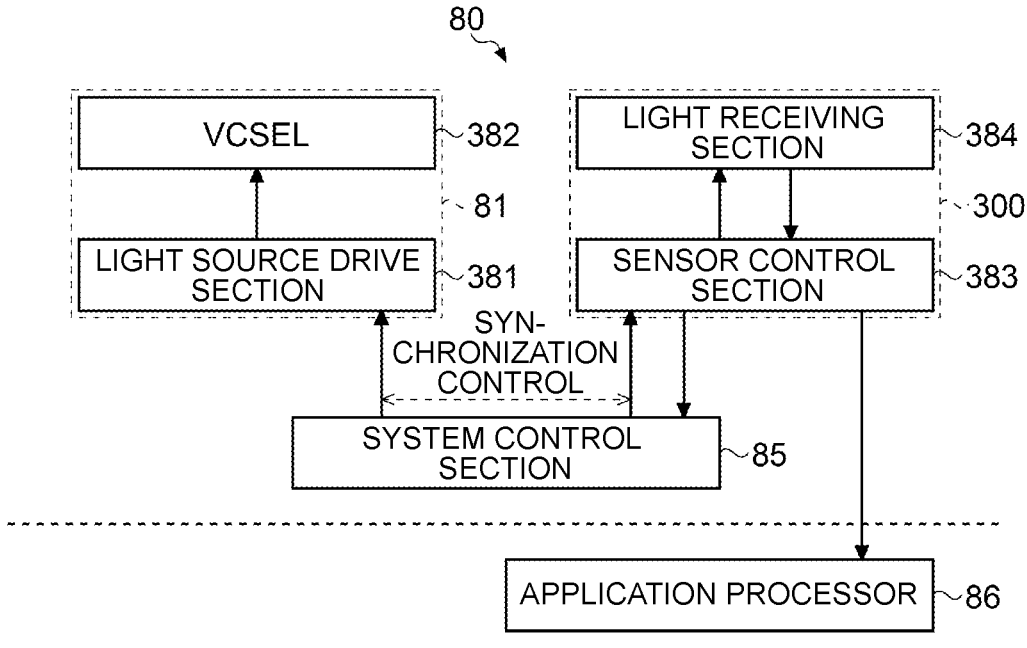
FIG. 24 is a block diagram depicting an example of a configuration of an electronic device that implements the recognition system according to the third embodiment.

Next, a system configuration example of the recognition system according to the present embodiment will be described. FIG. 23 is a schematic diagram depicting an example of a configuration of an electronic device that implements the recognition system according to the third embodiment; FIG. 24 is a block diagram depicting an example of a configuration of an electronic device that implements the recognition system according to the third embodiment.

As depicted in FIG. 23, an electronic device 80 according to the present embodiment includes a laser light source 81, a projection lens 83, an imaging lens 84, an image sensor 300, and a system control section 85.

As depicted in FIG. 24, the laser light source 81 includes, for example, a vertical cavity surface emitting laser (VCSEL) 382 and a light source drive section 381 that drives the VCSEL 382. However, the type of light source is not limited to the VCSEL 382, and various light sources such as a light emitting diode (LED) may be used. Further, the laser light source 81 may be any of a point light source, a surface light source, and a line light source. In the case of a surface light source or a line light source, the laser light source 81 may have a configuration in which a plurality of point light sources (for example, VCSELs) is arranged one-dimensionally or two-dimensionally, for example.

In the present embodiment, the laser light source 81 may emit light of a wavelength band different from the detection wavelength band of the RGB pixels 10 in the image sensor 300, such as IR light, for example.

The projection lens 83 is disposed on an emission surface side of laser light source 81, and converts light emitted from the laser light source 81 into irradiation light having a predetermined divergence angle.

The imaging lens 84 is disposed on the light receiving surface side of the image sensor 300, and forms an image based on the incident light (including reflected light of irradiation light) on the light receiving surface of the image sensor 300.

As depicted in FIG. 24, the image sensor 300 includes, for example, a light receiving section 384 and a sensor control section 383 that drives the light receiving section 384 to read RGB image data and ToF image data, and details of which will be described below.

For example, the system control section 85 includes a processor (CPU) and drives the VCSEL 382 via the light source drive section 381. Further, the system control section 85 acquires RGB image data by controlling the image sensor 300. Along with this, by controlling the image sensor 300 in synchronization with control on the laser light source 81, the system control section 85 acquires ToF image data corresponding to the light emission of the laser light source 81.

In such a configuration, the irradiation light emitted from the laser light source 81 is projected onto a subject (also referred to as a measurement target or an object) 901 through the projection lens 83. The projected light is reflected by the subject 901. Then, the light reflected by the subject 901 is incident on the image sensor 300 through the imaging lens 84. The ToF sensor section 373 in the image sensor 300 receives the reflected light, namely, the light reflected by the subject 901, and generates ToF image data. On the other hand, the RGB sensor section 71 in the image sensor 300 receives, for example, visible light in the incident light and generates RGB image data. The RGB image data and the ToF image data generated by the image sensor 300 are supplied to an application processor 86 of the electronic device 80. The application processor 86 executes predetermined processing such as recognition processing on the RGB image data and the ToF image data input from the image sensor 300.

3.3 Configuration Example of Image Sensor

Next, a configuration example of the image sensor 300 according to the present embodiment will be described. FIG.

25 is a block diagram depicting a schematic configuration example of the image sensor according to the third embodiment.

The image sensor 300 according to the present embodiment has, for example, a configuration similar to the image sensor 100 according to the first embodiment, in which the configuration corresponding to the IR sensor section 73 is replaced with a configuration corresponding to the ToF sensor section 373. Specifically, the unit pixel 110 is replaced with a unit pixel 310, the IR pixel drive circuit 102B is replaced with a ToF pixel drive circuit 302B, the IR signal processing circuit 103B is replaced with a ToF signal processing circuit 303B, and the IR data processing section 108B is replaced with a ToF data processing section 308B, for example.

The pixel array section 101, the ToF pixel drive circuit 302B, the ToF signal processing circuit 303B, the column drive circuit 104, and the system control circuit 105 constitute the ToF sensor section 373 in FIG. 22, for example. Further, the ToF signal processing circuit 303B and the ToF data processing section 308B constitute the distance measurement processing section 374 in FIG. 22, for example. The recognition processing section 75 in FIG. 22 may be implemented by the application processor 86 alone, may be implemented by using the RGB data processing section 108A and the ToF data processing section 308B in cooperation with the application processor 86, or may be implemented by using the RGB data processing section 108A and the ToF data processing section 308B in cooperation with each other.

Each unit pixel 310 includes an RGB pixel 10 and a ToF pixel 320. Each ToF pixel 320 includes a photoelectric conversion section that generates and accumulates a charge according to the amount of received light, and generates a pixel signal of a voltage according to the amount of incident light.

In the present embodiment, one end of the pixel drive line LD2 is connected to an output end corresponding to each row of the ToF pixel drive circuit 302B, and transmits a control signal for performing driving at the time of readout of the pixel signal from the ToF pixel 320.

Similarly to the RGB pixel drive circuit 102A, the ToF pixel drive circuit 302B includes a shift register, an address decoder, and the like, and drives each pixel of the pixel array section 101 simultaneously for all pixels or row by row. That is, the ToF pixel drive circuit 302B configures a drive section that controls the operation of each ToF pixel 320 of the pixel array section 101, in cooperation with the system control circuit 105 that controls the ToF pixel drive circuit 302B. Further, similarly to the RGB pixel drive circuit 102A, the ToF pixel drive circuit 302B may include two scan systems, namely, a readout scan system and a sweep-out scan system.

The pixel signal output from each ToF pixel 320 of the pixel row selectively scanned by the ToF pixel drive circuit 302B is input to the ToF signal processing circuit 303B through each of the vertical signal lines VSL2 and VSL4 for each pixel column. For example, a pixel signal based on a charge read out from one readout terminal (also referred to as TapA) in the ToF pixel 320 appears in the vertical signal line VSL2, and for example, a pixel signal based on a charge read out from the other readout terminal (also referred to as TapB) in the ToF pixel 320 appears in the vertical signal line VSL4. The ToF signal processing circuit 303B performs predetermined signal processing on the pixel signal output from each ToF pixel 320 of the selected row through the vertical signal line VSL2 or VSL4 for each of the pixel columns of the pixel array section 101, and temporarily holds the pixel signal after the signal processing.

Similarly to the RGB signal processing circuit 103A, the ToF signal processing circuit 303B may execute noise removal processing on the pixel signal, for example, correlated double sampling (CDS) processing, and double data sampling (DDS) processing. Further, similarly to the RGB signal processing circuit 103A, the ToF signal processing circuit 303B includes an AD conversion function, for example, and converts an analog pixel signal read out from the photoelectric conversion section into a digital signal and outputs the obtained digital signal.

Based on a synchronization control signal input from the system control section 85, the system control circuit 105 performs drive control of the RGB pixel drive circuit 102A, the ToF pixel drive circuit 302B, the RGB signal processing circuit 103A, the ToF signal processing circuit 303B, the column drive circuit 104, and the like. Accordingly, driving for acquiring RGB image data and/or ToF image data is executed in synchronization with light emission control for the laser light source 81.

The ToF data processing section 308B has an arithmetic processing function, for example, and performs various types of signal processing such as arithmetic processing on the image signal output from the ToF signal processing circuit 303B. The ToF data processing section 308B may generate a depth image indicating a two-dimensional distance distribution based on the synchronization control signal input from the system control section 85 (or the system control circuit 105) and the pixel signal read out from each ToF pixel 320 at a predetermined sampling period.

For example, the RGB image data or the ToF image data (or the depth image data) output from the RGB data processing section 108A or the ToF data processing section 308B may be subjected to predetermined processing in the application processor 86 or the like in the electronic device 80 equipped with the image sensor 300, or may be transmitted to the outside via a predetermined network.

The image sensor 300 may include a storage section for temporarily holding data necessary for signal processing in the RGB data processing section 108A and the ToF data processing section 308B, data processed by any one or more of the RGB signal processing circuit 103A, the ToF signal processing circuit 303B, the RGB data processing section 108A, and the ToF data processing section 308B, and the like.

3.3.1 Modification of Image Sensor

Figure 25:
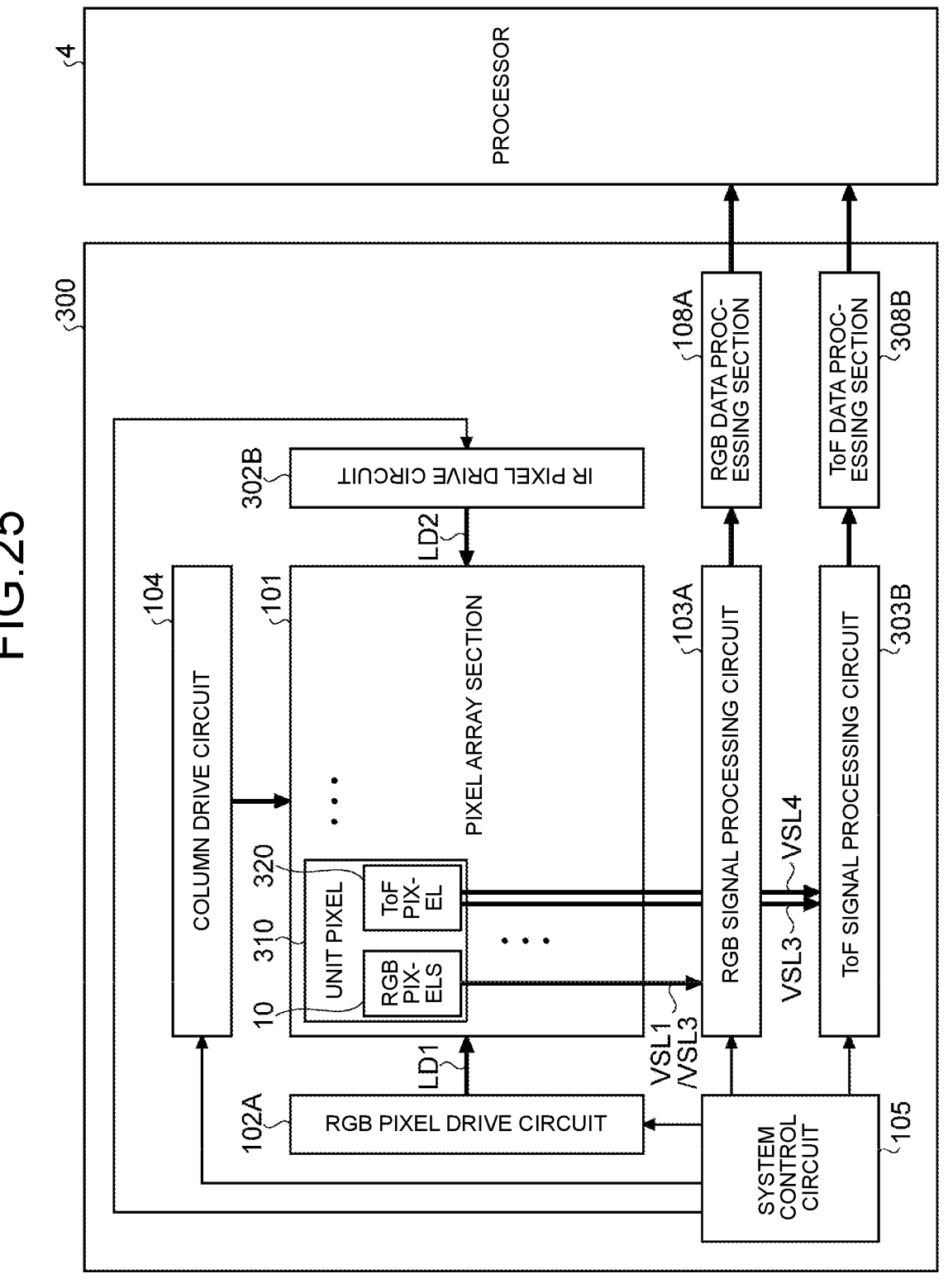
FIG. 25 is a block diagram depicting a schematic configuration example of an image sensor according to the third embodiment.
Figure 26:
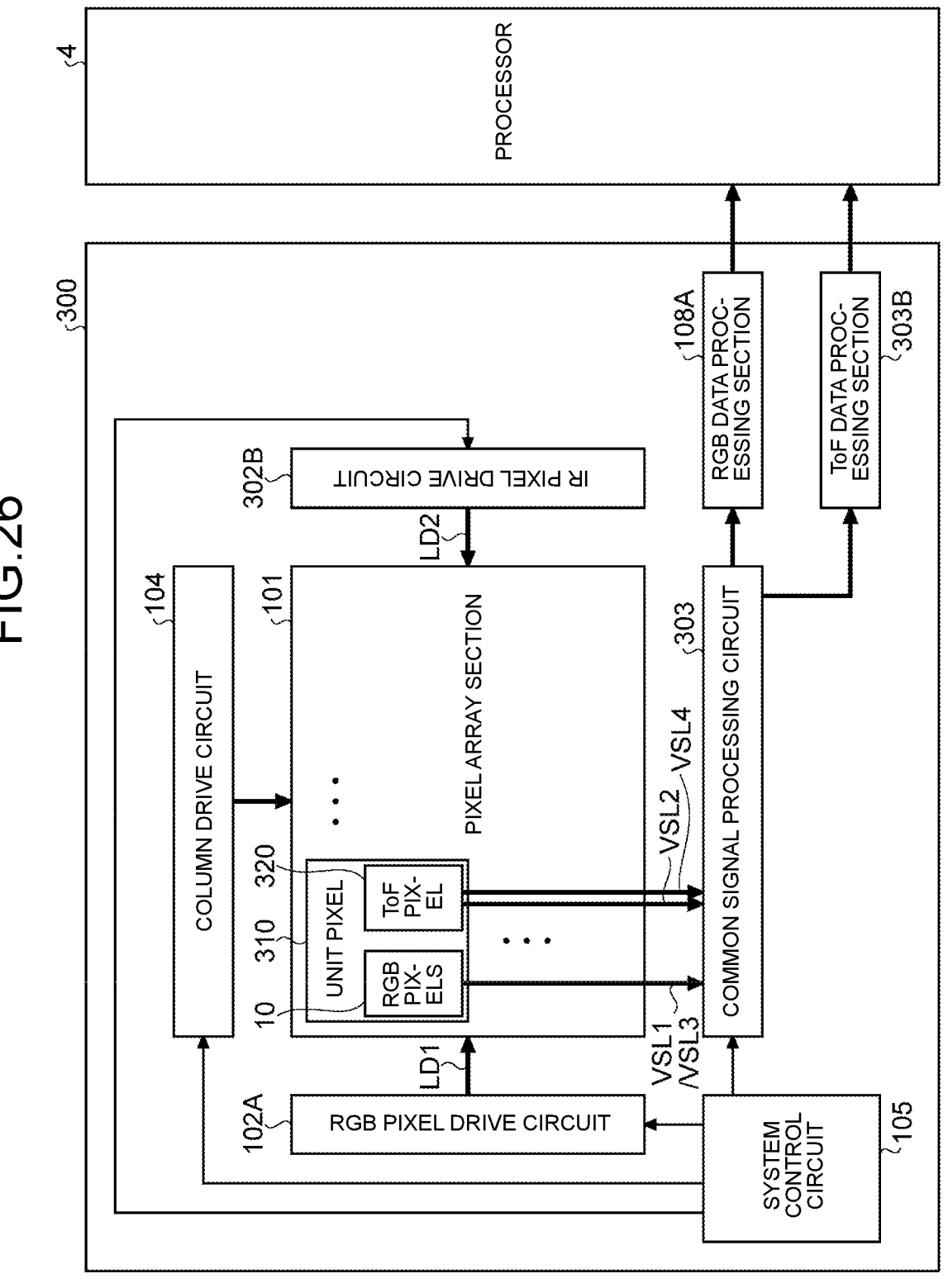
FIG. 26 is a block diagram depicting a schematic configuration example of an image sensor according to a modification of the third embodiment.

FIG. 26 is a block diagram depicting a schematic configuration example of an image sensor according to a modification of the third embodiment. FIG. 25 described above is a case where separate signal processing circuits (the RGB signal processing circuit 103A and the ToF signal processing circuit 303B) are provided for each of the RGB pixel 10 and the ToF pixel 320, respectively. However, arrangement of the signal processing circuit is not limited thereto, and it is also allowable to have a configuration as depicted in FIG. 26 where a common signal processing circuit 303 is provided for the RGB pixel 10 and the ToF pixel 320. In this case, readout of the pixel signal from the RGB pixel 10 and readout of the pixel signal from the ToF pixel 320 may be executed in time division or executed in parallel.

3.4 Configuration Example of Unit Pixel

Figure 27:
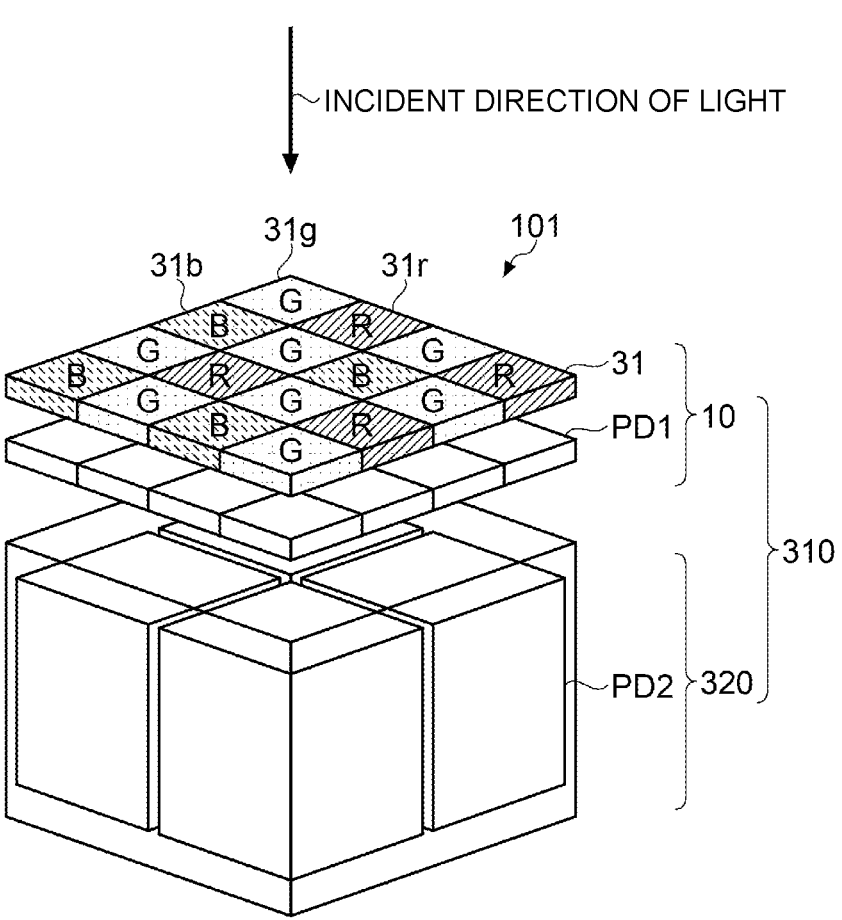
FIG. 27 is a schematic diagram depicting a schematic configuration example of a pixel array section according to the third embodiment.

Here, a configuration example of the unit pixel 310 will be described. The following is an exemplary case where the unit pixel 310 includes an RGB pixel for acquiring an RGB image of three primary colors of RGB and a ToF pixel 320 for acquiring a ToF image of infrared (IR) light. In FIG. 27 and the following description, when color filters 31r, 31g, and 31b that transmit the light of individual color components constituting the RGB three primary colors are not distinguished, the filter is depicted with a reference sign 31.

FIG. 27 is a schematic diagram depicting a schematic configuration example of a pixel array section according to the third embodiment. As depicted in FIG. 27, there is provided a configuration similar to that of the unit pixel 210 described with reference to FIG. 16 in the second embodiment, in which the IR pixel 20 is replaced with the ToF pixel 320. However, the configuration is not limited thereto, and the unit pixel 310 may have a configuration in which the IR pixel 20 is replaced with the ToF pixel 320 in a configuration similar to the unit pixel 110 described with reference to FIG. 5 in the first embodiment.

3.5 Circuit Configuration Example of Unit Pixel

Figure 28:
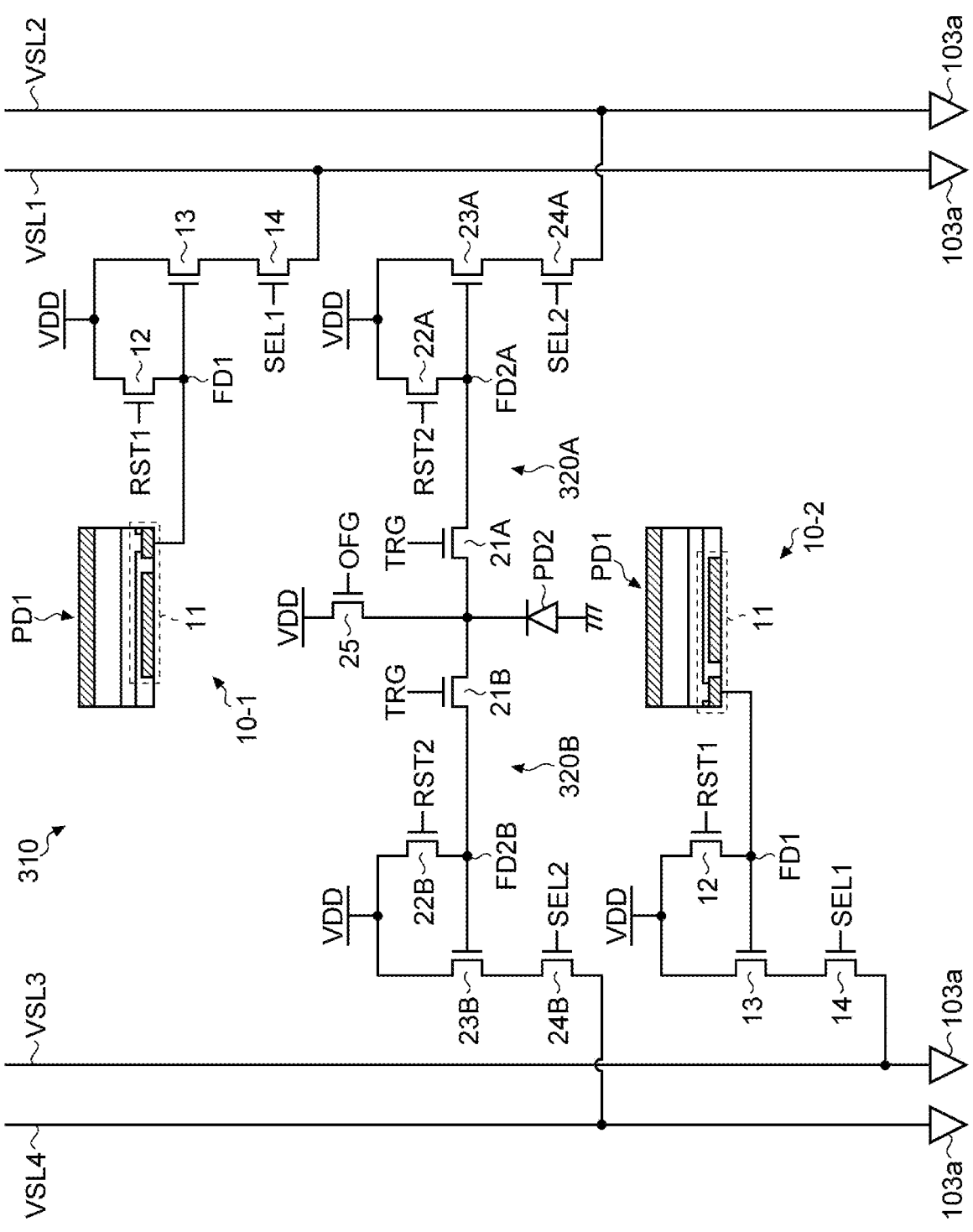
FIG. 28 is a circuit diagram depicting a schematic configuration example of a unit pixel according to the third embodiment.

FIG. 28 is a circuit diagram depicting a schematic configuration example of a unit pixel according to the third embodiment. FIG. 28 is based on the unit pixel 110 described in the first embodiment with reference to FIG. 6. However, the configuration is not limited thereto, and may be based on any of the unit pixels 110 to 110-3 or 210.

As depicted in FIG. 28, the unit pixel 310 includes two RGB pixels 10-1 and 10-2 and one ToF pixel 320.

(RGB Pixel 10)

Similarly to the RGB pixel 10 according to the first embodiment, each of the RGB pixels 10 includes a transfer gate 11, a floating diffusion region FD1, a reset transistor 12, an amplification transistor 13, and a selection transistor 14. However, the drain of the selection transistor 14 of one of the RGB pixels 10-1 is connected to the vertical signal line VSL1, while the drain of the selection transistor 14 of the other of the RGB pixels 10-2 is connected to a vertical signal line VSL3. Further, the two RGB pixels 10-1 and 10-2 may be two RGB pixels 10 adjacent in the row direction in the pixel array section 101, for example. The number of RGB pixels 10 included in one unit pixel 310 is not limited to two, and may be three or more.

(ToF Pixel 320)

The ToF pixel 320 includes, for example, a photoelectric conversion section PD2, transfer transistors 21A and 21B, floating diffusion regions FD2A and FD2B, reset transistors 22A and 22B, amplification transistors 23A and 23B, selection transistors 24A and 24B, and a discharge transistor 25. The transfer transistor 21A, the floating diffusion region FD2A, the reset transistor 22A, the amplification transistor 23A, and the selection transistor 24A are included in a pixel circuit (hereinafter, referred to as a pixel circuit 320A) for reading out charges from one tap TapA of the two taps provided in the photoelectric conversion section PD2. The transfer transistor 21B, the floating diffusion region FD2B, the reset transistor 22B, the amplification transistor 23B, and the selection transistor 24B are included in a pixel circuit (hereinafter, referred to as a pixel circuit 320B) for reading out charges from the other tap TapB of the two taps provided in the photoelectric conversion section PD2. The drain of the selection transistor 24A of the pixel circuit 320A is connected to the vertical signal line VSL2, and the drain of the selection transistor 24B of the pixel circuit 320B is connected to the vertical signal line VSL4.

The connection relationship of the floating diffusion region FD2A or FD2B, the reset transistor 22A or 22B, and the amplification transistor 23A or 23B with respect to the transfer transistor 21A or 21B may be similar to the connection relationship of the floating diffusion region FD1, the reset transistor 12, and the amplification transistor 13 with respect to the transfer gate 11 in the RGB pixel 10-1 or 10-2. Further, the connection relationship among the amplification transistor 23A or 23B, the selection transistor 24A or 24B, and the vertical signal line VSL2 or VSL4 may be similar to the connection relationship among the amplification transistor 13, the selection transistor 14, and the vertical signal line VSL1 or VSL3 in the RGB pixel 10-1 or 10-2.

The photoelectric conversion section PD2 includes two taps TapA and TapB, and releases the charge generated by photoelectric conversion from the two taps TapA and TapB in time division, and details of which will be described below. Accordingly, the pixel circuit 320A causes a pixel signal having a voltage value corresponding to the charge amount of the charge released from the tap TapA to emerge in the vertical signal line VSL2, while the pixel circuit 320B causes a pixel signal having a voltage value corresponding to the charge amount of the charge released from the tap TapB to emerge in the vertical signal line VSL4.

Similarly to the vertical signal lines VSL1 and VSL3, the vertical signal lines VSL2 and VSL4 are connected to an AD conversion circuit 103a provided for each column (that is, for each of the vertical signal lines VSL2 and VSL4) in the ToF signal processing circuit 303B.

3.6 Modification of Circuit Configuration

Next, modifications of the circuit configuration of the unit pixel 310 depicted in FIG. 28 will be described with some examples.

3.6.1 First Modification

Figure 29:
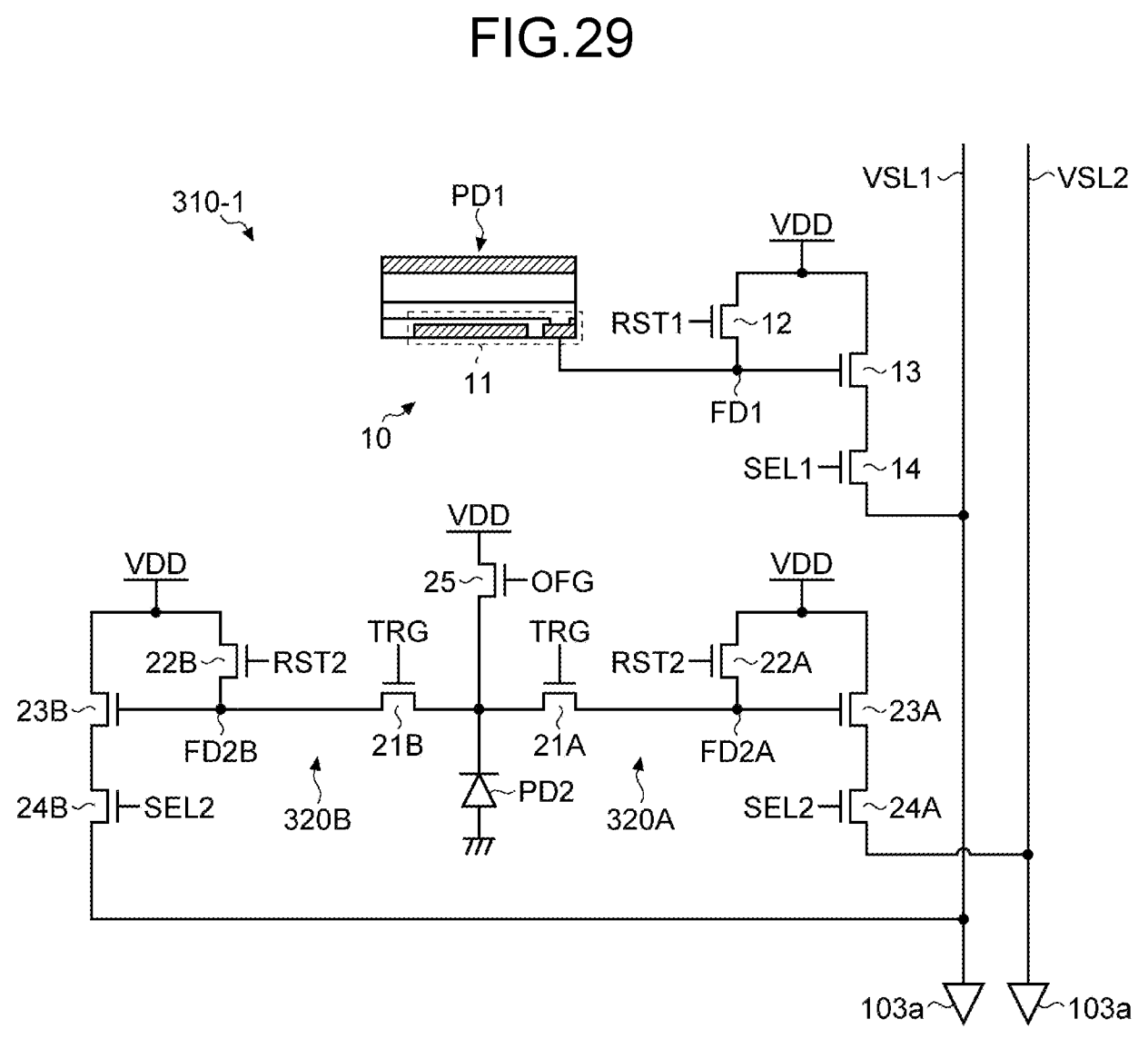

FIG. 29 is a circuit diagram depicting a schematic configuration example of a unit pixel according to a first modification of the third embodiment. As depicted in FIG. 29, a unit pixel 310-1 includes one RGB pixel 10 and one ToF pixel 320 unlike the unit pixel 310 depicted in FIG. 28. The pixel circuits of the RGB pixel 10 and the ToF pixel 320 may be similar to those described with reference to FIG. 28. However, in the first modification, the vertical signal line VSL1 is shared by the RGB pixel 10 and the pixel circuit 320B in the ToF pixel 320, whereby the vertical signal lines VSL3 and VSL4 are omitted. The AD conversion circuit 103a connected to the vertical signal line VSL1 is used for the readout of a pixel signal from the RGB pixel 10 and the readout of a pixel signal from the ToF pixel 320 in time division, for example.

Such a configuration makes it possible to reduce the number of vertical signal lines VSL and the number of AD conversion circuits 103a connected thereto. This makes it possible to reduce the circuit scale, leading to achievement of downsizing and higher resolution of the image sensor 100 due to area efficiency improvement.

3.6.2 Second Modification

Figure 30:
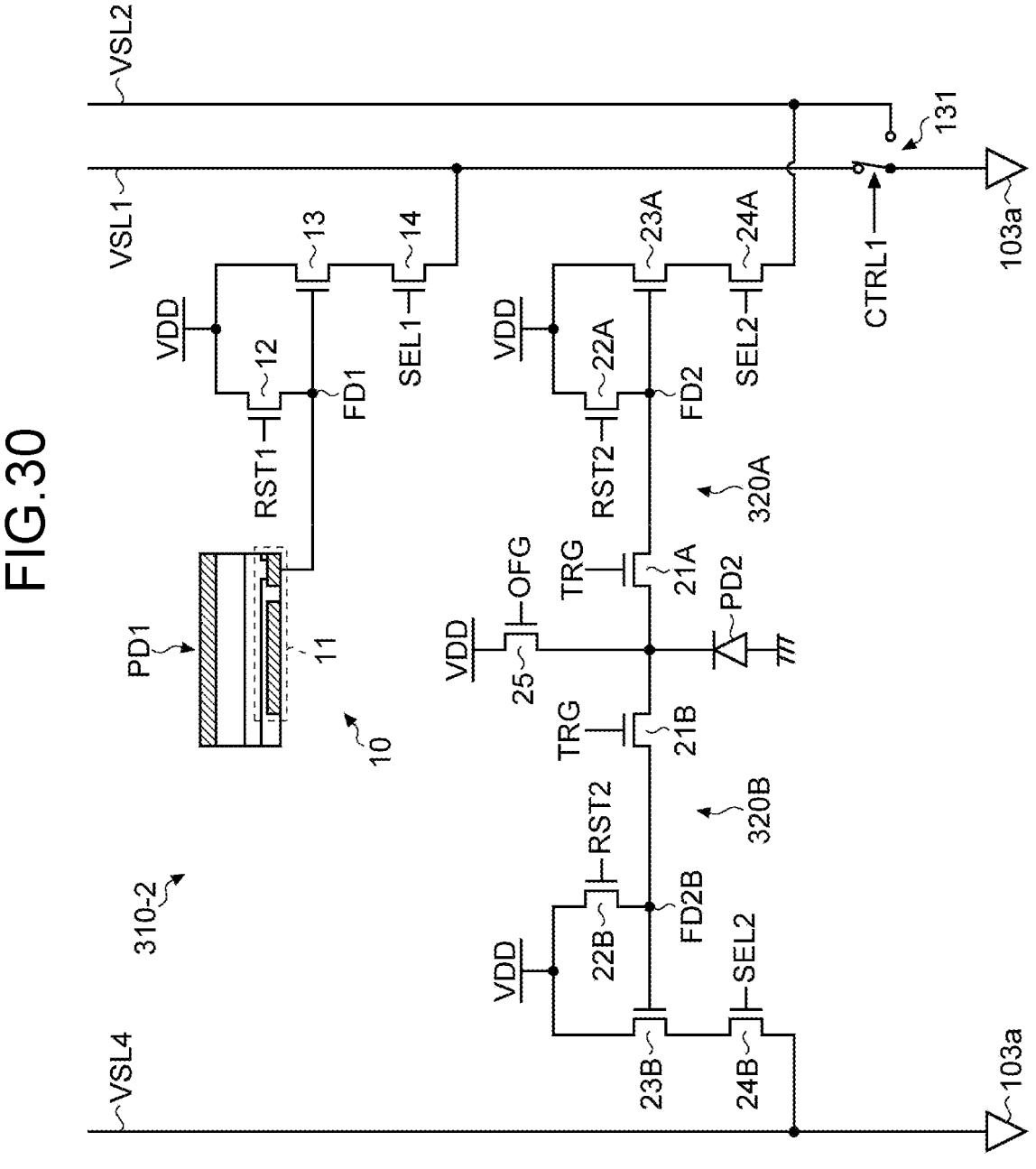
FIG. 30 is a circuit diagram depicting a schematic configuration example of a unit pixel according to a second modification of the third embodiment.

FIG. 30 is a circuit diagram depicting a schematic configuration example of a unit pixel according to a second modification of the third embodiment. As depicted in FIG. 30, the unit pixel 310-2 has a configuration similar to the unit pixel 310-1 depicted in FIG. 29, in which the RGB pixel 10 is connected to the vertical signal line VSL1, the pixel circuit 320A in the ToF pixel 320 is connected to the vertical signal line VSL2, and the pixel circuit 320B is connected to the vertical signal line VSL4. In addition, the vertical signal lines VSL1 and VSL2 are configured to be connected to the common AD conversion circuit 103a. Accordingly, similar to the first modification of the first embodiment, the second modification includes a switch circuit 131 that switches the vertical signal line connected to the AD conversion circuit 103a to either of the vertical signal lines VSL1 or VSL2.

With this configuration, the RGB signal processing circuit 103A and a part of the ToF signal processing circuit 303B can be replaced with a common signal processing circuit, making it possible to reduce the circuit scale, leading to downsizing of the image sensor 100 and achievement of higher resolution due to enhanced area efficiency.

3.6.3 Third Modification

Figure 31:
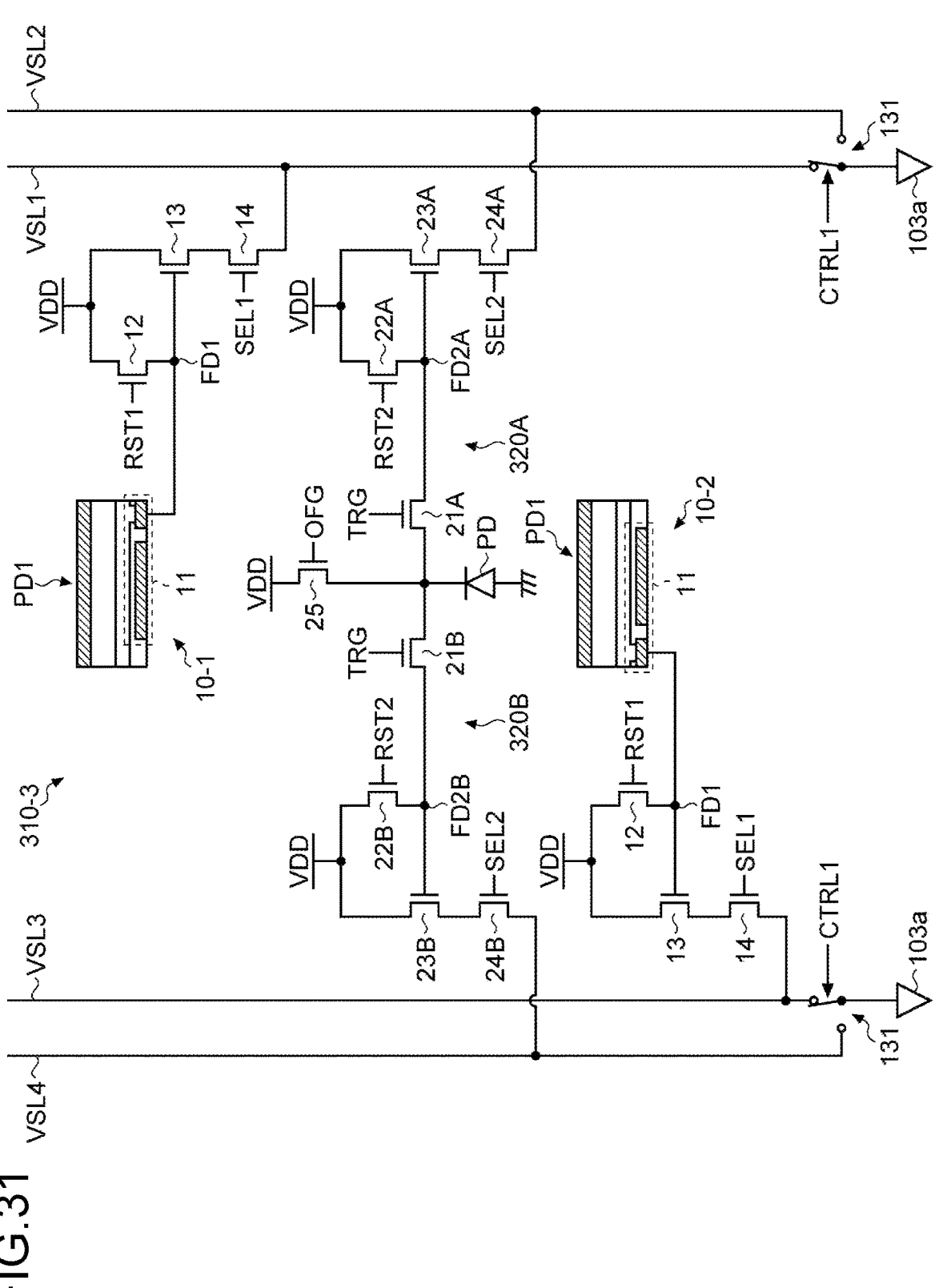
FIG. 31 is a circuit diagram depicting a schematic configuration example of a unit pixel according to a third modification of the third embodiment.

FIG. 31 is a circuit diagram depicting a schematic configuration example of a unit pixel according to a third modification of the third embodiment. As depicted in FIG. 31, the unit pixel 310-3 has a configuration similar to the unit pixel 310 depicted in FIG. 28, in which the vertical signal lines VSL1 and VSL2 are connected to the common AD conversion circuit 103a, while the vertical signal lines VSL3 and VSL4 are connected to the common AD conversion circuit 103a. Accordingly, similarly to the second modification, the third modification includes: a switch circuit 131 that switches the vertical signal line connected to one AD conversion circuit 103a to either of the vertical signal lines VSL1 or VSL2; and a switch circuit 131 that switches the vertical signal line connected to the other AD conversion circuit 103a to either of the vertical signal lines VSL3 or VSL4.

With this configuration, the RGB signal processing circuit 103A and the ToF signal processing circuit 303B can be replaced with a common signal processing circuit, making it possible to further reduce the circuit scale, leading to downsizing of the image sensor 100 and achievement of higher resolution due to further enhanced area efficiency.

3.6.4 Fourth Modification

Figure 32:
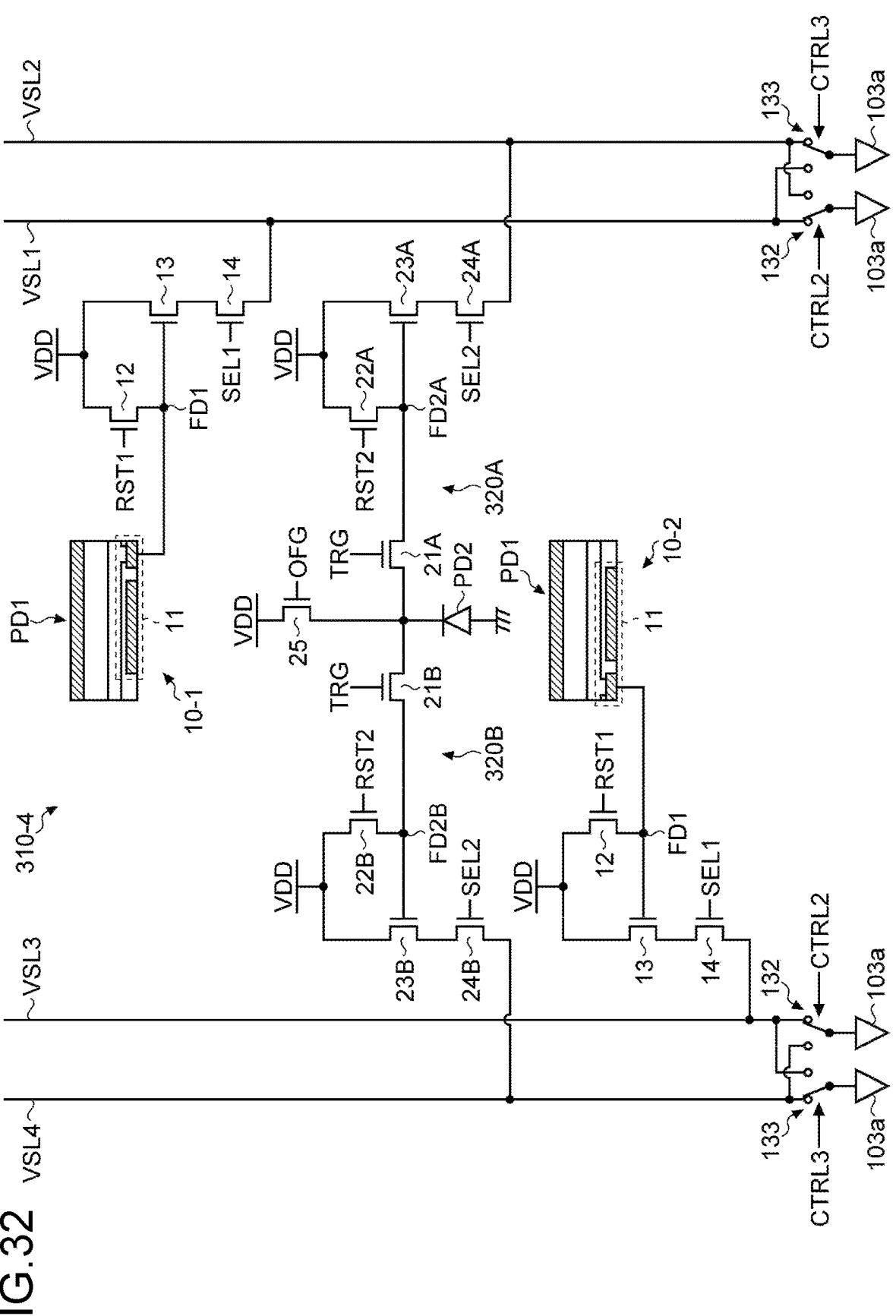
FIG. 32 is a circuit diagram depicting a schematic configuration example of a unit pixel according to a fourth modification of the third embodiment.

FIG. 32 is a circuit diagram depicting a schematic configuration example of a unit pixel according to a fourth modification of the third embodiment. As depicted in FIG. 32, the unit pixel 310-4 has a configuration similar to the unit pixel 310 depicted in FIG. 28, in which each of the vertical signal lines VSL1 and VSL2 can be connected to any one of the two AD conversion circuits 103a, and each of the vertical signal lines VSL3 and VSL4 can be connected to any one of the two AD conversion circuits 103a. Accordingly, similarly to the third modification of the first embodiment, the fourth modification includes: switch circuits 132 and 133 that switch the vertical signal line connected to one set of the two AD conversion circuits 103a to either of the vertical signal lines VSL1 or VSL2; and switch circuits 132 and 133 that switch the vertical signal line connected to the other set of the two AD conversion circuit 103a to either of the vertical signal lines VSL3 or VSL4.

With this configuration, since the AD conversion circuit 103a to be used for each column can be selected from a plurality of AD conversion circuits (two AD conversion circuits in this example), it is possible to suppress image quality degradation due to noise generation such as streaking, for example.

3.7 Cross-Sectional Structure Example of Unit Pixel

Figure 33:
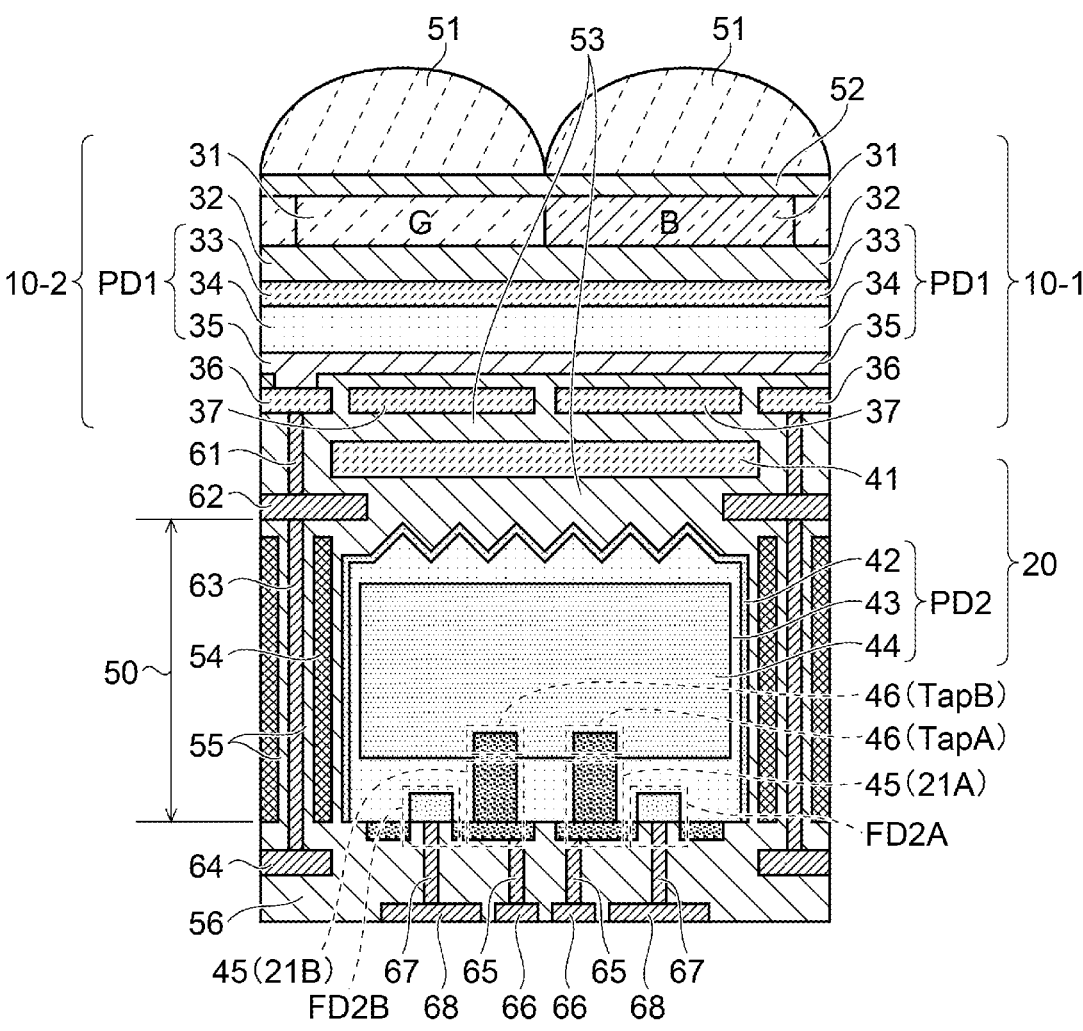
FIG. 33 is a cross-sectional view depicting a cross-sectional structure example of the image sensor according to the third embodiment.

Next, an example of a cross-sectional structure of the image sensor 300 according to the third embodiment will be described with reference to FIG. 33. FIG. 33 is a cross-sectional view depicting a cross-sectional structure example of an image sensor according to the third embodiment. Similarly to the above-described embodiments, the following will describe an example of a cross-sectional structure of a semiconductor chip in which the photoelectric conversion sections PD1 and PD2 in the unit pixel 310 are formed.

In addition, similarly to the above-described embodiments, the following description is an example of a cross-sectional structure of a back illumination type device in which the light incident surface is on the back surface side (opposite side to the element formation surface) of the semiconductor substrate 50. However, the type is not limited thereto, and this may be the cross-sectional structure of a front illumination type device in which the light incident surface is on the front surface side (element formation surface side) of the semiconductor substrate 50. Further, although the present description is an exemplary case where an organic material is used for the photoelectric conversion section PD1 of the RGB pixel 10, it is also allowable to use, similarly to the embodiments described above, one or both of an organic material and a semiconductor material (also referred to as an inorganic material) as the photoelectric conversion material of each of the photoelectric conversion sections PD1 and PD2. In the present description, a case where one unit pixel 310 includes two RGB pixels 10-1 and 10-2 (corresponding to the unit pixel 310 described above with reference to FIG. 28) is exemplified. However, the configuration is not limited thereto, and one unit pixel 310 may include one RGB pixel 10, or three or more RGB pixels 10.

As depicted in FIG. 33, for example, the image sensor 300 according to the present embodiment has a cross-sectional structure similar to the cross-sectional structure of the image sensor 100 described with reference to FIG. 18 in the second embodiment, in which there is provided two taps 46 for reading out charges of different phases on the element formation surface side (lower side in the drawing) of the photoelectric conversion section PD2. One tap 46 may correspond to a tap TapA connected to the transfer transistor 21A (vertical transistor 45) of the pixel circuit 320A, and the other tap 46 may correspond to a tap TapB connected to the transfer transistor 21B (vertical transistor 45) of the pixel circuit 320B. Further, the floating diffusion region connected to the drain of the transfer transistor 21A may function as the floating diffusion region FD2A of the pixel circuit 320A, and the floating diffusion region connected to the drain of the transfer transistor 21B may function as the floating diffusion region FD2B of the pixel circuit 320B.

Since other configurations, materials, and the like may be similar to those in the above-described embodiment, detailed description will be omitted here.

3.8 Planar Structure Example

Figure 34:
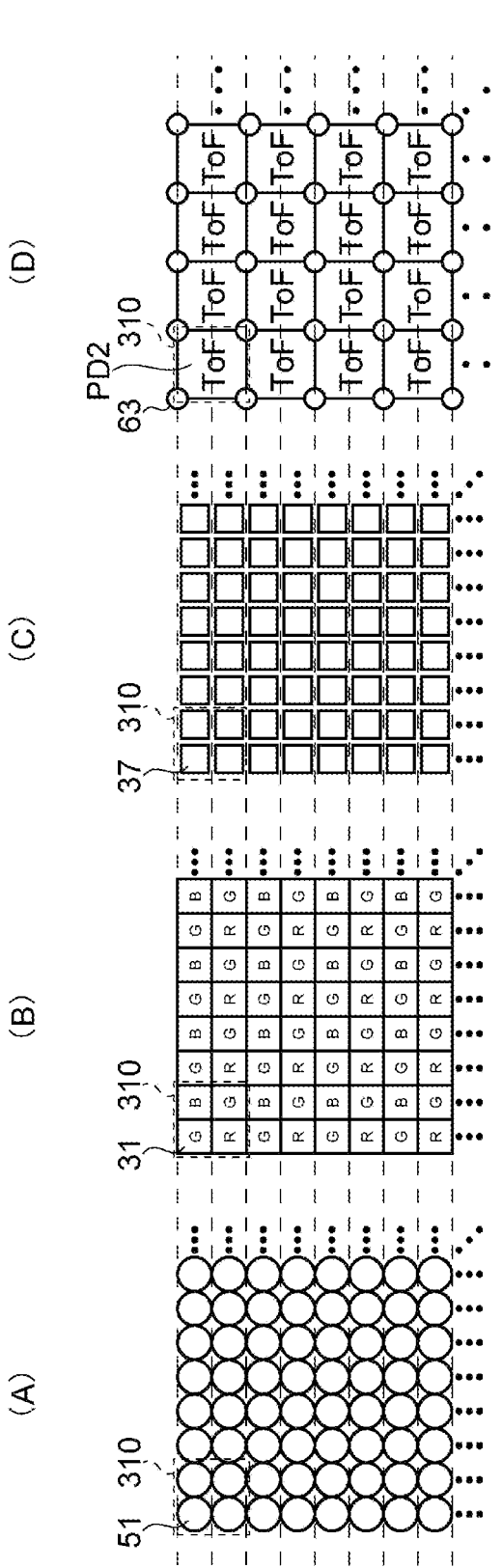
FIG. 34 is a diagram depicting a planar layout example of each layer of a pixel array section according to the third embodiment.

Next, a planar structure example of the pixel array section according to the present embodiment will be described. FIG. 34 is a diagram depicting a planar layout example of each layer of the pixel array section according to the third embodiment, in which (A) depicts a planar layout example of the on-chip lens 51, (B) depicts a planar layout example of the color filter 31, (C) depicts a planar layout example of the storage electrode 37, and (D) depicts a planar layout example of the photoelectric conversion section PD2. In FIG. 34, (A) to (D) depict planar layout examples of surfaces parallel to the element formation surface of the semiconductor substrate 50, similarly to the above-described embodiment. The present description uses an exemplary case where a 2×2 pixel Bayer array including a pixel that selectively detects a red (R) wavelength component (hereinafter, referred to as an R pixel 10r), a pixel that selectively detects a green (G) wavelength component (hereinafter, referred to as a G pixel 10g) and a pixel that selectively detects light of a blue (B) wavelength component (hereinafter, referred to as a B pixel 10b) is used as a unit array, and one unit pixel 310 includes four RGB pixels 10 forming the unit array and one ToF pixel 320.

As depicted in (A) to (D) of FIG. 34, the present embodiment uses a configuration in which four on-chip lenses 51, four color filters 31, four storage electrodes 37, and one photoelectric conversion section PD2 are provided for one unit pixel 310. In the present description, one storage electrode 37 corresponds to one RGB pixel 10, while one photoelectric conversion section PD2 corresponds to one ToF pixel 320.

In this manner, with one unit pixel 310 in which the basic array in a pattern of the Bayer array including the four RGB pixels 10 and one ToF pixel 320 are arranged in the traveling direction of the incident light, it is possible to increase the quantum efficiency of one ToF pixel 320. This makes it possible to improve the accuracy of a result obtained by integrally processing information (RGB image and depth image) acquired by different sensors. This makes it possible to realize a solid-state imaging device and a recognition system capable of achieving more secure authentication.

3.9 Recognition Operation Example

Next, an example of a recognition operation executed by the recognition system according to the present embodiment will be described. Here, a recognition operation example will be described with reference to the recognition system 370 described with reference to FIG. 22 as appropriate while using the electronic device 80 described with reference to FIGS. 23 to 24. Alternatively, as described above, the recognition operation may be implemented so as to be completed in the image sensor 300, may be implemented by processing image data acquired by the image sensor 300 in the application processor 86, or may be implemented by executing a part of processing in the image sensor 300 on image data acquired by the image sensor 300 and executing the rest in the application processor 86.

Figure 35:
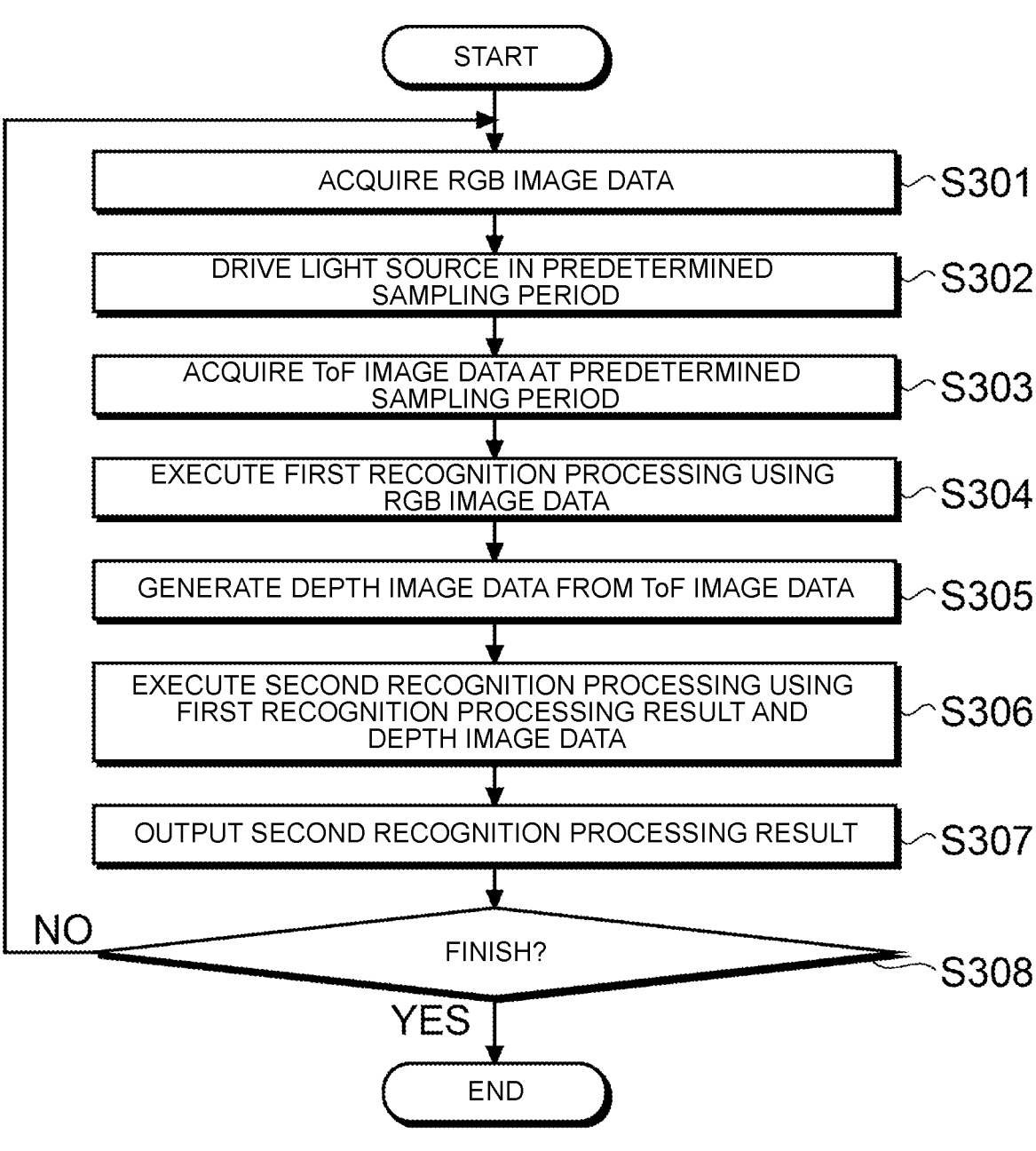
FIG. 35 is a flowchart depicting an example of a recognition operation according to the third embodiment.

FIG. 35 is a flowchart depicting an example of a recognition operation according to the third embodiment. As depicted in FIG. 35, in the present operation, the system control section 85 first drives the RGB sensor section 71 (refer to FIG. 22) in the image sensor 300 to acquire RGB image data (step S301). Further, the system control section 85 drives the laser light source 81 at a predetermined sampling period to cause the laser light source 81 to emit irradiation light at a predetermined sampling period (step S302), and drives the ToF sensor section 373 (refer to FIG. 22) in the image sensor 300 at a predetermined sampling period in synchronization with the driving of the laser light source 81 to acquire ToF image data at a predetermined sampling period (step S303).

The acquisition of the RGB image data may be executed in parallel with the acquisition of the ToF image data, or may be executed in a period different from the acquisition period of the ToF image data. At that time, either the acquisition of the RGB image data or the acquisition of the ToF image data may be executed first. In addition, the acquisition of the RGB image data may be executed once with respect to the acquisition of the ToF image data of K times (K is an integer of 1 or more).

Among the RGB image data and the ToF image data acquired in this manner, the RGB image data is subjected to predetermined processing in the RGB image processing section 72 and then input to the recognition processing section 75. In step S302 or S303, in a case where ROI information has been input from the RGB image processing section 72 to the ToF sensor section 373 or the distance measurement processing section 374 in FIG. 22, RGB image data and/or ToF image data of a region corresponding to the ROI information may be input to the recognition processing section 75.

Next, using the input RGB image data, the recognition processing section 75 executes recognition processing (first recognition processing) of an object existing within the angle of view of the image sensor 300 (step S304). Similarly to the first embodiment, the first recognition processing may be implemented by using recognition processing such as pattern recognition and recognition processing by artificial intelligence.

Further, regarding the ToF image data acquired in step S303, the distance measurement processing section 374 (refer to FIG. 22) generates a depth image indicating a two-dimensional distance distribution to an object existing within the angle of view based on the phase difference of each pixel in the two ToF image data acquired from each of the taps TapA and TapB at a predetermined sampling period (step S305). The generation of the depth image data may be executed in parallel with the first recognition processing, or may be executed before the first recognition processing. Further, the generation of the depth image data may be executed by the ToF data processing section 308B inside the image sensor 300, or may be executed by the application processor 86, for example.

Next, the recognition processing section 75 executes recognition processing (second recognition processing) for more accurately recognizing the object existing within the angle of view using the result of the first recognition processing and the depth image data (step S306). Similarly to the first recognition processing, the second recognition processing may be implemented by using recognition processing such as pattern recognition and recognition processing by artificial intelligence.

Next, the recognition processing section 75 outputs the result of the second recognition processing obtained in step S306 to the outside via the interface section 76, for example (step S307). The recognition processing section 75 may execute a part of the first recognition processing and output the result (intermediate data or the like) to the outside, or may execute a part of the second recognition processing and output the result (intermediate data or the like).

Thereafter, the recognition system 370 determines whether or not to finish the present operation (step S308). When the determination is not to finish (NO in step S308), the recognition system 370 returns to step S301. In contrast, when having determined to finish the present operation (YES in step S308), the recognition system 370 finishes the present operation.

3.10 Action and Effect

As described above, according to the third embodiment, since it is possible to acquire a plurality of pieces of sensor information, namely, the RGB image acquired by the RGB pixels 10 and the depth image based on the ToF image acquired by the ToF pixel 320, leading to improvement of the accuracy of recognition processing using these pieces of sensor information. For example, as described above, by acquiring depth image data in addition to RGB image data, it is possible to more accurately determine unauthorized access such as identity theft using a photograph in face authentication. This makes it possible to realize a solid-state imaging device and a recognition system capable of achieving more secure authentication.

Further, in the present embodiment, similarly to the first embodiment, it is also possible to further improve the accuracy of the recognition processing by executing multi-stage recognition processing using a plurality of pieces of sensor information. This makes it possible to realize a solid-state imaging device and a recognition system capable of achieving still more secure authentication.

Since other configurations, operations, and effects may be similar to those in the above-described embodiment, detailed description thereof will be omitted here.

4. Example of Application to Mobile Body

The technology according to the present disclosure is applicable to various products. For example, the technology according to the present disclosure may be applied to devices mounted on any of mobile body such as automobiles, electric vehicles, hybrid electric vehicles, motorcycles, bicycles, personal mobility, airplanes, drones, ships, and robots.

Figure 36:
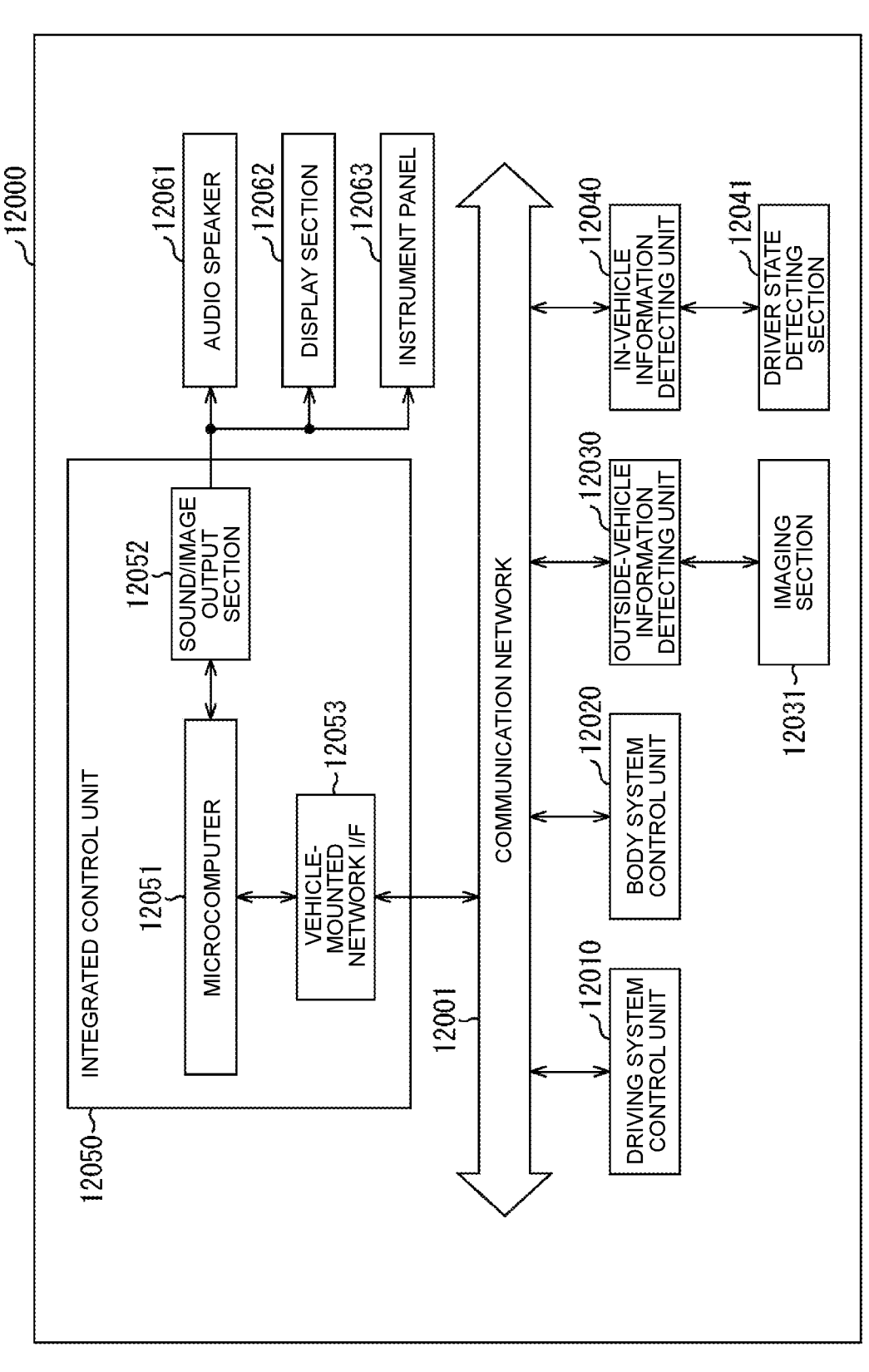
FIG. 36 is a block diagram depicting an example of schematic configuration of a vehicle control system.

FIG. 36 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 36, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

Figure 37:
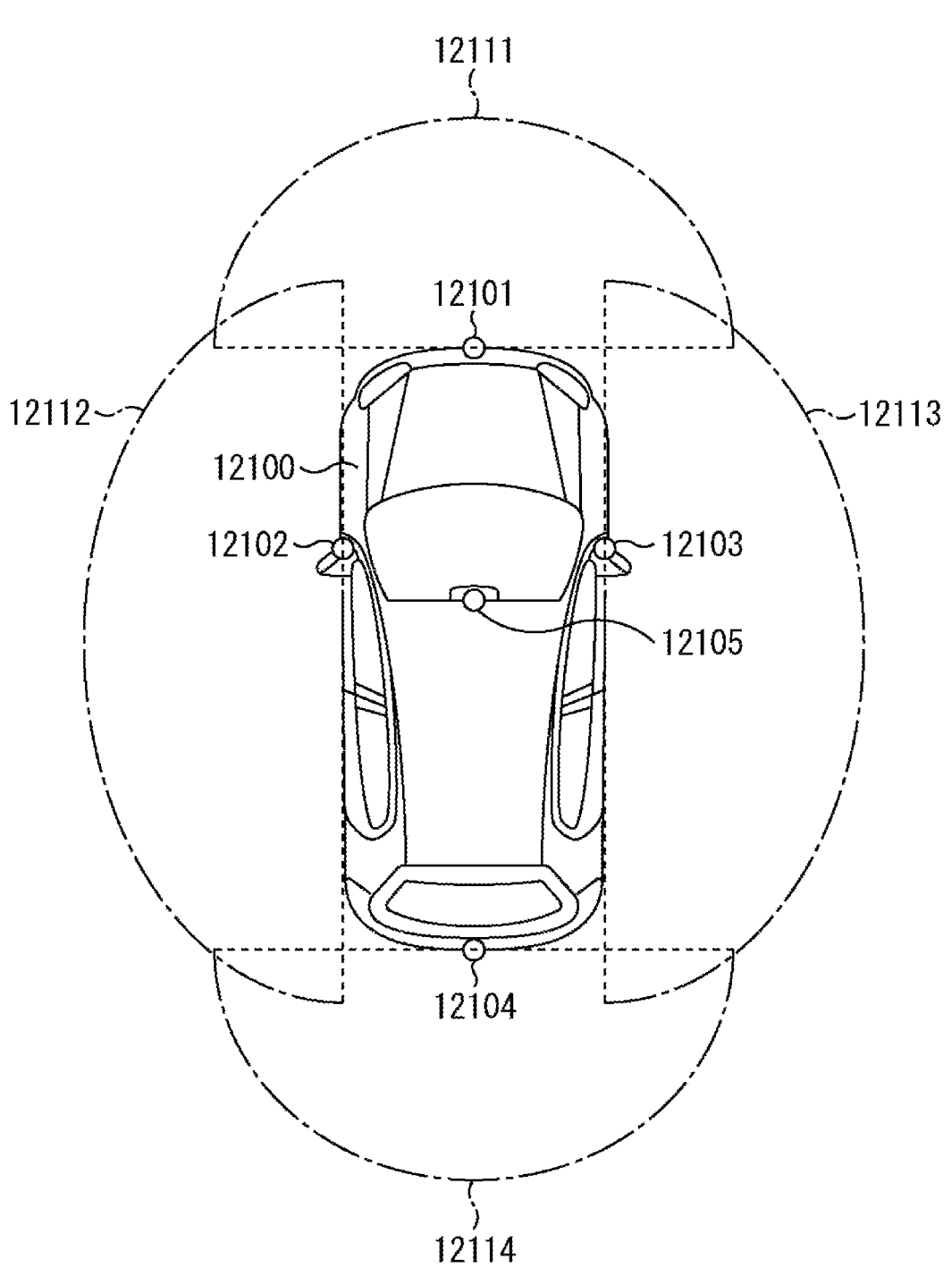
FIG. 37 is a diagram of assistance in explaining an example of installation positions of an outside-vehicle information detecting section and an imaging section.

FIG. 37 is a diagram depicting an example of the installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 37 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of the vehicle control system to which the technology according to the present disclosure is applicable has been described. The technology according to the present disclosure can be suitably applied to the imaging section 12031 among the configurations described above. Specifically, the imaging sections 12101, 12102, 12103, 12104, 12105, and the like depicted in FIG. 37 may be installed in the vehicle 12100. By applying the technology according to the present disclosure to the imaging sections 12101, 12102, 12103, 12104, 12105, and the like, it is possible to improve the accuracy of results obtained by integrally processing information (for example, a color image and a monochrome image) acquired by different sensors.

The embodiments of the present disclosure have been described above. However, the technical scope of the present disclosure is not limited to the above-described embodiments, and various modifications can be made without departing from the scope of the present disclosure. Moreover, it is allowable to combine the components across different embodiments and modifications as appropriate.

The effects described in individual embodiments of the present specification are merely examples, and thus, there may be other effects, not limited to the exemplified effects.

Note that the present technique can also have the following configurations.

(1)

A solid-state imaging device including:

a plurality of unit pixels arranged in a matrix; and a signal processing circuit that reads out a signal from each of the unit pixels, wherein each of the unit pixels includes:

a first pixel that is disposed on a first surface and that detects light of a first wavelength band; and a second pixel that is disposed on a second surface parallel to the first surface and that detects light of a second wavelength band different from the first wavelength band, and the signal processing circuit includes a first conversion circuit that is connected to the first pixel and the second pixel in each of the unit pixels and that converts an analog signal output from each of the first pixel and the second pixel into a digital signal.

(2)

The solid-state imaging device according to (1), wherein at least a part of the first pixel overlaps the second pixel in a direction perpendicular to the first surface and the second surface.

(3)

The solid-state imaging device according to (1) or (2), wherein the first pixel includes an organic photoelectric conversion film.

(4)

The solid-state imaging device according to any one of (1) to (3), wherein the signal processing circuit further includes a first switch that switches a connection destination of the first conversion circuit to either of the first pixel or the second pixel.

(5)

The solid-state imaging device according to (4), wherein the signal processing circuit further includes:

a second conversion circuit that is connected to the first pixel and the second pixel in each of the unit pixels and that converts an analog signal output from each of the first pixel and the second pixel into a digital signal; and a second switch that switches a connection destination of the second conversion circuit to either of the first pixel or the second pixel.

(6)

The solid-state imaging device according to any one of (1) to (5), wherein each of the unit pixels includes a plurality of the first pixels connected to the first conversion circuit.

(7)

The solid-state imaging device according to (6), wherein each of the first pixels includes:

a first photoelectric conversion section that performs photoelectric conversion of incident light; and a first pixel circuit that reads out a charge generated in the first photoelectric conversion section, and the plurality of first pixels share at least a part of the first pixel circuit.

(8)

The solid-state imaging device according to any one of (1) to (7), wherein each of the unit pixels includes a plurality of the second pixels connected to the first conversion circuit.

(9)

The solid-state imaging device according to (8), wherein each of the second pixels includes:

a second photoelectric conversion section that performs photoelectric conversion of incident light; and a second pixel circuit that reads out a charge generated in the second photoelectric conversion section, and the plurality of second pixels share at least a part of the second pixel circuit.

(10)

The solid-state imaging device according to any one of (1) to (9), wherein the signal processing circuit generates first image data based on a signal read out from the first pixel in the plurality of unit pixels, and generates second image data based on a signal read out from the second pixel in the plurality of unit pixels.

(11)

The solid-state imaging device according to any one of (1) to (10), wherein the second pixel includes:

a photoelectric conversion section that performs photoelectric conversion of incident light;

a first pixel circuit that reads out a charge generated in the photoelectric conversion section; and a second pixel circuit that reads out charges generated in the photoelectric conversion section, the signal processing circuit further includes a second conversion circuit that is connected to the first pixel circuit and that converts an analog signal output from the first pixel circuit into a digital signal, and the first conversion circuit is connected to the first pixel and the second pixel circuit.

(12)

The solid-state imaging device according to (11), wherein the signal processing circuit further includes a first switch that switches a connection destination of the first conversion circuit to either of the first pixel or the second pixel circuit.

(13)

The solid-state imaging device according to any one of (1) to (12), wherein each of the unit pixels includes a plurality of the first pixels, the second pixel includes:

a photoelectric conversion section that performs photoelectric conversion of incident light;

a first pixel circuit that reads out a charge generated in the photoelectric conversion section; and a second pixel circuit that reads out a charge generated in the photoelectric conversion section, the signal processing circuit further includes a second conversion circuit that is connected to one of the plurality of first pixels and to the second pixel circuit, and that converts an analog signal output from the one of the plurality of first pixels and from the second pixel circuit into a digital signal, and the first conversion circuit is connected to another one of the plurality of first pixels and to the first pixel circuit.

(14)

The solid-state imaging device according to (13), wherein the signal processing circuit further includes:

a first switch that switches a connection destination of the first conversion circuit to either of the another one of the plurality of first pixels or the first pixel circuit; and a second switch that switches a connection destination of the second conversion circuit to either of the one of the plurality of first pixels or the second pixel circuit.

(15)

The solid-state imaging device according to (14), wherein the signal processing circuit further includes:

a third conversion circuit that is connected to the another one of the plurality of first pixels and to the first pixel circuit and that converts an analog signal output from each of the another one of the plurality of first pixels and the first pixel circuit into a digital signal;

a fourth conversion circuit that is connected to the one of the plurality of first pixels and to the second pixel circuit and that converts an analog signal output from each of the one of the plurality of first pixels and from the second pixel circuit into a digital signal;

a third switch that switches a connection destination of the first conversion circuit to either of the another one of the plurality of first pixels or the first pixel circuit; and a fourth switch that switches a connection destination of the second conversion circuit to either of the one of the plurality of first pixels or the second pixel circuit.

(16)

The solid-state imaging device according to any one of (1) to (15), wherein the light of the first wavelength band is light included in a wavelength band of visible light, and the light of the second wavelength band is light included in a wavelength band of infrared light.

(17)

The solid-state imaging device according to any one of (1) to (16), including:

a first drive circuit that drives the first pixel in each of the unit pixels; and a second drive circuit that drives the second pixel in each of the unit pixels.

(18)

The solid-state imaging device according to any one of (1) to (17), wherein the first pixel includes a first photoelectric conversion section that performs photoelectric conversion of incident light, the second pixel includes a second photoelectric conversion section that performs photoelectric conversion of incident light, and the first photoelectric conversion section and the second photoelectric conversion section are disposed along an optical axis of the incident light.

(19)

A recognition system including:

the solid-state imaging device according to any one of (1) to (18); and a recognition processing section that executes recognition processing based on first detection data acquired in the first pixel and second detection data acquired in the second pixel, in the solid-state imaging device.

(20)

The recognition system according to (19), further including:

a light source that emits light of the second wavelength band; and a control section that controls the light source and the solid-state imaging device, wherein the control section performs control to allow a light emission timing of the light source and a drive timing of the second pixel in the solid-state imaging device to be synchronized with each other.

(21)

The recognition system according to (19) or (20), further including a processing section that generates depth information indicating a distance from a second pixel of the solid-state imaging device to an object, the depth information being acquired by the second pixel, in which the recognition processing section executes the recognition processing based on the first detection data and the depth information.

(22)

The recognition system according to any one of (19) to (21), in which the recognition processing section executes first recognition processing based on one of the first detection data and the second detection data, and executes second recognition processing based on a result of the first recognition processing and based on the other of the first detection data and the second detection data.

REFERENCE SIGNS LIST

1, 80 ELECTRONIC DEVICE
2 IMAGING LENS
3 STORAGE SECTION
4 PROCESSOR
10, 10-1 to 10-N RGB PIXELS
11 TRANSFER GATE
12, 22, 22A, 22B RESET TRANSISTOR
13, 23, 23A, 23B AMPLIFICATION TRANSISTOR
14, 24, 24A, 24B SELECTION TRANSISTOR
20 IR PIXEL
21, 21A, 21B TRANSFER TRANSISTOR
25 DISCHARGE TRANSISTOR
31, 31r, 31g, 31b COLOR FILTER
32 SEALING FILM
33 TRANSPARENT ELECTRODE
34 PHOTOELECTRIC CONVERSION FILM
35 SEMICONDUCTOR LAYER
36 READOUT ELECTRODE
37 STORAGE ELECTRODE
41 IR FILTER
42 p-WELL REGION
43 p-TYPE SEMICONDUCTOR REGION
44 n-TYPE SEMICONDUCTOR REGION
45 VERTICAL TRANSISTOR
46 TAP (TapA, TapB)
50 SEMICONDUCTOR SUBSTRATE
51 ON-CHIP LENS
52 PLANARIZATION FILM
53 INSULATING LAYER
54 PIXEL ISOLATION SECTION
55 FIXED CHARGE FILM
56 INTERLAYER INSULATING FILM
61 to 68 WIRING, WIRING LINE
70, 370 RECOGNITION SYSTEM
71 RGB SENSOR SECTION
72 RGB IMAGE PROCESSING SECTION
73 IR SENSOR SECTION
74 IR IMAGE PROCESSING SECTION
75 RECOGNITION PROCESSING SECTION
76 INTERFACE SECTION
81 LASER LIGHT SOURCE
83 PROJECTION LENS
84 IMAGING LENS
85 SYSTEM CONTROL SECTION
86 APPLICATION PROCESSOR
100, 300 SOLID-STATE IMAGING DEVICE (IMAGE SENSOR)
101 PIXEL ARRAY SECTION
102A RGB PIXEL DRIVE CIRCUIT
102B IR PIXEL DRIVE CIRCUIT
103, 303 COMMON SIGNAL PROCESSING CIRCUIT
103a AD CONVERSION CIRCUIT
103A RGB SIGNAL PROCESSING CIRCUIT
103B IR SIGNAL PROCESSING CIRCUIT
104 COLUMN DRIVE CIRCUIT
105 SYSTEM CONTROL CIRCUIT
108A RGB DATA PROCESSING SECTION
108B IR DATA PROCESSING SECTION
110, 110-1 to 110-3, 210, 310, 310-1 to 310-4 UNIT PIXEL

45

131, 132, 133 SWITCH CIRCUIT
140 PIXEL CHIP
150 CIRCUIT CHIP
303B ToF SIGNAL PROCESSING CIRCUIT
308B ToF DATA PROCESSING SECTION
320 ToF PIXEL
320A, 320B PIXEL CIRCUIT
373 ToF SENSOR SECTION
374 DISTANCE MEASUREMENT PROCESSING SECTION
381 LIGHT SOURCE DRIVE SECTION
382 VCSEL
383 SENSOR CONTROL SECTION
384 LIGHT RECEIVING SECTION
901 SUBJECT
FD1, FD2, FD2A, FD2B FLOATING DIFFUSION REGION
LD PIXEL DRIVE LINE
LD1 RGB DRIVE LINE
LD2 IR DRIVE LINE
PD1, PD2 PHOTOELECTRIC CONVERSION SECTION
VSL1, VSL2, VSL3, VSL4 VERTICAL SIGNAL LINE

What is claimed is:

1. A solid-state imaging device, comprising:
a plurality of unit pixels arranged in a matrix in a pixel array;
a signal processing circuit that reads out a signal from each of the unit pixels of the plurality of unit pixels,
wherein each of the unit pixels includes:
a first pixel that is disposed on a first surface and that detects light of a first wavelength band; and
a second pixel that is disposed on a second surface parallel to the first surface and that detects light of a second wavelength band different from the first wavelength band, and
wherein the signal processing circuit includes a first conversion circuit that is connected to the first pixel and the second pixel in each of the unit pixels and that converts an analog signal output from each of the first pixel and the second pixel into a digital signal;
a first drive circuit that drives the first pixel in each of the unit pixels; and
a second drive circuit that drives the second pixel in each of the unit pixels,
wherein the first drive circuit and the second drive circuit are provided on opposite sides of the pixel array.

2. The solid-state imaging device according to claim 1, wherein at least a part of the first pixel overlaps the second pixel in a direction perpendicular to the first surface and the second surface.

3. The solid-state imaging device according to claim 1, wherein the first pixel includes an organic photoelectric conversion film.

4. The solid-state imaging device according to claim 1, wherein the signal processing circuit further includes a first switch that switches a connection destination of the first conversion circuit to either of the first pixel or the second pixel.

5. The solid-state imaging device according to claim 4, wherein the signal processing circuit further includes:
a second conversion circuit that is connected to the first pixel and the second pixel in each of the unit pixels and that converts an analog signal output from each of the first pixel and the second pixel into a digital signal; and

a second switch that switches a connection destination of the second conversion circuit to either of the first pixel or the second pixel.

6. The solid-state imaging device according to claim 1, wherein each of the unit pixels includes a plurality of the first pixels connected to the first conversion circuit.

7. The solid-state imaging device according to claim 6, wherein each of the first pixels includes:
a first photoelectric conversion section that performs photoelectric conversion of incident light; and
a first pixel circuit that reads out a charge generated in the first photoelectric conversion section,
wherein the plurality of first pixels share at least a part of the first pixel circuit.

8. The solid-state imaging device according to claim 1, wherein each of the unit pixels includes a plurality of the second pixels connected to the first conversion circuit.

9. The solid-state imaging device according to claim 8, wherein each of the second pixels includes:
a second photoelectric conversion section that performs photoelectric conversion of incident light; and
a second pixel circuit that reads out a charge generated in the second photoelectric conversion section,
wherein the plurality of second pixels share at least a part of the second pixel circuit.

10. The solid-state imaging device according to claim 1, wherein the signal processing circuit:
generates first image data based on a signal read out from the first pixel in the plurality of unit pixels, and
generates second image data based on a signal read out from the second pixel in the plurality of unit pixels.

11. The solid-state imaging device according to claim 1, wherein the second pixel includes:
a photoelectric conversion section that performs photoelectric conversion of incident light;
a first pixel circuit that reads out a charge generated in the photoelectric conversion section; and
a second pixel circuit that reads out charges generated in the photoelectric conversion section,
wherein the signal processing circuit further includes a second conversion circuit that is connected to the first pixel circuit and that converts an analog signal output from the first pixel circuit into a digital signal, and
wherein the first conversion circuit is connected to the first pixel and the second pixel circuit.

12. The solid-state imaging device according to claim 11, wherein the signal processing circuit further includes a first switch that switches a connection destination of the first conversion circuit to either of the first pixel circuit or the second pixel circuit.

13. The solid-state imaging device according to claim 1, wherein each of the unit pixels includes a plurality of the first pixels, the second pixel includes:
a photoelectric conversion section that performs photoelectric conversion of incident light;
a first pixel circuit that reads out a charge generated in the photoelectric conversion section; and
a second pixel circuit that reads out a charge generated in the photoelectric conversion section,
wherein the signal processing circuit further includes a second conversion circuit that is connected to one of the plurality of first pixels and to the second pixel circuit, and that converts an analog signal output from the one of the plurality of first pixels and from the second pixel circuit into a digital signal, and wherein the first conversion circuit is connected to another one of the plurality of first pixels and to the first pixel circuit.

14. The solid-state imaging device according to claim 13, wherein the signal processing circuit further includes:

a first switch that switches a connection destination of the first conversion circuit to either of the another one of the plurality of first pixels or the first pixel circuit; and a second switch that switches a connection destination of the second conversion circuit to either of the one of the plurality of first pixels or the second pixel circuit.

15. The solid-state imaging device according to claim 14, wherein the signal processing circuit further includes:

a third conversion circuit that is connected to the another one of the plurality of first pixels and to the first pixel circuit and that converts an analog signal output from each of the another one of the plurality of first pixels and the first pixel circuit into a digital signal;

a fourth conversion circuit that is connected to the one of the plurality of first pixels and to the second pixel circuit and that converts an analog signal output from each of the one of the plurality of first pixels and from the second pixel circuit into a digital signal;

a third switch that switches a connection destination of the first conversion circuit to either of the another one of the plurality of first pixels or the first pixel circuit; and a fourth switch that switches a connection destination of the second conversion circuit to either of the one of the plurality of first pixels or the second pixel circuit.

16. The solid-state imaging device according to claim 1, wherein the light of the first wavelength band is light included in a wavelength band of visible light, and wherein the light of the second wavelength band is light included in a wavelength band of infrared light.

17. The solid-state imaging device according to claim 1, wherein the first pixel includes a first photoelectric conversion section that performs photoelectric conversion of incident light, wherein the second pixel includes a second photoelectric conversion section that performs photoelectric conversion of incident light, and wherein the first photoelectric conversion section and the second photoelectric conversion section are disposed along an optical axis of the incident light.

18. A recognition system, comprising:

a solid-state imaging device, comprising:

a plurality of unit pixels arranged in a matrix in a pixel array;

a signal processing circuit that reads out a signal from each of the unit pixels of the plurality of unit pixels, wherein each of the unit pixels includes:

a first pixel that is disposed on a first surface and that detects light of a first wavelength band; and a second pixel that is disposed on a second surface parallel to the first surface and that detects light of a second wavelength band different from the first wavelength band, and wherein the signal processing circuit includes a first conversion circuit that is connected to the first pixel and the second pixel in each of the unit pixels and that converts an analog signal output from each of the first pixel and the second pixel into a digital signal;

a first drive circuit that drives the first pixel in each of the unit pixels; and a second drive circuit that drives the second pixel in each of the unit pixels, wherein the first drive circuit and the second drive circuit are provided on opposite sides of the pixel array; and a recognition processing section that executes recognition processing based on first detection data acquired in the first pixel and second detection data acquired in the second pixel, in the solid-state imaging device.

19. The recognition system according to claim 18, further comprising:

a light source that emits light of the second wavelength band; and a control section that controls the light source and the solid-state imaging device, wherein the control section performs control to allow a light emission timing of the light source and a drive timing of the second pixel in the solid-state imaging device to be synchronized with each other.

20. The recognition system according to claim 18, wherein the signal processing circuit further includes:

a second conversion circuit that is connected to the first pixel and the second pixel in each of the unit pixels and that converts an analog signal output from each of the first pixel and the second pixel into a digital signal; and a second switch that switches a connection destination of the second conversion circuit to either of the first pixel or the second pixel.

* * * * *